United States Patent
Sakakima et al.

[11] Patent Number: 5,841,611
[45] Date of Patent: Nov. 24, 1998

[54] MAGNETORESISTANCE EFFECT DEVICE AND MAGNETORESISTANCE EFFECT TYPE HEAD, MEMORY DEVICE, AND AMPLIFYING DEVICE USING THE SAME

[75] Inventors: Hiroshi Sakakima, Tsuzuki-gun; Yousuke N Irie, Kadoma; Mitsuo Satomi, Katano; Yasuhiro Kawawake, Uji, all of Japan

[73] Assignee: Matsushita Electric Industrial Co., Ltd., Kadoma, Japan

[21] Appl. No.: 429,714

[22] Filed: Apr. 27, 1995

[30] Foreign Application Priority Data

| May 2, 1994 | [JP] | Japan | 6-093257 |
| Jun. 7, 1994 | [JP] | Japan | 6-125072 |
| Jun. 30, 1994 | [JP] | Japan | 6-149229 |
| Jul. 28, 1994 | [JP] | Japan | 6-176822 |
| Jul. 29, 1994 | [JP] | Japan | 6-178078 |
| Aug. 9, 1994 | [JP] | Japan | 6-187484 |
| Aug. 12, 1994 | [JP] | Japan | 6-190457 |
| Dec. 7, 1994 | [JP] | Japan | 6-303615 |
| Dec. 16, 1994 | [JP] | Japan | 6-313147 |
| Mar. 10, 1995 | [JP] | Japan | 7-051630 |
| Mar. 13, 1995 | [JP] | Japan | 7-053067 |

[51] Int. Cl.$^6$ .................................................. G11B 5/127
[52] U.S. Cl. .......................................... 360/113; 338/32 R
[58] Field of Search ............................. 360/113; 148/120; 338/32 R

[56] References Cited

U.S. PATENT DOCUMENTS

| 3,382,448 | 5/1968 | Oberg et al. | 330/62 |
| 4,713,708 | 12/1987 | Krounbi et al. | 360/113 |
| 4,754,431 | 6/1988 | Jenson | 365/158 |
| 4,771,349 | 9/1988 | Tsang | 360/113 |
| 5,018,037 | 5/1991 | Krounbi et al. | 360/113 |
| 5,173,873 | 12/1992 | Wu et al. | 365/173 |
| 5,285,339 | 2/1994 | Chen et al. | 360/113 |
| 5,301,079 | 4/1994 | Cain et al. | 360/113 |
| 5,325,253 | 6/1994 | Chen et al. | 360/113 |
| 5,343,422 | 8/1994 | Kung et al. | 365/173 |
| 5,442,507 | 8/1995 | Koga et al. | 360/113 |

FOREIGN PATENT DOCUMENTS

| 0498344 | 8/1992 | European Pat. Off. . |
| 0548841 | 6/1993 | European Pat. Off. . |
| 0578196 | 1/1994 | European Pat. Off. . |
| 0594243 | 4/1994 | European Pat. Off. . |
| 0613148 | 8/1994 | European Pat. Off. . |
| 2677811 | 12/1992 | France . |
| 3125311 | 5/1991 | Japan . |
| 4247607 | 9/1992 | Japan . |

OTHER PUBLICATIONS

Search Report for European Appl. 951010589.5, mailed Aug. 22, 1995.

Pratt et al., "Ginx Magnetoresistance with Current Perpendicular to the Multilayer Planes," 8405 Journal of Magnitism & Magnetic Materials, 126 (1993) Sep., No. 1–3, Amstuden NL.

McGuire et al, "Magnoresistance Magnetic Properties of Co/Cu/Co Sandwich Film with Thin Co layer Insert," 931 Journal of Applied Physics 73(1993) 15 May, No. 10, Part II A, New York; p. 5541.

Shinjo et al, *Journal of the Physical Society of Japan*, vol. 59, No. 9, pp. 3061–3064, 1990; "Large Magnetoresistance of Field–Induced Giant Ferrimagnetic Multilayers".

(List continued on next page.)

*Primary Examiner*—John H. Wolff
*Attorney, Agent, or Firm*—Renner, Otto, Boisselle & Sklar

[57] ABSTRACT

A magnetoresistance effect device of the invention includes: a substrate; and a multilayer structure formed on the substrate. The multilayer structure includes a hard magnetic film, a soft magnetic film, and a non-magnetic metal film for separating the hard magnetic film from the soft magnetic film. The magnetization curve of the hard magnetic film has a good square feature, and the direction of a magnetization easy axis of the hard magnetic film substantially agrees to the direction of a magnetic field to be detected.

60 Claims, 29 Drawing Sheets

OTHER PUBLICATIONS

Pohm et al, *IEEE Transactions on Magnetics,* vol. 27, No. 6, pp. 5520–5522, 1991, "Write Stability of 2.0×2.0 mu m$^2$ M–R Memory Cells".

Dieny et al, *Journal of Magnetism and Magnetic Materials 93,* pp. 101–104, 1991, "Spin–Value Effect in Soft Ferromagnetic Sandwiches".

Satomi et al; *Technical Report by the Institute of Electronics, Information and Communication Enginers of Japan,* MR91–9, pp. 7–12, 1991, "Magnetoresistance of Ni–Fe–Co/Cu/Co Artificial Surperlattices".

Baibich et al; *Physical Review Letters,* vol. 61, No. 21, pp. 2472–2475, 1988, "Giant Magnetoresistance of (001)Fe/(001)Cr Magnetic Superlattices".

Parkin et al; *Physical Review Letters,* vol. 64, No. 19, pp. 2304–2307, 1990, "Oscillations in Exchange Coupling and Magnetoresistance in Metallic Superlattice Structures: Co/Ru, Co/Cr, and Fe/Cr".

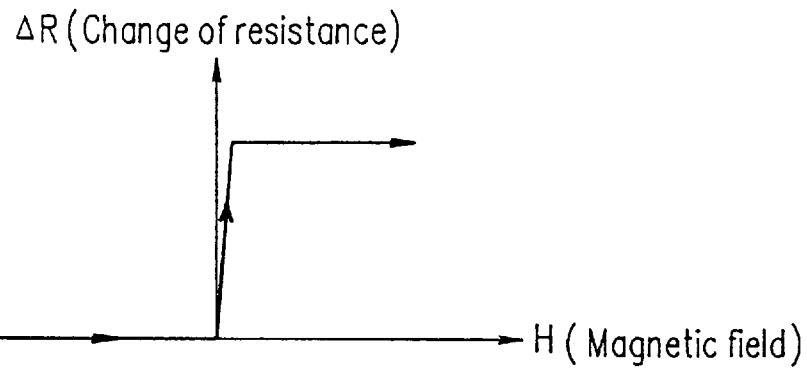
FIG. 9A   S = 1
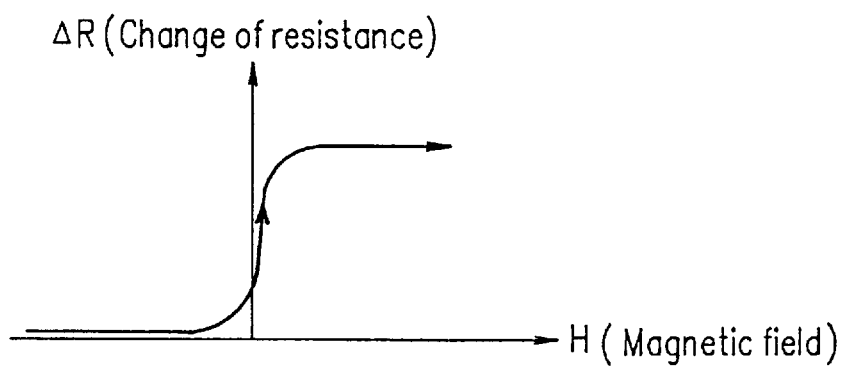
FIG. 9B   S = 0.7
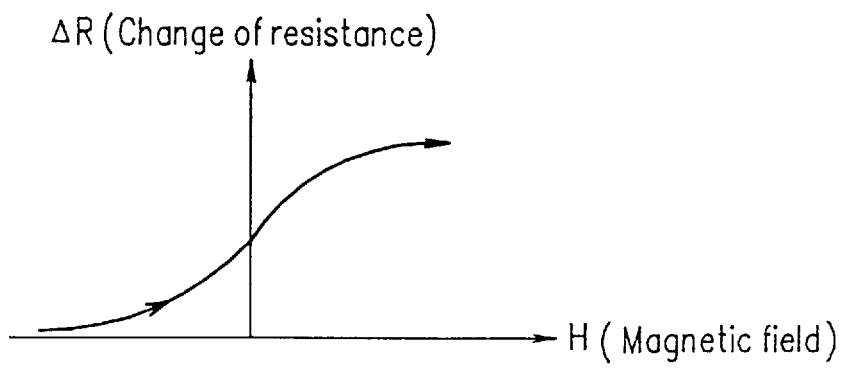
FIG. 9C   S = 0.5

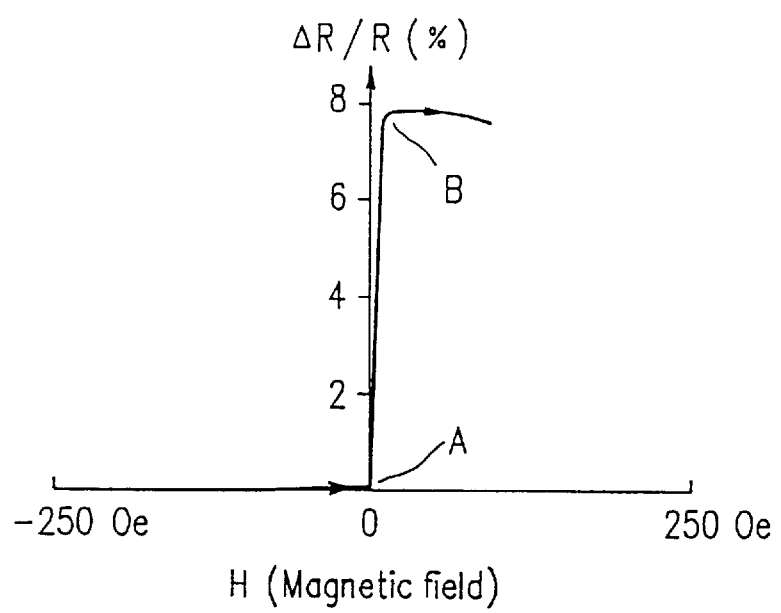

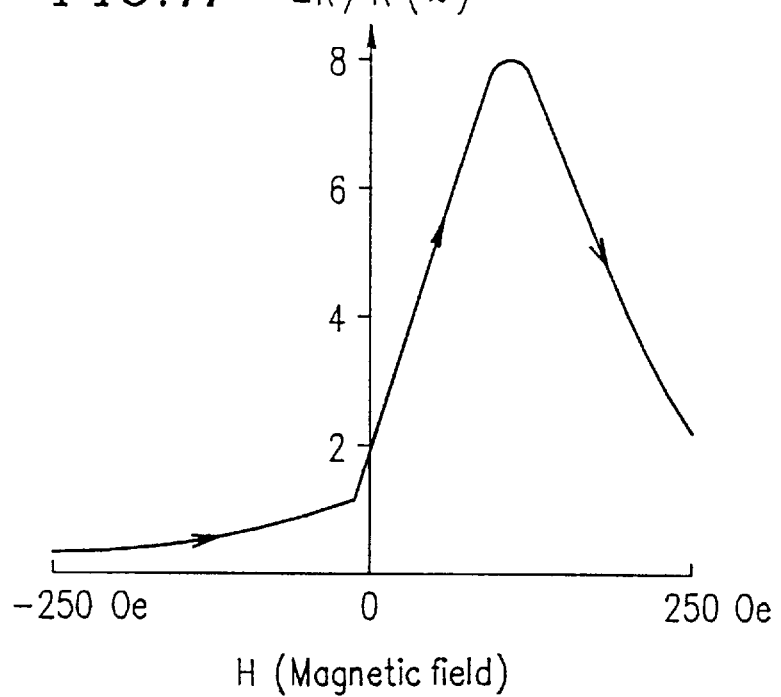

MAGNETORESISTANCE EFFECT DEVICE AND MAGNETORESISTANCE EFFECT TYPE HEAD, MEMORY DEVICE, AND AMPLIFYING DEVICE USING THE SAME

BACKGROUND OF THE INVENTION

1. Field of the Invention

The present invention relates to a magnetoresistance effect device, and also relates to a magnetic head, a memory device, and an amplifying device using such a magnetoresistance effect device.

2. Description of the Related Art

A magnetoresistive sensor (hereinafter referred to as an MR sensor) and a magnetoresistive head (hereinafter referred to as an MR head) using a magnetoresistance effect device have been under development. The term "a magnetoresistance effect element" indicates a device which varies an electric resistance depending on the magnetic field externally applied. The characteristic of the magnetoresistance effect device is generally represented by a ratio of change of magnetoresistance (hereinafter abbreviated as an MR ratio). The MR ratio is defined by the following equation:

$$\text{MR ratio (\%)} = (R(\text{maximum}) - R(\text{minimum}))/R(\text{minimum}) \times 100,$$

where R(maximum) and R(minimum) denote the maximum value and the minimum value of the resistance of the magnetoresistance effect device when a magnetic field is applied to the magnetoresistance effect device. Conventionally, as a material for a magnetoresistance effect device, a permalloy of $Ni_{01}Fe_{01}$ is mainly used as the magnetic body. In the case of such magnetoresistance effect materials, the MR ratio is about 2.5%. In order to develop an MR sensor and an MR head with higher sensitivity, a magnetoresistive device exhibiting a higher MR ratio is required. It was recently found that [Fe/Cr] and [Co/Ru] artificial multilayers in which anti-ferromagnetic coupling is attained via a metal nonmagnetic thin film such as Cr and Ru exhibit a giant magnetoresistance (GMR) effect in a ferromagnetic field (1 to 10 kOe) (see Physical Review Letter Vol. 61, p. 2472, 1988; and Physical Review Letter Vol. 64, p. 2304, 1990). However, these artificial multilayers require a magnetic field of several kilooersteds to several tens of kOe in order to attain a large MR change, so that such artificial multilayers cannot be practically used for a magnetic head and the like.

It was also found that an [Ni—Fe/Cu/Co] artificial multilayer using magnetic thin films of Ni—Fe and Co having different coercive forces in which they are separated by a metal non-magnetic thin film of Cu and are not magnetically coupled exhibits a GMR effect, and an artificial multilayer which has an MR ratio of 8% when a magnetic field of 0.5 kOe is applied at room temperature has been hitherto obtained (see Journal of Physical Society of Japan, Vol. 59, p. 3061, 1990). However, as is seen from the typical MR curve of this type of artificial multilayer shown in FIG. 11, a magnetic field of about 100 Oe is required for attaining a large MR change. Moreover, the MR asymmetrically varies from the negative magnetic field to the positive magnetic field, i.e., the MR exhibits poor linearity. That is, such an artificial multilayer has characteristics which are difficult to use in practice.

Also, it was found that [Ni—Fe—Co/Cu/Co] and [Ni—Fe—Co/Cu] artificial multilayers using magnetic thin films of Ni—Fe—Co and Co in which RKKY-type anti-ferromagnetic coupling is attained via Cu exhibit a GMR effect, and an artificial multilayer which has an MR ratio of about 15% when a magnetic field of 0.5 kOe is applied at room temperature has been hitherto obtained (see Technical Report by THE INSTITUTE OF ELECTRONICS, INFORMATION AND COMMUNICATION ENGINEERS of Japan, MR91-9). As is seen from the typical MR curve of this type of artificial multilayer shown in FIG. 12, the MR substantially linearly varies from zero to the positive magnetic field, so that the film has characteristics which are sufficient for the application to an MR sensor. However, in order to get a large MR change, a magnetic field of about 50 Oe is required. Such a characteristic of the film is not appropriate for the application to an MR magnetic head which is required to be operated at most at 20 Oe and preferably less.

As a film which can be operated in a very weak magnetic field to be applied, a spin-valve type film in which Fe—Mn as an anti-ferromagnetic material is attached to Ni—Fe/Cu/Ni—Fe has been proposed (see Journal of Magnetism and Magnetic Materials 93, p. 101, 1991). As is seen from the typical MR curve of this type shown in FIG. 13, the operating magnetic field is actually weak, and a good linearity is observed. However, the MR ratio is as small as about 2%, and the Fe—Mn film has a poor corrosion resistance. The Fe—Mn film has a low Néel temperature, so that the device characteristics disadvantageously have great temperature dependence.

On the other hand, as a memory device using a magnetoresistance effect, a memory device using a conductor portion (sense lines) made of Ni—Fe(—Co)/TaN/Ni—Fe (Co) in which Ni—Fe or Ni—Fe—Co as a conventional MR (magnetoresistance effect) material is laminated via TaN has been proposed (see U.S. Pat. No. 4,754,431, and IEEE Trans. Magn. Vol. 27, No. 6, 1991, pp. 5520–5522). Such a memory device utilizes the conventional material as an MR material, so that the MR ratio is 2% to 3%. Thus, the memory device has disadvantages in that the output during the information read-out is weak, and it is inherently difficult to perform nondestructive read-out.

SUMMARY OF THE INVENTION

The magnetoresistance effect device of this invention, includes a substrate; and a multilayer structure formed on the substrate, the multilayer structure including a hard magnetic film, a soft magnetic film, and a non-magnetic metal film for separating the hard magnetic film from the soft magnetic film, wherein a magnetization curve of the hard magnetic film has a good square feature, and a direction of a magnetization easy axis of the hard magnetic film substantially agrees to a direction of a magnetic field to be detected.

In one embodiment of the invention, the multilayer structure has a structure in which the hard magnetic film, the soft magnetic film, and the non-magnetic metal film are stacked a plurality of times.

In another embodiment of the invention, a further magnetic film is inserted on both faces or on one face of the hard magnetic film, a thickness of the magnetic film is in the range of 0.1 to 2 nm, and the magnetic film includes at least one element selected from Co, Ni, and Fe as a main component.

In still another embodiment of the invention, the multilayer structure has a structure in which the hard magnetic film, the soft magnetic film, the non-magnetic metal film, and the inserted magnetic film are stacked a plurality of times.

In still another embodiment of the invention, a further magnetic film is inserted at, at least one of interfaces between the hard magnetic film and the non-magnetic metal film and between the soft magnetic film and the non-magnetic metal film, a thickness of the magnetic film is in the range of 0.1 to 1 nm, and the magnetic film includes Co as a main component.

In still another embodiment of the invention, the multilayer structure has a structure in which the hard magnetic film, the soft magnetic film, the non-magnetic metal film, and the inserted magnetic film are stacked a plurality of times.

In still another embodiment of the invention, the soft magnetic film includes $Ni_X Co_Y Fe_Z$ as a main component, and in an atomic composition ratio, X is in the range of 0.6 to 0.9, Y is in the range of 0 to 0.4, and Z is in the range of 0 to 0.3.

In still another embodiment of the invention, the soft magnetic film includes $Ni_{X'} Co_{Y'} Fe_{Z'}$ as a main component, and in an atomic composition ratio, X' is in the range of 0 to 0.4, Y' is in the range of 0.2 to 0.95, and Z' is in the range of 0 to 0.5.

In still another embodiment of the invention, the soft magnetic film is an amorphous magnetic film.

In still another embodiment of the invention, the non-magnetic metal film is made of a material selected from Cu, Ag, and Au.

In still another embodiment of the invention, the non-magnetic metal film is made of Cu.

In still another embodiment of the invention, the non-magnetic metal film has a thickness in the range of 1 nm to 10 nm.

In still another embodiment of the invention, the hard magnetic film includes Co and M as main components, M representing Pt or two or more kinds of elements selected from a group consisting of Pt, Cr, and Ta.

In still another embodiment of the invention, the hard magnetic film is made of a material of CoPt.

In still another embodiment of the invention, the soft magnetic film includes $Ni_X Fe_{1-X}$ or $(Ni_X Co_{1-X})_{X'} Fe_{1-X'}$ as a main component, the hard magnetic film includes $Co_Y Fe_{1-Y}$ as a main component, and in an atomic composition ratio, X is in the range of 0.6 to 1.0, X' is in the range of 0.7 to 1.0, and Y is in the range of 0.3 to 0.7.

In still another embodiment of the invention, the non-magnetic metal film is made of a material selected from Cu, Ag, and Au.

In still another embodiment of the invention, the soft magnetic film includes $Ni_X Fe_{1-X}$ or $(Ni_X Co_{1-X})_{X'} Fe_{1-X'}$ as a main component, the hard magnetic film includes $(Co_Z Fe_{1-Z})_{Z'} V_{1-Z'}$ as a main component, and in an atomic composition ratio, X is in the range of 0.6 to 1.0, X' is in the range of 0.7 to 1.0, Z is in the range of 0.3 to 0.7, and Z' is in the range of 0.9 to 0.98.

In still another embodiment of the invention, the non-magnetic metal film is made of a material selected from Cu, Ag, and Au.

In still another embodiment of the invention, in the multilayer structure formed on the substrate, the hard magnetic film is mainly made of Co, CoPt, or CoFe, the soft magnetic film mainly made of NiFe or NiFeCo, and the non-magnetic metal film is mainly made of Cu and has a thickness of 2 to 10 nm, the multilayer structure is formed epitaxially on the substrate such that a [100] direction of each film composing the multilayer structure is in a direction vertical to a film plane of the each film, and a magnetic field direction to be detected is substantially a [011] direction of, the non-magnetic metal film.

In still another embodiment of the invention, the substrate is an Si (100) single crystalline substrate, the multilayer structure is formed on the substrate via a underlayer mainly made of Cu.

In still another embodiment of the invention, in the multilayer structure formed on the substrate, the hard magnetic film is mainly made of Co, CoPt, or CoFe, the soft magnetic film mainly is made of NiFe or NiFeCo, and the non-magnetic metal film includes a first non-magnetic metal film mainly made of Cu having a thickness of 2 to 10 nm and a second non-magnetic metal film mainly made of Ag or Au having a thickness of 0.1 to 0.4 nm inserted in the first non-magnetic metal film.

In still another embodiment of the invention, the multilayer structure is formed epitaxially on the substrate such that a [100] direction of each film composing the multilayer structure is in a direction vertical to a film plane of the each film, and a magnetic field direction to be detected is substantially a [011] direction of the non-magnetic metal film.

In still another embodiment of the invention, the substrate is an Si (100) single crystalline substrate, the multilayer structure is formed on the substrate via a underlayer mainly made of Cu.

In still another embodiment of the invention, the soft magnetic film is mainly made of NiFe or NiFeCo, at least two consecutive soft magnetic films each having a thickness in the range of 1 to 10 nm are stacked with a—non-magnetic metal film interposed therebetween, wherein the hard magnetic film is mainly made of Co, CoPt, or CoFe, the hard magnetic film and the consecutive soft magnetic films are stacked with the non-magnetic metal film interposed therebetween.

In still another embodiment of the invention, the non-magnetic metal film is mainly made of Cu.

In still another embodiment of the invention, the non-magnetic metal film between the consecutive soft magnetic films is composed of a single film mainly made of Cu, the non-magnetic metal film between the consecutive soft magnetic films and the hard magnetic film is composed of a film mainly made of Cu with an Ag or Au film inserted therein.

In still another embodiment of the invention, the multilayer structure is formed epitaxially on the substrate such that a [100] direction of each film composing the multilayer structure is in a direction vertical to a film plane of the each film, and a magnetic field direction to be detected is substantially a [011] direction of the non-magnetic metal film.

In still another embodiment of the invention, the soft magnetic film is mainly made of NiFe or NiFeCo, at least two soft magnetic films each having a thickness in the range of 1 to 10 nm are consecutively stacked with the non-magnetic metal film interposed therebetween, wherein the hard magnetic film is mainly made of Co, CoPt, or CoFe, at least two hard magnetic films each having a thickness in the range of 1 to 10 nm are consecutively stacked with the non-magnetic metal film interposed therebetween, wherein the consecutive soft magnetic films and the consecutive hard magnetic films are alternatively stacked with the non-magnetic metal film interposed therebetween, and a thickness of the non-magnetic metal film between the soft magnetic film and the hard magnetic film is larger than a thickness of the non-magnetic metal film between the consecutive soft magnetic films or the consecutive hard magnetic films.

In still another embodiment of the invention, the non-magnetic metal film between the consecutive soft magnetic films and the non-magnetic metal film between the consecutive hard magnetic films is a single film mainly made of. Cu, the non-magnetic metal film between the consecutive soft magnetic film and the hard magnetic film is composed of a film mainly made of Cu with an Ag or Au film inserted therein.

In still another embodiment of the invention, the multilayer structure is formed epitaxially on the substrate such that a [100] direction of each film composing the multilayer structure is in a direction vertical to a film plane of the each film, and a magnetic field direction to be detected is substantially a [011] direction of the non-magnetic metal film.

In still another embodiment of the invention, a square ratio of the hard magnetic film is 0.7 or more. Square ratio S is remnant magnetization divided by saturation magnetization.

In still another embodiment of the invention, a direction of a current flowing through the multilayer structure is substantially perpendicular to a film surface of the multilayer structure.

According to another aspect of the invention, a magnetoresistance effect type head includes: a substrate; a multilayer structure formed on the substrate, the multilayer structure including a hard magnetic film, a soft magnetic film, and a non-magnetic metal film for separating the hard magnetic film from the soft magnetic film; and a yoke for guiding a signal magnetic field from a magnetic medium to the soft magnetic film, wherein a magnetization curve of the hard magnetic film has a good square feature, and a direction of a magnetization easy axis of the hard magnetic film substantially agrees to a direction of the signal magnetic field guided by the yoke.

In one embodiment of the invention, the multilayer structure has a structure in which the hard magnetic film, the soft magnetic film, and the non-magnetic metal film are stacked a plurality of times.

In another embodiment of the invention, a further magnetic film is inserted at, at least one of interfaces between the hard magnetic film and the non-magnetic metal film and between the soft magnetic film and the non-magnetic metal film, a thickness of the magnetic film is in the range of 0.1 to 1 nm, and the magnetic film includes at least one element selected from Co, Ni, and Fe as a main component.

In still another embodiment of the invention, the multilayer structure has a structure in which the hard magnetic film, the soft magnetic film, the non-magnetic metal film, and the inserted magnetic film are stacked a plurality of times.

In still another embodiment of the invention, a further magnetic film is inserted on both faces or on one face of the hard magnetic film, a thickness of the magnetic film is in the range of 0.1 to 1 nm, and the magnetic film includes Co as a main component.

In still another embodiment of the invention, the multilayer structure has a structure in which the hard magnetic film, the soft magnetic film, the non-magnetic metal film, and the inserted magnetic film are stacked a plurality of times.

In still another embodiment of the invention, the soft magnetic film includes $Ni_XCo_YFe_Z$ as a main component, and in an atomic composition ratio, X is in the range of 0.6 to 0.9, Y is in the range of 0 to 0.4, and Z is in the range of 0 to 0.3.

In still another embodiment of the invention, the soft magnetic film includes $Ni_{X'}Co_{Y'}Fe_{Z'}$ as a main component, and in an atomic composition ratio, X' is in the range of 0 to 0.4, Y' is in the range of 0.2 to 0.95, and Z' is in the range of 0 to 0.5.

In still another embodiment of the invention, the soft magnetic film-is an amorphous magnetic film.

In still another embodiment of the invention, the non-magnetic metal film is made of a material selected from Cu, Ag, and Au.

In still another embodiment of the invention, the non-magnetic metal film is made of Cu.

In still another embodiment of the invention, the non-magnetic metal film has a thickness in the range of 1 nm to 10 nm.

In still another embodiment of the invention, the hard magnetic film includes Co and M as main components, M representing Pt or two or more kinds of elements selected from a group consisting of Pt, Cr, and Ta.

In still another embodiment of the invention, the hard magnetic film is made of a material of CoPt.

In still another embodiment of the invention, the soft magnetic film includes $Ni_XFe_{1-X}$ or $(Ni_XCo_{1-X})_{X'}Fe_{1-X'}$ as a main component, the hard magnetic film includes $Co_YFe_{1-Y}$ as a main component, and in an atomic composition ratio, X is in the range of 0.6 to 1.0, X' is in the range of 0.7 to 1.0, and Y is in the range of 0.3 to 0.7.

In still another embodiment of the invention, the non-magnetic metal film is made of a material selected from Cu, Ag, and Au.

In still another embodiment of the invention, the soft magnetic film includes $Ni_XFe_{1-X}$ or $(Ni_XCo_{1-X})_{X'}Fe_{1-X'}$ as a main component, the hard magnetic film includes $(Co_ZFe_{1-Z})_{Z'}V_{1-Z'}$ as a main component, and in an atomic composition ratio, X is in the range of 0.6 to 1.0, X' is in the range of 0.7 to 1.0, Z is in the range of 0.3 to 0.7, and Z' is in the range of 0.9 to 0.98.

In still another embodiment of the invention, the non-magnetic metal film is made of a material selected from Cu, Ag, and Au.

In still another embodiment of the invention, the hard magnetic film is mainly made of Co, CoPt, or CoFe, the soft magnetic film mainly made of NiFe or NiFeCo, and the non-magnetic metal film is mainly made of Cu and has a thickness of 2 to 10 nm, each of the films is formed epitaxially on a substrate such that a [100] direction of the each film is in a direction vertical to a film plane of the each film, and a direction of the signal magnetic field is substantially a [011] direction of the non-magnetic metal film.

In still another embodiment of the invention, a square ratio of the hard magnetic film is 0.7 or more.

In still another embodiment of the invention, a direction of a current flowing through the multilayer structure is substantially perpendicular to a film surface of the multilayer structure.

According to still another aspect of the invention, a nonvolatile memory device includes: a magnetoresistive change portion including a first magnetic film, a second magnetic film, and a non-magnetic metal film for separating the first magnetic film from the second magnetic film; and conductive lines for allowing a first current for recording information and a second current for reading-out information to produce therethrough, magnetic fields which are respectively produced by the first current and the second current affecting the magnetoresistive change portion, wherein a magnetization curve of the first magnetic film has a good square feature, the first magnetic film having a coercive force capable of inverting a magnetization of the first magnetic film by the magnetic field produced by the first current but incapable of inverting the magnetization of the first magnetic film by the magnetic field produced by the second current, the second magnetic film having a coercive force capable of inverting a magnetization of the second magnetic film by the magnetic field produced by the second current, whereby information recorded on the memory device is nondestructively read out.

In one embodiment of the invention, the magnetoresistive change portion has a structure in which the first magnetic film, the second magnetic film, and the non-magnetic metal film are stacked a plurality of times.

In another embodiment of the invention, a further magnetic film is inserted on both faces or on one face of the first magnetic film, a thickness of the magnetic film is in the range of 0.1 to 2 nm, and the magnetic film includes at least one element selected from Co, Ni, and Fe as a main component.

In still another embodiment of the invention, the magnetoresistive change portion has a structure in which the first magnetic film, the second magnetic film, the non-magnetic metal film, and the inserted magnetic film are stacked a plurality of times.

In still another embodiment of the invention, a further magnetic film is inserted at, at least one of interfaces between the first magnetic film and the non-magnetic metal film and between the second magnetic film and the non-magnetic metal film, a thickness of the magnetic film is in the range of 0.1 to 1 nm, and the magnetic film includes Co as a main component.

In still another embodiment of the invention, the magnetoresistive change portion has a structure in which the first magnetic film, the second magnetic film, the non-magnetic metal film, and the inserted magnetic film are stacked a plurality of times.

In still another embodiment of the invention, the magnetoresistive change portion includes a plurality of first magnetic films, the plurality of first magnetic films having respective coercive forces which are different from each other.

In still another embodiment of the invention, a magnetization easy axis of the first magnetic film substantially agrees to directions of the magnetic fields produced by the first current and the second current flowing through the conductor lines.

In still another embodiment of the invention, the second magnetic film includes $Ni_XCo_YFe_Z$ as a main component, and in an atomic composition ratio, X is in the range of 0.6 to 0.9, Y is in the range of 0 to 0.4, and Z is in the range of 0 to 0.3.

In still another embodiment of the invention, the second magnetic film includes $Ni_{X'}Co_{Y'}Fe_{Z'}$ as a main component, and in an atomic composition ratio, X' is in the range of 0 to 0.4, Y' is in the range of 0.2 to 0.95, and Z' is in the range of 0 to 0.5.

In still another embodiment of the invention, the second magnetic film is an amorphous magnetic film.

In still another embodiment of the invention, the non-magnetic metal film is made of a material selected from Cu, Ag, and Au.

In still another embodiment of the invention, the non-magnetic metal film is made of Cu.

In still another embodiment of the invention, the non-magnetic metal film has a thickness in the range of 1 nm to 10 nm.

In still another embodiment of the invention, the first magnetic film includes Co and M as main components, M representing Pt or two or more kinds of elements selected from a group consisting of Pt, Cr, and Ta.

In still another embodiment of the invention, the first magnetic film is a semi-hard magnetic film.

In still another embodiment of the invention, the second magnetic film includes $Ni_XFe_{1-X}$ or $(Ni_XCo_{1-X})_{X'}Fe_{1-X'}$ as a main component, the first magnetic film includes $Co_YFe_{1-Y}$ as a main component, and in an atomic composition ratio, X is in the range of 0.6 to 1.0, X' is in the range of 0.7 to 1.0, and Y is in the range of 0.3 to 0.7.

In still another embodiment of the invention, the non-magnetic metal film is made of a material selected from Cu, Ag, and Au.

In still another embodiment of the invention, the second magnetic film includes $Ni_XFe_{1-X}$ or $(Ni_XCo_{1-X})_{X'}Fe_{1-X'}$ as a main component, the first magnetic film includes $(Co_ZFe_{1-Z})_{Z'}V_{1-Z'}$ as a main component, and in an atomic composition ratio, X is in the range of 0.6 to 1.0, X' is in the range of 0.7 to 1.0, Z is in the range of 0.3 to 0.7, and Z' is in the range of 0.9 to 0.98.

In still another embodiment of the invention, the non-magnetic metal film is made of a material selected from Cu, Ag, and Au.

In still another embodiment of the invention, the first magnetic film is mainly made of Co, CoPt, or CoFe, the second magnetic film mainly made of NiFe or NiFeCo, and the non-magnetic metal film is mainly made of Cu and has a thickness of 2 to 10 nm, each of the films is formed epitaxially on a substrate such that a [100] direction of the each film is in a direction vertical to a film plane of the each film, and a direction of the magnetic field produced by the first current is substantially a [011] direction of the non-magnetic metal film.

In still another embodiment of the invention, a square ratio of the first magnetic film is 0.7 or more.

According to still another aspect of the invention, an amplifying device includes: a magneto-resistive change portion including a first magnetic film, a second magnetic film, and a non-magnetic metal film for separating the first magnetic film from the second magnetic film; and conductive lines for allowing a signal current to flow therethrough, a magnetic field which is produced by the signal current affecting the magnetoresistive change portion, wherein a magnetization curve of the first magnetic film has a good square feature, the first magnetic film having a coercive force incapable of inverting a magnetization of the first magnetic film by the magnetic field produced by the signal current, the second magnetic film having a coercive force capable of inverting a magnetization of the second magnetic film by the magnetic field produced by the signal current.

In one embodiment of the invention, the magnetoresistive change portion has a structure in which the first magnetic film, the second magnetic film, and the non-magnetic metal film are stacked a plurality of times.

In another embodiment of the invention, a further magnetic film is inserted on both faces or on one face of the first magnetic film, a thickness of the magnetic film is in the range of 0.1 to 2 nm, and the magnetic film includes at least one element selected from Co, Ni, and Fe as a main component.

In still another embodiment of the invention, the magnetoresistive change portion has a structure in which the first magnetic film, the second magnetic film, the non-magnetic metal film, and the inserted magnetic film are stacked a plurality of times.

In still another embodiment of the invention, a further magnetic film is inserted at, at least one of interfaces between the first magnetic film and the non-magnetic metal film and between the second magnetic film and the non-magnetic metal film, a thickness of the magnetic film is in the range of 0.1 to 1 nm, and the magnetic film includes Co as a main component.

In still another embodiment of the invention, the magnetoresistive change portion has a structure in which the first magnetic film, the second magnetic film, the non-magnetic metal film, and the inserted magnetic film are stacked a plurality of times.

In still another embodiment of the invention, the second magnetic film includes $Ni_XCo_YFe_Z$ as a main component, and in an atomic composition ratio, X is in the range of 0.6 to 0.9, Y is in the range of 0 to 0.4, and Z is in the range of 0 to 0.3.

In still another embodiment of the invention, the second magnetic film includes $Ni_{X'}Co_{Y'}Fe_{Z'}$ as a main component, and in an atomic composition ratio, X' is in the range of 0 to 0.4, Y' is in the range of 0.2 to 0.95, and Z' is in the range of 0 to 0.5.

In still another embodiment of the invention, the second magnetic film is an amorphous magnetic film.

In still another embodiment of the invention, the non-magnetic metal film is made of a material selected from Cu, Ag, and Au.

In still another embodiment of the invention, the non-magnetic metal film is made of Cu.

In still another embodiment of the invention, the non-magnetic metal film has a thickness in the range of 1 nm to 10 nm.

In still another embodiment of the invention, the first magnetic film is a hard magnetic film.

In still another embodiment of the invention, the first magnetic film includes Co and M as main components, M representing Pt or two or more kinds of elements selected from a group consisting of Pt, Cr, and Ta.

In still another embodiment of the invention, the second magnetic film includes $Ni_XFe_{1-X}$ or $(Ni_XCo_{1-X})_{X'}Fe_{1-X'}$ as a main component, the first magnetic film includes $Co_YFe_{1-Y}$ as a main component, and in an atomic composition ratio, X is in the range of 0.6 to 1.0, X' is in the range of 0.7 to 1.0, and Y is in the range of 0.3 to 0.7.

In still another embodiment of the invention, the non-magnetic metal film is made of a material selected from Cu, Ag, and Au.

In still another embodiment of the invention, the second magnetic film includes $Ni_XFe_{1-X}$ or $(Ni_XCo_{1-X})_{X'}Fe_{1-X'}$ as a main component, the first magnetic film includes $(Co_ZFe_{1-Z})_{Z'}V_{1-Z'}$ main component, and in an atomic composition ratio, X is in the range of 0.6 to 1.0, X' is in the range of 0.7 to 1.0, Z is in the range of 0.3 to 0.7, and Z' is in the range of 0.9 to 0.98.

In still another embodiment of the invention, the non-magnetic metal film is made of a material selected from Cu, Ag, and Au.

In still another embodiment of the invention, the first magnetic film is mainly made of Co, CoPt, or CoFe, the second magnetic film is mainly made of NiFe or NiFeCo, and the non-magnetic metal film is mainly made of Cu and has a thickness of 2 to 10 nm, each of the films is formed epitaxially on a substrate such that a [100] direction of the each film is in a direction vertical to a film plane of the each film, and a direction of the magnetic field produced by the signal current is substantially a [011] direction of the non-magnetic metal film.

In still another embodiment of the invention, a square ratio of the first magnetic film is 0.7 or more.

Thus, the invention described herein makes possible the advantages of (1) providing a high-sensitive magnetoresistive device and a magnetoresistance effect type head which can operate at a weak magnetic field, and which exhibit a relatively large MR ratio, and (2) providing a nonvolatile memory device and an amplifying device which can perform nondestructive read-out without using any semiconductors.

These and other advantages of the present invention will become apparent to those skilled in the art upon reading and understanding the following detailed description with reference to the accompanying figures.

BRIEF DESCRIPTION OF THE DRAWINGS

FIG. 1A shows the construction of a sandwich-type magnetoresistance effect device, and FIG. 1B shows the construction of a stacked-type magnetoresistance effect device.

FIG. 2A shows the construction of a sandwich-type magnetoresistance effect device, and FIG. 2B shows the construction of a stacked-type magnetoresistance effect device.

FIGS. 9A to 9C are diagrams for showing the relationship between the square feature of the magnetization curve of a hard magnetic film 1 (or a magnetic film 1') and an MR curve of a magnetoresistance effect device of the invention.

FIG. 10 is a graph showing an MR curve of a magnetoresistance effect device having a structure of [NiFeCo/Cu/CoPt/Cu] according to the invention.

FIG. 11 is a graph showing an MR curve of an [NiFe/Cu/Co/Cu] artificial multilayer using magnetic films having different coercive forces of a prior art.

DESCRIPTION OF THE PREFERRED EMBODIMENTS

The present invention relates to a hard-film spin valve and a magnetoresistance effect device using multi-layered hard-film spin valves. Unlike a conventional spin valve using an anti-ferromagnetic film of a conventional material such as Fe—Mn, in the hard-film spin valve of the invention, a unidirectionally magnetized hard magnetic film performs similar functions to the anti-ferromagnetic film.

Figure 1A:
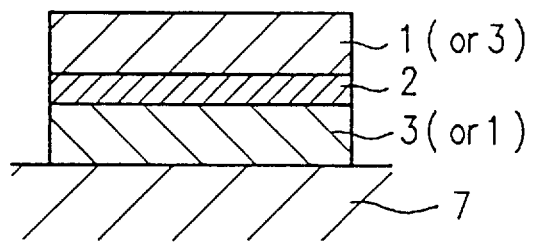
FIGS. 1A and 1B are views showing the constructions of magnetoresistance effect devices according to the invention.

FIG. 1A shows the construction of a magnetoresistance effect device of the invention. The magnetoresistance effect device includes a substrate 7 and a multilayer structure formed on the substrate 7. The multilayer structure includes a hard magnetic film 1, a non-magnetic metal film 2, and a soft magnetic film 3. In this specification, a device portion having such a multilayer structure is referred to as a magnetoresistive device portion. The magnetization curve of the hard magnetic film 1 has a good square feature, and hence the magnetization of the hard magnetic film 1 is not inverted in a weak magnetic field. The hard magnetic film 1 is formed so that the direction of the magnetization easy axis of the hard magnetic film 1 is substantially equal to the direction of the magnetic field to be detected. The "direction of the magnetic field to be detected" is typically identical with the direction of the signal magnetic field applied to the magnetoresistance effect device. However, in exceptional cases, the direction of the magnetic field to be detected may be different from the direction of the signal magnetic field to be applied to the magnetoresistance effect device. For example, the case where the direction of the signal magnetic field which is externally entered is bent by an L-shaped yoke is one of the exceptional cases. The non-magnetic metal film 2 is provided between the hard magnetic film 1 and the soft magnetic film 3 in order to reduce the force of the magnetic coupling between the hard magnetic film 1 and the soft magnetic film 3. The magnetization of the soft magnetic film 3 can be easily inverted in a weak magnetic field. The soft magnetic film 3 is isolated from the magnetic coupling to the hard magnetic film 1 by the non-magnetic metal film 2.

In this specification, a magnetic film having a coercive force of 20 Oe or more is referred to as "a hard magnetic film", and a magnetic film having a coercive force less than 20 Oe is referred to as "a soft magnetic film". In addition, a hard magnetic film having a coercive force smaller than 100 Oe is referred to as "a semi-hard magnetic film". The value of a coercive force used in this specification is a value obtained by measuring with an AC of a relatively low frequency range (e.g., 60 Hz).

In the case where the hard magnetic film 1 is unidirectionally magnetized by using a ferromagnetic field, when a weak signal magnetic field having a direction opposite to the direction in which the hard magnetic film 1 is magnetized, is applied to the magnetoresistance effect device, the magnetization of the hard magnetic film 1 is not inverted, but the magnetization of the soft magnetic film 3 is inverted into the direction of the signal magnetic field. As a result, the magnetization direction of the hard magnetic film 1 is anti-parallel to the magnetization direction of the soft magnetic film 3. When the magnetization direction of the hard magnetic film 1 is anti-parallel to that of the soft magnetic film 3, the electrons in a current flowing through the magnetoresistance effect device is subjected to magnetic scattering at interfaces between the hard magnetic film 1 and the non-magnetic metal film 2, and between the non-magnetic metal film 2 and the soft magnetic film 3. As a result, the resistance of the magnetoresistance effect element is increased. On the other hand, when a weak signal magnetic field having the same direction as the direction in which the hard magnetic film 1 is magnetized is applied to the magnetoresistance effect device, the magnetization direction of the hard magnetic film 1 is parallel to that of the soft magnetic film 3. As a result, the above-mentioned magnetic scattering is reduced, so that the resistance of the magnetoresistance effect device is lowered. On the basis of the above-described principle, the magnetoresistance effect device varies its electric resistance depending on the change of the signal magnetic field.

Figure 1B:
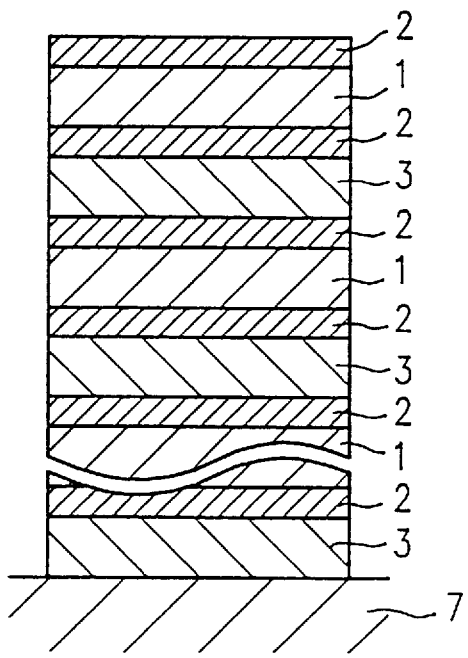

FIG. 1B shows another construction of a magnetoresistance effect device according to the invention. The magnetoresistance effect device shown in FIG. 1B includes a structure in which a structure of [the hard magnetic film 1/the non-magnetic metal film 2/and the soft magnetic film 3] shown in FIG. 1A is stacked a plurality of times via the non-magnetic metal film 2. Such a stacked structure is represented by [the hard magnetic film 1/the non-magnetic metal film 2/the soft magnetic film 3/the non-magnetic metal film 2]$^N$ (N indicates the number of repetitions). By adopting such a stacked structure, the magnetic scattering at the interfaces between the respective films is increased. Thus, it is possible to obtain a magnetoresistance effect device having a larger MR ratio. Moreover, if a current is caused to flow in a direction perpendicular to the film face of the magnetoresistive device portion having such a stacked structure formed by using a lithography technique or the like, the magnetic scattering at the interfaces between the respective films is further increased. Accordingly, it is possible to obtain a magnetoresistance effect device having a much larger MR ratio.

Figure 3:
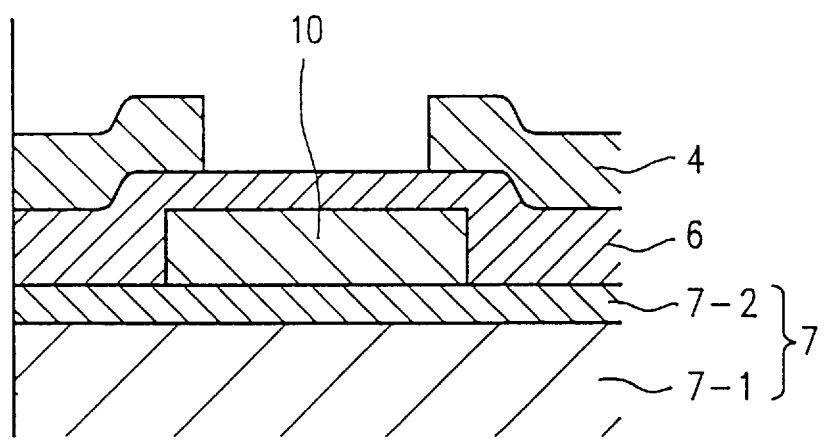
FIG. 3 is a view showing the construction of a magnetoresistance effect type head according to the invention.

FIG. 3 shows the construction of a magnetoresistance effect type head according to the invention. A substrate 7 includes a ferrite 7-1, or a Co-based amorphous film such as CoNbZr or the like formed on a nonmagnetic substrate or NiFe film 7-1 with high magnetic permeability formed on the substrate 7, and an insulating film 7-2. A magnetoresistive device portion 10 is formed on the substrate 7. The magnetoresistive device portion 10 has the same structure as that of the multilayer of the magnetoresistance effect device shown in FIG. 1A or 1B. An insulating film 6 is formed on the magnetoresistive device portion 10. A yoke 4 for guiding a signal magnetic flux from a magnetic medium to the soft magnetic film 3 is formed on the insulating film 6. In the case where the magnetoresistive device portion 10 is disposed at a position at which the signal magnetic flux from the magnetic device can be easily detected, the yoke 4 is not necessarily required. In order to reduce a Barkhausen noise, it is desired that the soft magnetic film 3 is formed so that the magnetization easy axis of the soft magnetic film 3 is orthogonal to the direction of the signal magnetic field applied to the magnetoresistance effect device. The magnetoresistive device portion 10 varies the electric resistance of the magnetoresistive device portion 10 depending on a weak signal magnetic field which is guided by the yoke 4.

If necessary, a conductor line for a bias magnetic field for applying a bias to the above-mentioned magnetoresistive device portion having the multilayer structure can be provided in the vicinity of the magnetoresistive device portion. Alternatively, in order to make at least the soft magnetic film 3 of the magnetoresistive device portion into a single magnetic domain, an anti-ferromagnetic film or a hard magnetic film may be attached to the end of the magnetoresistive device portion.

Figure 4:
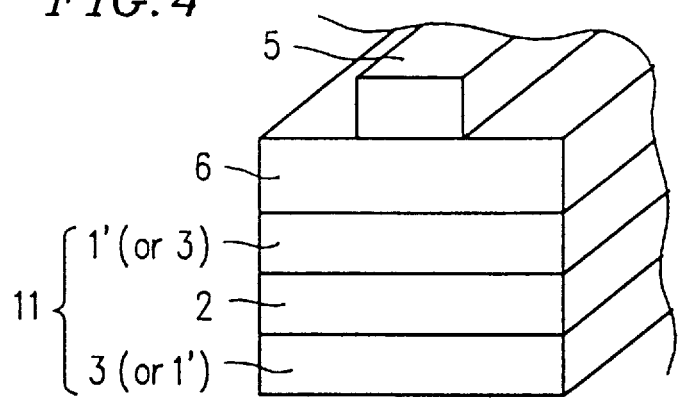
FIG. 4 is a view showing the construction of a memory device and an amplifying device according to the invention.

FIG. 4 shows the construction of a memory device according to the invention. The memory device includes a magnetoresistive change portion 11 and a conductor line 5 for allowing a current to flow. The conductor line 5 is disposed in the vicinity of the magnetoresistive change portion 11 so that the magnetic field produced by the current flowing through the conductor line 5 affects the magnetoresistive change portion 11. The magnetoresistive change portion 11 is insulated from the conductor line 5 by the insulating film 6.

The magnetoresistive change portion 11 includes a magnetic film 1', a non-magnetic metal film 2, and a soft magnetic film 3. The magnetization curve of the magnetic film 1' exhibits a good square feature, so that the magnetization of the magnetic film 1' is not inverted in a weak magnetic field. The non-magnetic metal film 2 is provided between the magnetic film 1' and the soft magnetic film 3 in order to reduce the magnetic coupling force between the magnetic film 1' and the soft magnetic film 3. The magnetization of the soft magnetic film 3 can be easily inverted even in a weak magnetic field. The soft magnetic film 3 is isolated from the magnetic coupling to the magnetic film 1' by the non-magnetic metal film 2.

The magnetic film 1' has a coercive force which is larger than that of the soft magnetic film 3. Moreover, the magnetic film 1' is required to have a coercive force smaller than the maximum magnetic field produced by the current flowing through the conductor line 5, so that the magnetization can be inverted by the magnetic field produced by the conductor line 5. The purpose for the requirement is to represent the information to be stored in the memory device in accordance with the direction of the magnetization of the magnetic film 1'. Once the magnetic film 1' is magnetized by a magnetic field which is stronger than the coercive force of the magnetic film 1', the magnetization of the magnetic film 1' cannot be inverted by a magnetic field which is smaller than the coercive force of the magnetic film 1'.

Hereinafter, the operation of a memory device according to the invention will be described.

The magnetoresistive change portion 11 can be constituted so as to include a structure in which the structure of [the magnetic film 1'/the non-magnetic metal film 2/the soft magnetic film 3] shown in FIG. 4 is stacked a plurality of times via the non-magnetic metal film 2. In such a case, it is possible to obtain a memory device having a larger MR ratio.

In the case where information is to be stored in a memory device, a current for storing information is caused to flow through the conductor line 5. By a magnetic field produced by the current for storing information, the magnetization of the magnetic film 1' and the magnetization of the magnetic film 3 are inverted. In the magnetic film 1', information is stored in accordance with the direction of the magnetization of the magnetic film 1'. For example, in the case where the direction of the magnetization of the magnetic film 1' is indicated by the right-pointing arrow shown in FIG. 6A, the information to be stored is "1". In the case where the direction of the magnetization of the magnetic film 11 is indicated by the left-pointing arrow shown in FIG. 6A, the information to be stored is "0".

In order to read-out information from the memory device, a weak current for reading-out information is used. When a weak magnetic field having a direction opposite to that of the magnetization of the magnetic film 1' is applied to the magnetoresistive change portion 11 by the weak current for reading-out information, the magnetization of the magnetic film 1' is not inverted, but the magnetization of the soft magnetic film 3 is inverted into the direction of the weak magnetic field. As a result, the direction of the magnetization of the magnetic film 1' is anti-parallel to that of the magnetization of the soft magnetic film 3, so that the resistance of the magnetoresistive change portion 11 is increased. On the other hand, when a weak magnetic field having the same direction as that of the magnetization of the magnetic film 1' is applied to the magnetoresistive change portion 11 by the weak current for reading-out information, the magnetization of the magnetic film 1' is not inverted, but the magnetization of the soft magnetic film 3 is inverted into the direction of the weak magnetic field. As a result, the direction of the magnetization of the magnetic film 1' is parallel to that of the magnetization of the soft magnetic film 3, so that the resistance of the magnetoresistive change portion 11 is decreased.

In the case where information is to be read-out from the memory device, a weak current for reading-out information is first caused to flow through the conductor line 5 in a certain direction (initialization by weak current), and then a weak current for reading-out information is caused to flow through the conductor line 5 in a direction opposite to the certain direction (reversal of weak current). For example, FIG. 6B shows the case where a weak current is caused to flow through the conductor line 5 in a direction perpendicular to the drawing sheet from the back face to the front face thereof (initialization by weak current), and FIG. 6C shows the case where a weak current is caused to flow through the conductor line 5 in a direction perpendicular to the drawing sheet from the front face to the back face thereof (reversal of weak current).

The information stored in the magnetic film 1' is detected as the change of the resistance of the magnetoresistive change portion 11. For example, when the information stored in the magnetic body 1' is "1", the resistance of the magnetoresistive change portion 11 during the reversal of weak current is increased as compared with the case of the initialization by weak current. When the information stored in the magnetic body 1' is "0", the resistance of the magnetoresistive change portion 11 during the reversal of weak current is decreased as compared with the case of the initialization by weak current (see FIG. 6D). In this way, the information store in the magnetic film 1' can be read-out in a nondestructive manner. The weak current may be a pulse-type weak current.

Figure 5:
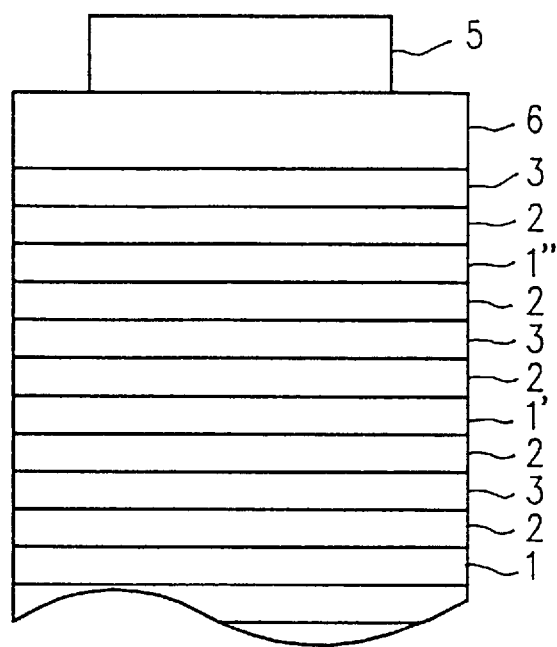
FIG. 5 is a view showing the construction of a memory device which is capable of recording multi-value information according to the invention.
Figure 7A:
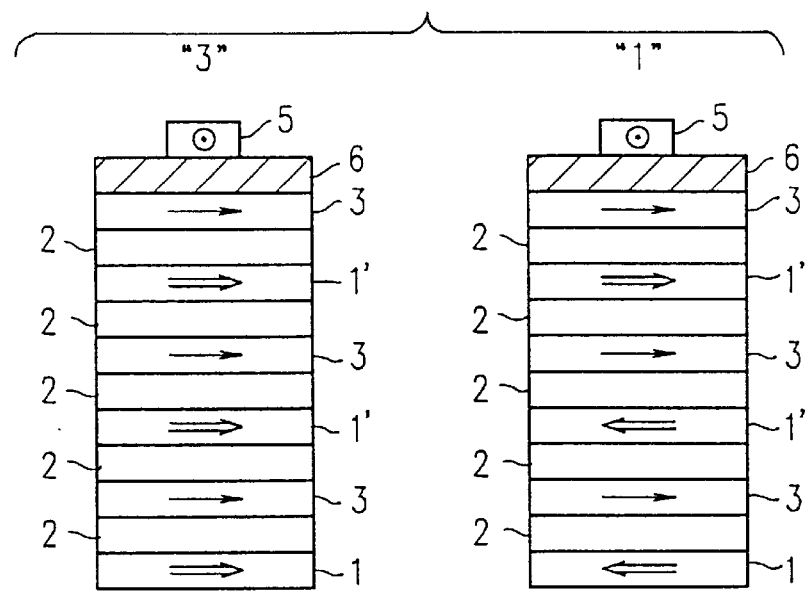
FIGS. 7A to 7C are diagrams for illustrating the operation of a memory device capable of recording multi-value information according to the invention.
Figure 7B:
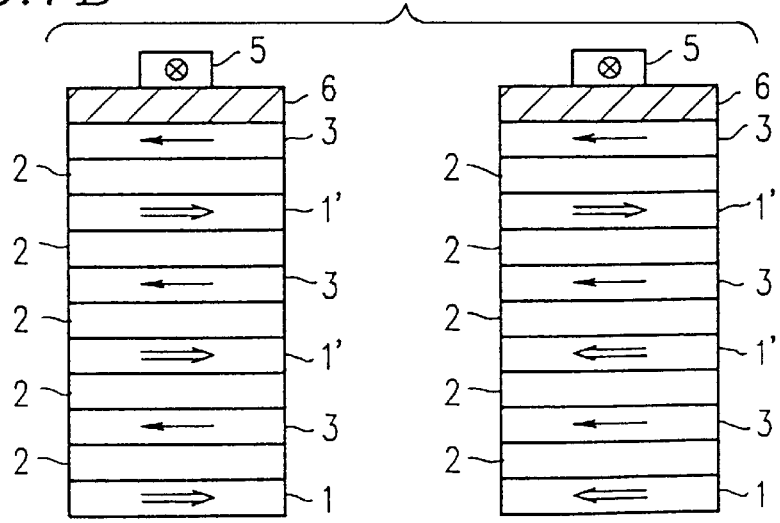
Figure 7C:
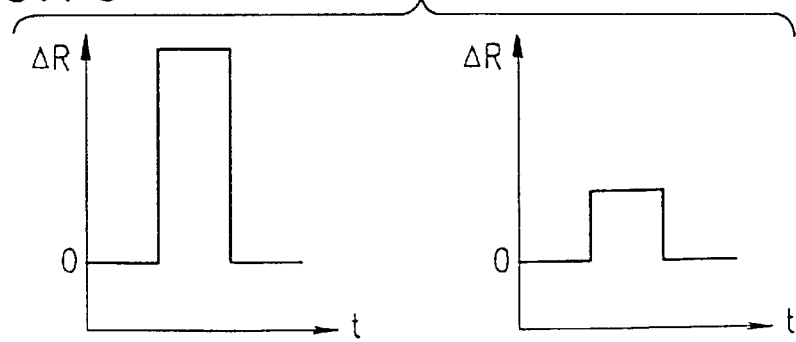

FIG. 5 shows another construction of a memory device according to the invention. The memory device shown in FIG. 5 has a structure in which a structure of [the magnetic film 1'/the non-magnetic metal film 2/the soft magnetic film 3] shown in FIG. 4 is stacked a plurality of times via the non-magnetic metal film 2. In addition, the coercive forces of the plurality of magnetic films 1' included in the stacked structure are different from each other. If the number of magnetic films 1' in which the magnetization thereof is not inverted by a predetermined signal magnetic field is related to a desired value, multivalue information can be stored in the plurality of magnetic films 1'. In this way, it is possible to obtain a memory device capable of storing multivalue information. For example, such a memory device operates as shown in FIGS. 7A to 7C.

The construction of an amplifying device according to the invention is the same as that of the above-described memory device according to the invention except for the coercive forces of the magnetic films 1'. Therefore, the detailed description thereof is omitted.

Next, the operation of the amplifying device according to the invention will be described.

Figure 8A:
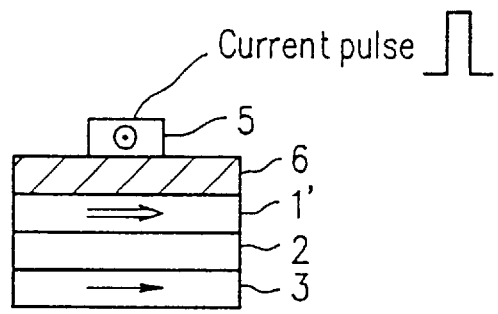
FIGS. 8A to 8C are diagrams for illustrating the operation of an amplifying device according to the invention.

First, the amplifying device is initialized (see FIG. 8A). That is, a strong current pulse is caused to flow through the conductor line 5, the magnetization of the magnetic film 1' is fixed in one direction. The amplifying device is constituted so that the magnetization easy axis of the magnetic film 1' substantially agrees with the direction of the magnetic field produced by the strong current pulse.

Figure 8B:
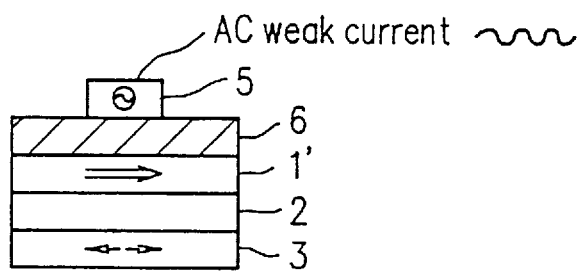

Then, in order to perform the amplifying operation, a weak current proportional to an input voltage is caused to flow through the conductor line 5 (see FIG. 8B). By the weak magnetic field caused by the alternating weak current, a rotation of the magnetization of the magnetic film 1' (or movement of magnetic domain walls) does not occur, but a rotation of the magnetization of the soft magnetic film 3 (or movement of magnetic domain walls) occurs. Accordingly, the resistance of the magnetoresistive change portion 11 including the structure of [the magnetic film 1'/the non-magnetic metal film 2/the soft magnetic film 3] is varied depending on an angle formed by the direction of the magnetization of the magnetic film 1' and the direction of the magnetization of the magnetic film 3. As a result, an amplified output can be obtained (see FIG. 8C).

The memory device according to the invention is different from the magnetoresistance effect type head according to the invention in that the magnetic film 1' is not necessarily required to be a hard magnetic film with a large coercive force in the memory device of the invention. In the memory device of the invention, it is sufficient that the magnetic Film 1' is a semi-hard magnetic film, as far as the magnetic film has a coercive force larger than that of the soft magnetic film 3. The reason is that, when information is written into the memory device, it is necessary to invert the magnetization of the magnetic film 1'. In view of the reliability, it is desired that the magnetic film 1' is a hard magnetic film. However, in view of the reduction of the current for storing information, it is desired that the magnetic film 1' is a semi-hard magnetic film.

In the amplifying device according to the invention, it is desired that the magnetic film 1' is a hard magnetic film, because the magnetization of the magnetic film 1' is required not to be inverted by the signal magnetic field. However, in practice, there is no problem if the magnetic film 1' is not necessarily a hard magnetic film, as far as the magnetic film 1' is a magnetic film having a magnetization curve with a good square feature. The reason is that the signal current flowing through the conductor line 5 during the amplifying operation is small, and hence the magnetic field produced by the signal current is also small.

In addition, in the above-described magnetoresistance effect device, the magnetoresistance effect type head, the memory device, and the amplifying device, a magnetic film 3' may be inserted at, at least one of the interface between the magnetic film 1 (or the magnetic film 1') and the non-magnetic metal film 2, and the interface between the soft magnetic film 3 and the non-magnetic metal film 2. In this case, it is preferred that the magnetic film 3' is a magnetic film including Co as a main component. It is preferred that the magnetic film 3' has a thickness of 0.1 to 1 nm. In the case where the thickness of the magnetic film 3' is 0.1 nm or less, the effect for improving the MR ratio is small. On the other hand, it is not desired that a magnetic film 3' is attached to have a thickness of 1 nm or more at the interface with the soft magnetic film 3, because the deteriorate the soft magnetic property of the soft magnetic film 3. By inserting a magnetic film 3' as described above, the magnetic scattering at the respective interfaces of the films is increased. As a result, it is possible to obtain a device with a larger MR ratio.

Alternatively, a magnetic film 3' may be inserted between the hard magnetic film 1 (or the magnetic film 1') and the non-magnetic metal film 2. The magnetic film 3' is provided on both faces or on one face of the hard magnetic film 1 (or the magnetic film 1'). In this case, it is sufficient that the thickness of the magnetic film 3' is set in the range of 0.1 to 2 nm. It is also sufficient that the composition of the magnetic film 3' includes at least one element selected from Co, Ni, Fe as the main component. If the thickness of the magnetic film 3' is smaller than 0.1 nm, the effect for improving the MR ratio is small. On the other hand, if the thickness of the magnetic film 3' is 2 nm or more, the square feature of the magnetization curve and the coercive force of the hard magnetic film 1 (or the magnetic film 1') may be easily degraded. In the case where the magnetoresistance effect device is used for the magnetic head and the like, it is especially desired that the thickness of the magnetic film 3' is 1 nm or less. This is because that the magnetization curve of the magnetic film 1 exhibits a good square feature, and the magnetic film 1 is required to be a hard magnetic film having a relatively large coercive force.

Figure 2A:
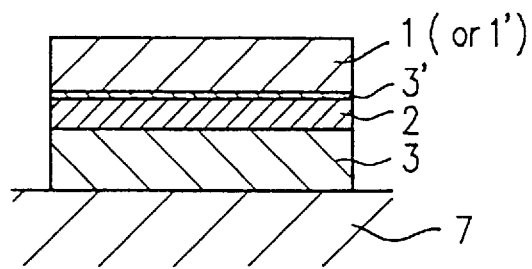
FIGS. 2A and 2B are views showing other constructions of magnetoresistance effect devices according to the invention.

FIG. 2A shows an example in which, in the sandwich-type magnetoresistance effect device shown in FIG. 1A, the magnetic film 3' is inserted at the interface between the hard magnetic film 1 (or the magnetic film 1') and the non-magnetic metal film 2.

Figure 2B:
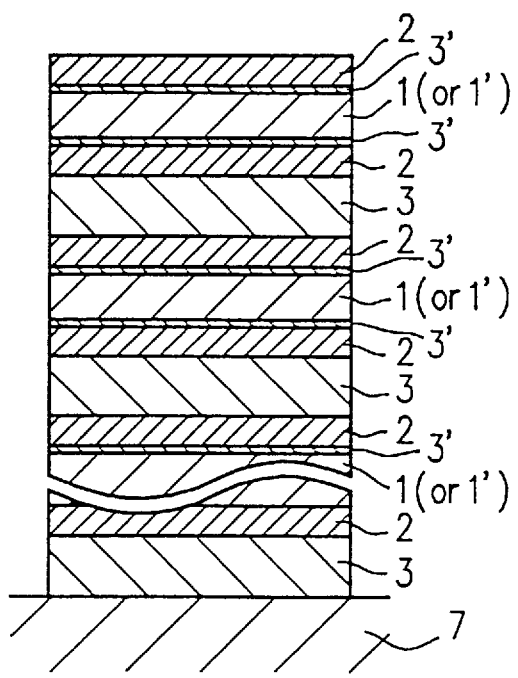

FIG. 2B shows an example in which, in the stacked-type magnetoresistance effect device shown in FIG. 1B, the magnetic film 3' is inserted at the interface between the hard magnetic film 1 (or the magnetic film 1') and the non-magnetic metal film 2. In FIG. 2B, the magnetic film 3' is provided on both faces of the hard magnetic film 1 (or the magnetic film 1'). It is also appreciated that the magnetic film 3' may be provided on only one face of the hard magnetic film 1 (or the magnetic film 1'). The magnetoresistance effect device shown in FIG. 2B shows a larger MR ratio, as compared with the magnetoresistance effect device shown in FIG. 2A.

In the case where the stacked-type magnetoresistance effect device as shown in FIGS. 1B and 2B is used, it is preferred that the respective thicknesses of the hard magnetic film 1 (or the magnetic film 1'), the non-magnetic metal film 2, the soft magnetic film 3, and the magnetic film 3' are not so large, considering the mean free path of electrons. The MR ratio is increased as the stacked number of components is increased. When the components are stacked three times or more, the effect is remarkably observed. When the components are stacked ten times or more, the effect is substantially saturated. In view of the sheet resistance, the stacked number of films is desired to be five times or less, except for the cases where a current is caused to flow in a direction perpendicular to the film face during the operation.

It is necessary that the magnetization curve of the hard magnetic film 1 (or the magnetic film 1') has a good square feature. In this specification, a "good square feature" is defined so that the square ratio S (=remnant magnetization/saturation magnetization) is 0.7 or more.

FIGS. 9A to 9C show the relationships between the square ratio S of the hard magnetic film 1 (or the magnetic film 1') and the MR curve of the magnetoresistance effect device according to the invention. As is seen from FIGS. 9A to 9C, when the square ratio S is smaller than 0.7, the MR curve in the vicinity of the zero magnetic field is deteriorated. The deterioration of the MR curve in the vicinity of the zero magnetic field may deteriorate the reproduction sensitivity and the linearity of the magnetoresistive type head and the amplifying device, and also a memory device may erroneously operate during the recording and reproduction due to the erroneous operation of magnetization inversion of the magnetic film 1'. As described above, it is important that the hard magnetic film 1 (or the magnetic film 1') is unidirectionally magnetized, and hence the magnetic film has such a character that the magnetized state is kept and the magnetization is not inverted in a weak magnetic field.

In the magnetoresistance effect type head according to the invention, the magnetization of the magnetic film 1 is fixed in one direction. Accordingly, the magnetic film 1 is required to be a hard magnetic film having a large coercive force, and it is desired that the coercive force in the bulk state or in the thick film state of a film of the same composition is 500 Oe or more. In addition, it is desired that the magnetic film 1 has a good corrosion resistance. Examples of the material for the magnetic film 1 include $Co_{0.75}Pt_{0.25}$, $Co_{0.84}Ta_{0.02}Cr_{0.14}$, $Co_{0.78}Pt_{0.10}Cr_{0.12}$, $Co_{0.5}Fe_{0.5}$, and the like. At present, in view of the coercive force and the corrosion resistance, CoPt is the most suitable material. In view of the MR ratio, CoFe is the most suitable material. The Curie temperatures of these films are sufficiently higher than the Néel temperature of the Fe—Mn film which is used in the conventional spin valve. Thus, the dependence of the characteristics of these films on temperature can advantageously be reduced.

In the memory device according to the invention, it is again important that the magnetization curve of the magnetic film 1' has a good square feature, but the coercive force of the magnetic film 1' is not so important. During the information recording, it is necessary to invert the magnetization of the magnetic film 1' by allowing a current to flow through the conductor line. Accordingly, the magnetic film 1' may alternatively be a semi-hard magnetic film of $Co_{0.5}Fe_{0.5}$, Co, or the like. The coercive force of the magnetic film 1' can be adjusted by changing the film thickness. In such an application, the magnetic film 1' may be a semi-hard magnetic film of $Co_{0.8}Pt_{0.2}$ or the like having a thickness of 3 nm or less.

In the amplifying device according to the invention, the magnetization of the magnetic film 1' is fixed in one direction. Accordingly, it is desired that the magnetic film 1' is made of a hard magnetic material having a large coercive force. However, in practical use, the magnetic film 1' may be made of a semi-hard magnetic material. This is because the signal current which flows through the conductor line 5 is very small, so that the magnetic field produced by the signal current is also very small.

The magnetic film 3 is required to have a soft magnetic property in which the magnetization can easily be inverted by a small magnetic field so that the magnetoresistance can easily be changed. Also, it is preferred that the soft magnetic film 3 is a film with low magnetostriction. This is because, if a film has high magnetostriction in practical use, it may often cause a noise, and there occurs a variation in characteristics among the fabricated devices. In order to satisfy the above-mentioned conditions, it is desired that an Ni-rich soft magnetic film having the following material as the main component:

$$Ni_XCo_YFe_Z \tag{1}$$

and the atomic composition ratio of the material is:

$$X=0.6 \text{ to } 0.9, Y=0 \text{ to } 0.4, \text{ and } Z=0 \text{ to } 0.3 \tag{1'}$$

Representative examples of such a material include $Ni_{0.8}Fe_{0.15}Co_{0.05}$, $Ni_{0.8}Fe_{0.1}Co_{0.1}$, $Ni_{0.68}Co_{0.2}Fe_{0.12}$ and the like. Alternatively, if a Co-rich soft magnetic film is used, a large change of magnetoresistance can be obtained, although such a film is inferior to the above-mentioned Ni-rich soft magnetic film in the soft magnetic property. A Co-rich soft magnetic film includes the following material as the main component:

$$Ni_{X'}Co_{Y'}Fe_{Z'} \tag{2}$$

and the atomic composition ratio of the material is:

$$X'=0 \text{ to } 0.4, Y'=0.2 \text{ to } 0.95, \text{ and } Z'=0 \text{ to } 0.5 \tag{2'}$$

Representative examples of such a film include $Co_{0.44}Fe_{0.3}Ni_{0.26}$, $Co_{0.6}Fe_{0.2}Ni_{0.2}$, $Co_{0.7}Fe_{0.2}Ni_{0.1}$ and the like. When the composition ratios of these films satisfy the conditions of (1') and (2'), the low magnetostriction which is required for the magnetoresistance effect device such as a sensor or an MR head can be attained (i.e., the magnetostriction is at about $1 \times 10^{-5}$ or less).

Alternatively, the soft magnetic film 3 may be a Co-based amorphous alloy film. The Co-based amorphous alloy film has such a disadvantage that the specific resistance is somewhat higher as compared with the above-described materials for the soft magnetic film, but has such advantages that the magnetization can be inverted in a very weak magnetic field, and that the film has a high magnetic permeability substantially at a zero magnetostriction. A representative one of the Co-based amorphous alloy film is $Co_{0.75}Fe_{0.05}B_{0.2}$.

The non-magnetic metal film 2 is desired to be less reactive and to be difficult to form a solid solution at the interface with the hard magnetic film 1 (or the magnetic film 1') and at the interface with the soft magnetic film 3. Also, the non-magnetic metal film 2 is required to be a film which can form a flat and clear interface with the magnetic film. In addition, the non-magnetic metal film 2 is required to be non-magnetic, in order to cut the magnetic coupling between the hard magnetic film 1 (or the magnetic film 1') and the soft magnetic film 3. For the non-magnetic metal film 2, Cu, Ag, Au or the like is suitable. In view of the MR characteristic, Cu is the most suitable material. If the thickness of the non-magnetic metal film 2 is 10 nm or more, the MR ratio of the whole device is reduced. Accordingly, it is necessary to set the thickness of the non-magnetic metal film 2 to be 10 nm or less. Preferably, the thickness thereof is set to be 5 nm or less. On the other hand, if the thickness of the non-magnetic metal film 2 becomes smaller than 1 nm, the hard magnetic film 1 (or the hard magnetic film 1') is magnetically coupled with the soft magnetic film 3, and hence a large magnetoresistance effect cannot be attained.

A magnetic film 3' which is inserted between the hard magnetic film 1 (or the magnetic film 1') and the non-magnetic metal film 2, or between the soft magnetic film 3 and the non-magnetic metal film 2 can increase the magnetoresistance effect. In order to attain such an effect, the magnetic film 3' includes Co or at least one element selected from Ni, Co, and Fe as the main component. Alternatively, the magnetic film 3' may be made of Co, $Co_{0.9}Fe_{0.1}$ or $Co_{0.44}Fe_{0.3}Ni_{0.26}$, $Co_{0.6}Ni_{0.2}Fe_{0.2}$, $Co_{0.7}Fe_{0.2}Ni_{0.1}$ or the like for the above-mentioned soft magnetic film 3.

The yoke 4 of the magnetic head shown in FIG. 3 is desired to be soft magnetic and to have high magnetic transmittance. As the yoke 4, a Co-based amorphous magnetic alloy film is suitably used. As an example thereof, $Co_{0.8}Nb_{0.12}Zr_{0.06}$ is used.

The conductor line 5 of the memory device (or the amplifying device) shown in FIG. 4 is a low-resistive metal-film line for generating a magnetic field. In the case where memory devices are arranged in a matrix, conductor lines may not intersect each other as shown in FIG. 15A or conductor lines may intersect each other on respective devices as shown in FIG. 15B.

Figure 15A:
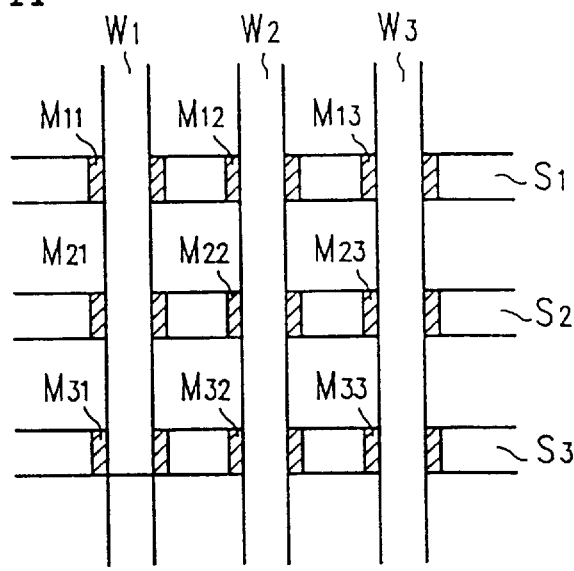
FIGS. 15A and 15B are diagrams showing arrangement examples of conductor lines in a memory device according to the invention.

In FIG. 15A, $M_{ij}$ (i=1 to 3; j=1 to 3) indicates a magnetoresistive change portion, $W_1$ to $W_3$ indicate conductor lines (word lines), and $S_1$ to $S_3$ indicate sense lines. The sense lines $S_1$ to $S_3$ are formed by the magnetoresistive change portions $M_{ij}$ (shaded portions in the figure) and shunting conductor portions (white portions in the figure). For example, when information is to be stored into a magnetoresistive change portion $M_{11}$, a current is allowed to flow through the word line $W_1$ and the sense line $S_1$. As a result, information is stored in the magnetoresistive change portion $M_{11}$ by a synthetic magnetic field produced by the current flowing through the word line $W_1$ and the sense line $S_1$. When the information stored in the magnetoresistive change portion $M_{11}$ is to be reproduced, a pulse current is allowed to flow through the word line $W_1$. By detecting the change of resistance of the sense line $S_1$ which is caused by the current flowing through the word line $W_1$, the information stored in the magnetoresistive change portion $M_{11}$ can be read out.

Figure 15B:
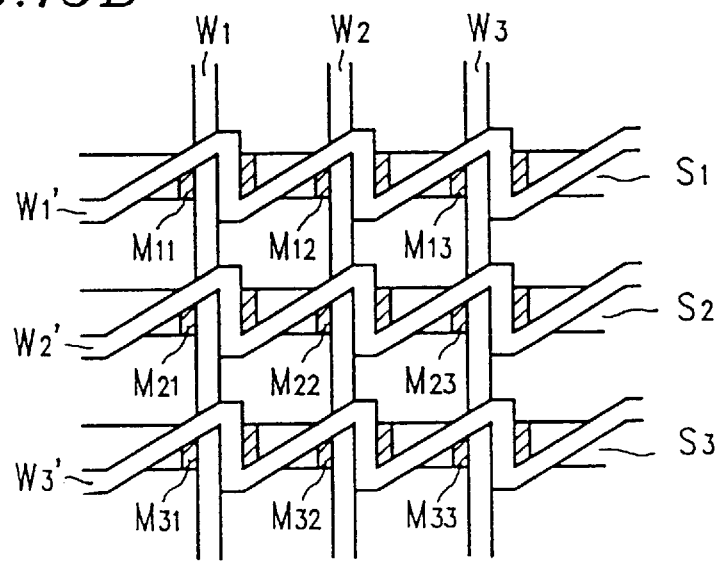

In FIG. 15B, $M_{ij}$ (i=1 to 2; j=1 to 3) indicates a magnetoresistive change portion, $W_1$ to $W_3$ and $W'_1$ and $W'_2$ indicate conductor lines (word lines), and $S_1$ and $S_2$ indicate sense lines. The sense lines $S_1$ and $S_2$ are formed by the magnetoresistive change portions $M_{ij}$ (shaded portions in the figure) and shunting conductor portions (white portions in the figure). For example, when information is to be stored into a magnetoresistive change portion $M_{11}$, a current is allowed to flow through the word line $W_1$ and the word line $W'_1$. As a result, information is stored in the magnetoresistive change portion $M_{11}$ by a synthetic magnetic field produced by the current flowing through the word line $W_1$ and the word line $W'_1$. When the information stored in the magnetoresistive change portion $M_{11}$ is to be reproduced, a pulse current is allowed to flow through the word line $W_1$. By detecting the change of resistance of the sense line $S_1$ which is caused by the current flowing through the word line $W_1$, the information stored in the magnetoresistive change portion $M_{11}$ can be read out.

Hereinafter, the invention will be described by way of specific examples.

(Example 1)

Figure 12:
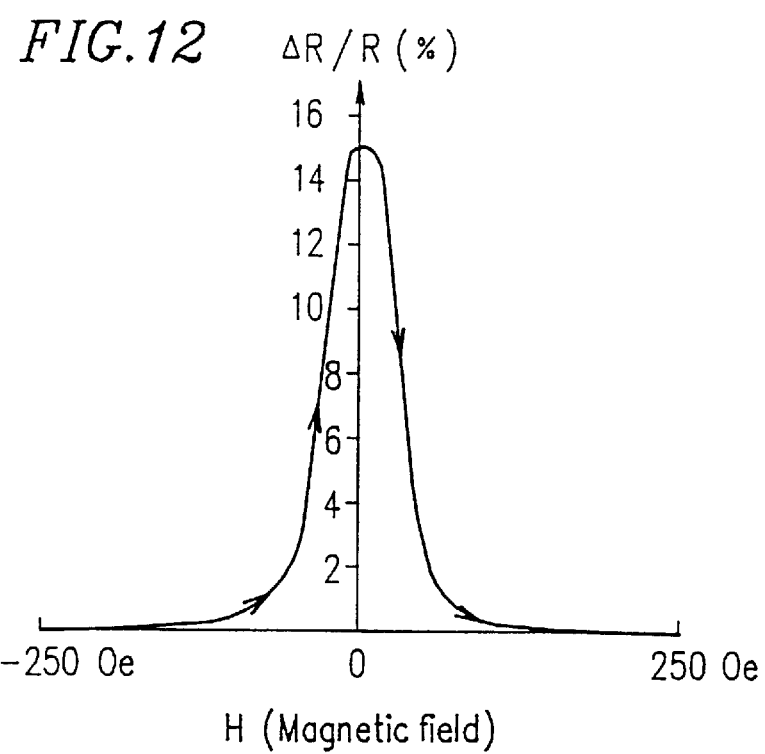
FIG. 12 is a graph showing an MR curve of an anti-ferromagnetic coupling type [NiFeCo/Cu/Co/Cu] artificial multilayer of a prior art.
Figure 13:
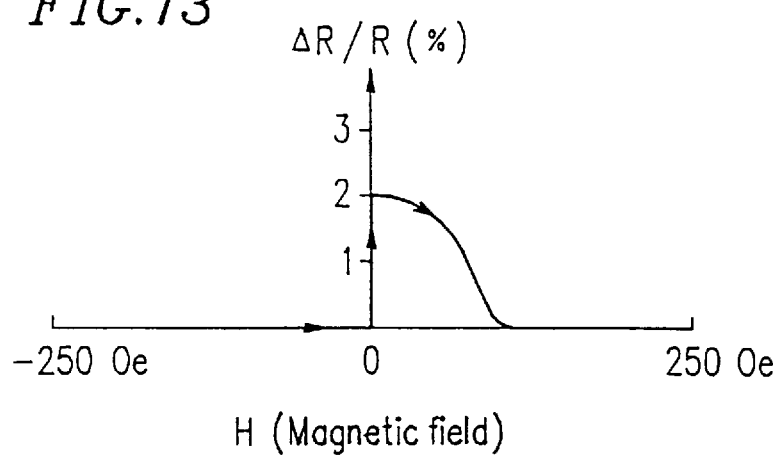
FIG. 13 is a graph showing an MR curve of an [NiFe/Cu/NiFe/FeMn] spin valve film using an anti-ferromagnetic film of a prior art.

By using $Ni_{0.68}Co_{0.2}Fe_{0.12}$ (the soft magnetic film 3), Cu (the non-magnetic metal film 2), and $Co_{0.75}Pt_{0.25}$ (the hard magnetic film 1) as targets (the composition ratios are all indicated by atomic %), the sandwich-type magnetoresistive device as shown in FIG. 1A and the stacked-type magnetoresistive device as shown in FIG. 1B were fabricated on a substrate by a multi-target sputtering apparatus. The sandwich-type magnetoresistive device had the following structure:

A: the substrate/CoNiFe (15)/Cu (2.2)/CoPt (10) (parenthesized values indicate the thicknesses (nm)), and the stacked-type magnetoresistive device had the following structure:

A': the substrate/[CoNiFe (3)/Cu (2.2)/CoPt (5)/Cu (2.2)]$^5$. The respective film thicknesses were controlled by using a shutter, and CoPt of the hard magnetic film 1 was magnetized. Then, the MR characteristics of the obtained devices were measured at room temperature in the applied magnetic field of 100 Oe. The MR ratios for the devices having the structures A and A' were 4% and 6%, respectively. The widths of the magnetic field in which the MR was varied were 3 Oe and 5 Oe, respectively. From this figure, the following facts are found. As compared with the case where a magnetic film having different coercive forces is used as shown in FIG. 11, the device of the invention can operate in a very weak magnetic field and the linearity property is improved. As compared with the anti-ferromagnetic coupling type shown in FIG. 12, the operating magnetic field of the device of the invention is small. As compared with the spin valve using the anti-ferromagnetic film shown in FIG. 13, the device of the invention has an improved MR ratio.

(Example 2)

In the same way as that in Example 1, by using $Co_{0.75}Pt_{0.25}$ (the hard magnetic film 1), $Co_{0.7}Ni_{0.1}Fe_{0.2}$ (the soft magnetic film 3), and Cu (the non-magnetic metal film 2) as targets, the hard magnetic film 1, the non-magnetic metal film 2, the soft magnetic film 3, and the non-magnetic metal film 2 were sequentially deposited. Thus, a multilayer film having the following structure was fabricated:

B: the substrate/[NiCoFe (6)/Cu (2.2)/CoPt (5)/Cu (2.2)]$^{20}$. The material of CoPt of the hard magnetic film 1 was magnetized, and then the hard magnetic film 1 was made to have a columnar shape of 25 μm×25 μm by using a lithography technique. Thereafter, the MR characteristics of the device were measured by a 4-terminal method using lithography. The MR ratio was 18% in the applied magnetic field of 100 Oe, and the width of the magnetic field in which the MR was varied was 20 Oe.

(Example 3)

On a substrate including a ferrite (7-1) and an insulating film (7-2), the hard magnetic film 1, the non-magnetic metal film 2, and the soft magnetic film 3 were sequentially deposited by a multi-target sputtering apparatus by using $Co_{0.75}Pt_{0.25}$ (the hard magnetic film 1), Cu (the non-magnetic metal film 2), and $Ni_{0.68}Co_{0.2}Fe_{0.12}$ (the soft magnetic film 3) as targets. The material of CoPt of the hard magnetic film 1 was magnetized. An insulating film 6 and CoNbZr were deposited thereon by using $SiO_2$ (the insulating film 6) and $Co_{0.82}Nb_{0.12}Zr_{0.06}$ (the yoke 4) as targets. The deposited films were patterned by lithography, so as to produce the yoke portion 4. As a result, magnetoresistance effect type heads (MR heads) as shown in FIG. 3 having the following structures were fabricated:
C: the substrate/CoPt (15)/Cu (2.2)/NiCoFe (15)/$SiO_2$ (100)/CoNbZr (1000), and
C': the substrate/[CoPt (5)/Cu (2.2)/NiCoFe (4)/Cu (2.2) ]$^3$/$SiO_2$ (100)/CoNbZr (1000).
As a comparative example, an MR head having a conventional structure in which the conventional materials of $Ni_{0.8}Fe_{0.2}$ and $Co_{0.82}Nb_{0.12}Zr_{0.06}$ were respectively used for the magnetoresistance effect film and the yoke was fabricated. An alternating current signal magnetic field of 100 Oe was applied to both of the conventional MR head and the MR heads of the invention, so as to compare the reproduction outputs of the respective heads. It was found that the MR heads having the structures C and C' of the invention could attain the outputs which were respectively about 1.5 times and 3 times as large as those of the conventional MR head as the comparative example.

(Example 4)

Figure 14:
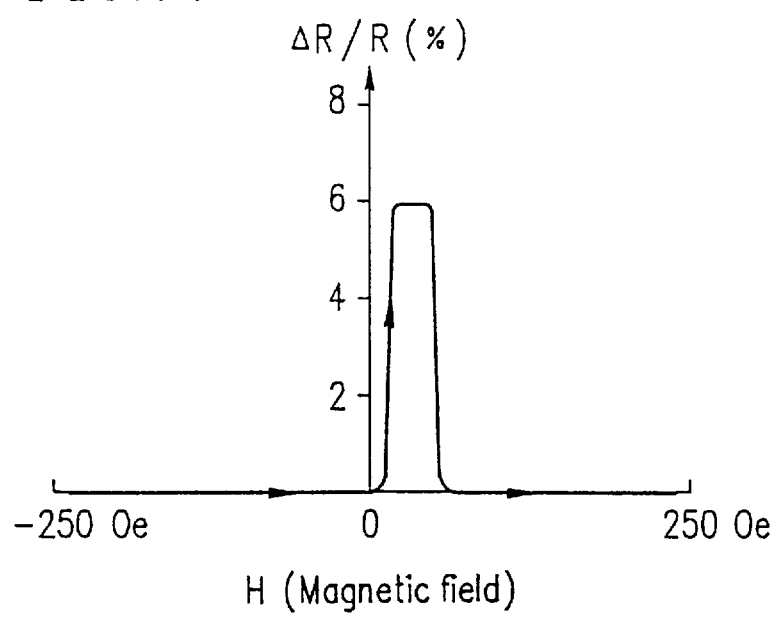
FIG. 14 is a graph showing an MR curve of a magnetoresistive changing portion of a memory device according to the invention.

By using $Co_{0.8}Pt_{0.2}$ (the magnetic film 1'), $Co_{0.7}Ni_{0.1}Fe_{0.2}$ (the soft magnetic film 3), and Cu (the non-magnetic metal film 2) as targets, the hard magnetic film 1', the non-magnetic metal film 2, and the soft magnetic film 3 were sequentially deposited. Thus, a magnetoresistive change portion of a sandwich type as shown in FIG. 1A having the following structure was fabricated:
D: [CoNiFe (10)/Cu (2.2)/CoPt (2)].
FIG. 14 shows the MR curve of the magnetoresistive change portion. On the magnetoresistive change portion, an $SiO_2$ insulating film was deposited. Then, AuCr for conductor lines was deposited thereon. As a result, a memory device as shown in FIG. 4 was fabricated.

Figure 6A:
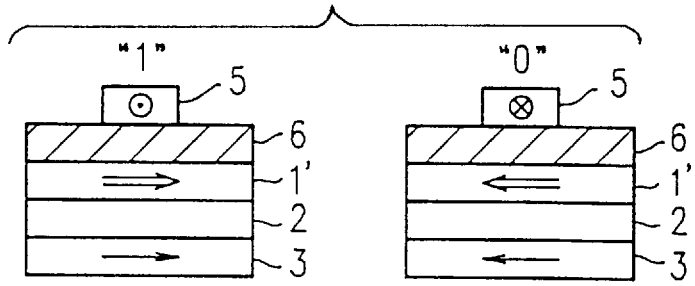
FIGS. 6A to 6D are diagrams for illustrating the operation of a memory device according to the invention.
Figure 6B:
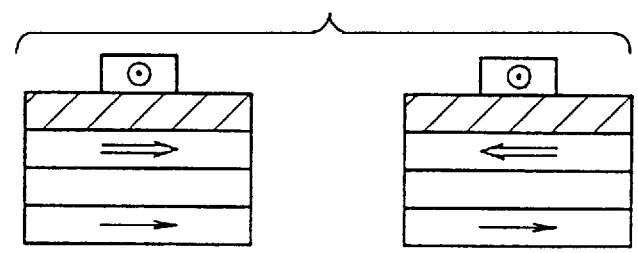
Figure 6C:
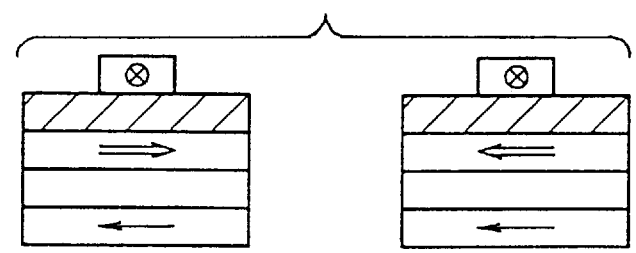
Figure 6D:
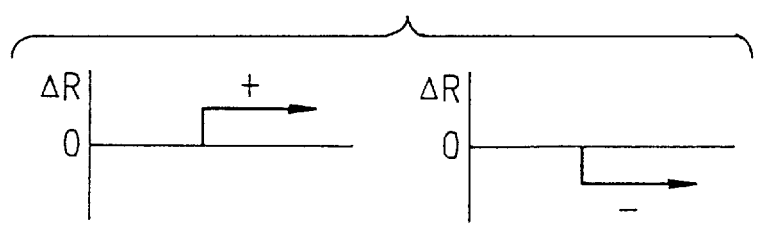

In order to check the operation of the memory device, a current was allowed to flow through the conductor line 5 as shown in FIG. 6A, so as to unidirectionally magnetize the magnetic film 1'. Then, as shown in FIG. 6B, a weak current was allowed to flow through the conductor line 5, so as to align the magnetization of the soft magnetic film 3 in one direction. Thereafter, as shown in FIG. 6C, the weak current flowing through the conductor line 5 was reversed, and the change of resistance in the magnetoresistive change portion was measured at this time. It was confirmed that the change of resistance was definitely changed to be plus (increase) or minus (decrease) depending on the magnetized direction recorded in the magnetic film 1', as shown in FIG. 6D.

(Example 5)

By using $Co_{0.78}Pt_{0.10}Cr_{0.12}$ (the hard magnetic film 1), $Ni_{0.8}Fe_{0.15}Co_{0.05}$ (the soft magnetic film 3), and Cu (the non-magnetic metal film 2) as targets, the hard magnetic film 1, the non-magnetic metal film 2, and the soft magnetic film 3 were sequentially deposited. Thus, a magnetoresistive change portion having the following structure was fabricated:
E: [CoPtCr (5)/Cu (2.3)/NiFeCo (10)].
Then, an $SiO_2$ insulating film was deposited on the thus fabricated portion. Then, AuCr for conductor lines was deposited, so as to obtain an amplifying device.

Figure 8C:
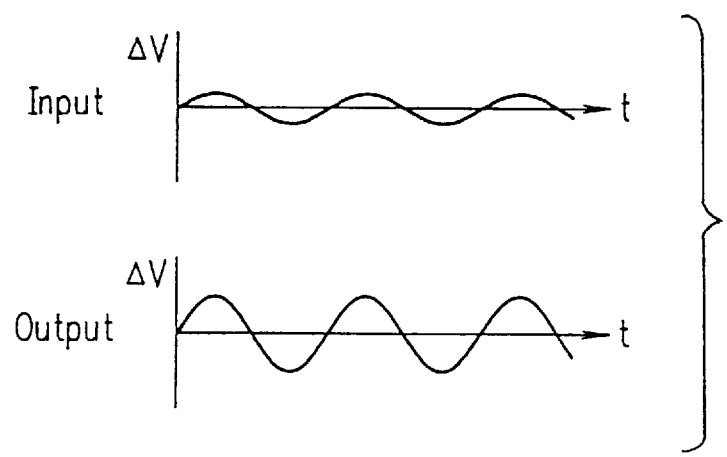

In order to check the amplifying device, as shown in FIG. 8A, a large current was allowed to flow through the conductor line 5, so as to magnetize the hard magnetic film 1 in one direction. Then, an input alternating voltage was applied to the conductor line 5 as shown in FIG. 8B, and a weak current was allowed to flow, so as to cause the magnetization rotation of the soft magnetic film 3. While a voltage was being applied to the magnetoresistive change portion, the change of output voltage due to the change of resistance in the magnetoresistive change portion was measured. It was confirmed that the input voltage was amplified, as shown in FIG. 8C.

(Example 6)

By using $Ni_{0.68}Co_{0.2}Fe_{0.12}$ (the soft magnetic film 3), Co (the magnetic film 3'), Cu (the non-magnetic metal film 2), and $Co_{0.75}Pt_{0.25}$ (the hard magnetic film 1) as targets (the composition ratios are all indicated by atomic %), a sandwich-type magnetoresistive device and a stacked-type magnetoresistive device were fabricated on a substrate by a multi-target sputtering apparatus. The sandwich-type magnetoresistive device had the following structure:
F: the substrate/NiCoFe (10)/Co (0.2)/Cu (2)/Co (0.2)/CoPt (3) (parenthesized values indicate the thicknesses (nm)), and the stacked-type magnetoresistive device had the following structure:
F': the substrate/[NiCoFe (3)/Co (0.2)/Cu (2)/Co (0.2)/CoPt (3)/Co (0.2)/Cu (2)]$^N$/NiCoFe (3),
where N indicates the stacked number of films and N is 5 in this example. The respective film thicknesses were controlled by using a shutter, and CoPt of the hard magnetic film 1 was magnetized. Then, the MR characteristics of the obtained devices were measured at room temperature in the applied magnetic field of 100 Oe. The MR ratios for the devices having the structures F and F' were 6% and 8%, respectively. The widths of the magnetic field in which the MR was varied were 3 Oe and 5 Oe, respectively. FIG. 10 shows an exemplary MR curve of the stacked-type device.

(Example 7)

By using $Ni_{0.68}Co_{0.2}Fe_{0.12}$ (the soft magnetic film 3), $Co_{0.7}Fe_{0.2}Ni_{0.1}$ (the magnetic film 3'), Cu (the non-magnetic metal film 2), and $Co_{0.75}Pt_{0.25}$ (the hard magnetic film 1) as targets (the composition ratios are all indicated by atomic %), the sandwich-type magnetoresistive device as shown in FIG. 2A and the stacked-type magnetoresistive device as shown in FIG. 2B were fabricated on a substrate by a multi-target sputtering apparatus. The sandwich-type magnetoresistive device had the following structure:
G: the substrate/NiCoFe (15)/Cu (2.3)/CoNiFe (0.5)/CoPt (10) (parenthesized values indicate the thicknesses (nm)), and
the stacked-type magnetoresistive device had the following structure:

G': the substrate/[NiCoFe (7)/Cu (2.2)/CoNiFe (0.5)/CoPt (4)/CoNiFe (0.5)/Cu (2.2)]$^N$,
where N indicates the stacked number of films and N is 5 in this example. The respective film thicknesses were controlled by using a shutter, and CoPt of the hard magnetic film 1 was magnetized. Then, the MR characteristics of the obtained devices were measured at room temperature in the applied magnetic field of 100 Oe. The MR ratios for the devices having the structures G and G' were 6% and 9%, respectively. The widths of the magnetic field in which the MR was varied were 3 Oe and 5 Oe, respectively. As a comparative example, devices in which $Co_{0.7}Fe_{0.2}Ni_{0.1}$ (the magnetic film 3') was not inserted at the interface were fabricated. The MR ratios of the comparative examples were 4% and 6% which were lower than those of the devices of the invention.

(Example 8)

On a substrate including a ferrite (7-1) and an insulating film (7-2), a magnetoresistive device portion having the following structure was fabricated by a multi-target sputtering apparatus by using $Co_{0.75}Pt_{0.25}$ (the hard magnetic film 1), Cu (the non-magnetic metal film 2), $Ni_{0.68}Co_{0.2}Fe_{0.12}$ (the soft magnetic film 3), and Co (the magnetic film 3') as targets:
H: [NiCoFe (7)/Cu (2.1)/Co (0.4)/CoPt (4)/Co (0.4)/Cu (2.1)]$^5$.
The material of CoPt of the hard magnetic film 1 was magnetized. An insulating film 6 and CoNbZr were deposited thereon by using $SiO_2$ (the insulating film 6) and $Co_{0.82}Nb_{0.12}Zr_{0.06}$ as targets. The deposited films were patterned by lithography, so as to produce the yoke portion 4. As a result, a magnetoresistance effect type head (an MR head) as shown in FIG. 3 having the following structure was fabricated:
I: the substrate/[NiCoFe (7)/Cu (2.1)/Co (0.4)/CoPt (4)/Co (0.4)/Cu (2.1)]$^5$/$SiO_2$ (100)/CoNbZr (1000).
As a comparative example, an MR head having a conventional structure in which the conventional materials of $Ni_{0.8}Fe_{0.2}$ and $Co_{0.82}Nb_{0.12}Zr_{0.06}$ were respectively used for the magnetoresistance effect film and the yoke was fabricated. An alternating current signal magnetic field of 100 Oe was applied to both the conventional MR head and the MR head of the invention, so as to compare the reproduction outputs of the respective heads. It was found that the MR head having the structure I of the invention could attain an output which was about 4 times as large as that of the conventional MR head as the comparative example.

(Example 9)

By using $Co_{0.8}Pt_{0.2}$ (the magnetic film 1'), $Co_{0.6}Ni_{0.2}Fe_{0.2}$ (the soft magnetic film 3, the magnetic film 3'), and Cu (the non-magnetic metal film 2) as targets, the magnetic film 1', the non-magnetic metal film 2, and the soft magnetic film 3 were sequentially deposited. Thus, a magnetoresistive change portion of a sandwich type as shown in FIG. 2A having the following structure was fabricated:
J: (CoNiFe (10)/Cu (2)/CoNiFe (0.7)/CoPt (2)].
On the magnetoresistive change portion, an $SiO_2$ insulating film was deposited. Then, AuCr for conductor lines was deposited thereon. As a result, a memory device was fabricated.

In order to check the operation of the memory device, a large current was allowed to flow through the conductor line 5 as shown in FIG. 6A, so as to unidirectionally magnetize the magnetic film 1'. Then, as shown in FIG. 6B, a weak current was allowed to flow through the conductor line 5, so as to align the magnetization of the soft magnetic film 3 in one direction. Thereafter, as shown in FIG. 6C, the weak current flowing through the conductor line 5 was reversed, and the change of resistance in the magnetoresistive change portion was measured at this time. It was confirmed that the change of resistance was definitely changed to be plus (increase) or minus (decrease) depending on the magnetized direction recorded in the magnetic film 1', as shown in FIG. 6D. In addition, it was found that the output was 1.5 time or more as large as that of a conventional memory device using NiFe. In this example, the reference numeral 1' in FIGS. 6A to 6C denotes a film including the magnetic film 1' and the magnetic film 3'.

Next, the magnetoresistive change portion was fabricated so as to have the following stacked structure:
J'=[CoNiFe (6)/Cu (2)/CoNiFe (0.6)/CoPt (2)/CoNiFe (0.6)/Cu (2)]$^5$.
A memory device was fabricated by using the magnetoresistive change portion having the stacked structure. In the same way as described above, the operation of the memory device was checked. It was confirmed that, during the information read-out, the output voltage of the memory device having the structure J' was about twice as high as that of the memory device having the structure J.

(Example 10)

By using $Co_{0.8}Pt_{0.2}$, $Co_{0.86}Cr_{0.12}Ta_{0.02}$, $Fe_{0.5}Ni_{0.5}$ (the magnetic films 1, 1', and 1''), Cu (the non-magnetic metal film 2), and $Ni_{0.68}Co_{0.2}Fe_{0.12}$ (the soft magnetic film 3) as targets, a magnetoresistive change portion having the following stacked structure was fabricated:
K: [CoPt (3)/Cu (2.2)/NiCoFe (4)/Cu (2.2)/CoCrTa (3)/Cu (2.2)/NiCoFe (4)/Cu (2.2)/NiFe (3)/Cu (2.2)/NiFeCo (4)].
An $SiO_2$ insulating film was deposited thereon. Thereafter, AuCr for conductor lines was deposited, so as to fabricate a memory device as shown in FIG. 5.

In order to check the operation of the memory device, the following two types of memory devices were provided. One type of memory device was provided in such a manner that a current was allowed to flow through the conductor line 5 as shown in FIG. 7A, and the magnetization of the three kinds of magnetic films 1, 1', and 1''(NiFe) and the magnetization of the soft magnetic film 3 was inverted, so as to record information. The other type of memory device was provided in such a manner that a magnetic field which is smaller than the coercive force of the magnetic films 1 and 1' (CoPt, CoCrTa) but larger than the coercive force of the magnetic film 1'' was produced, and hence the magnetization of the magnetic film 1'' and the magnetization of the soft magnetic film 3 (NiCoFe) was inverted, so as to record information. Next, as shown in FIG. 7B, a weak current pulse was allowed to flow through the conductor line 5, so that only the magnetization of the soft magnetic film 3 was inverted, and the change of resistance of the magnetoresistive change portion at this time was measured. As shown in FIG. 7C, it was confirmed that the magnitudes of the change of resistance were different depending on the number of the magnetic films (1, 1', 1'') in which the magnetization had been inverted during the recording of the information. This means that multivalue information can be stored in such a memory device.

In the following Examples 11 to 17, other embodiments of magnetoresistance effect devices, magnetoresistance effect type head, and memory device of the present invention will be described. Although an example of the amplifying device will not be described, the amplifying device of the invention may be constructed in the same manner as the memory device, as described in the above-mentioned examples.

Figure 16A:
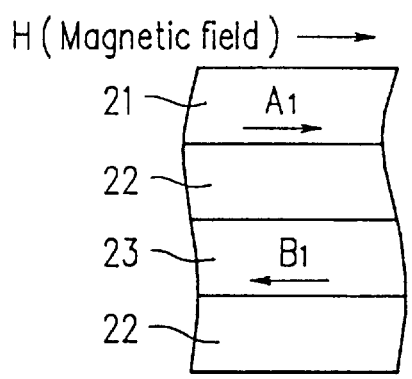
FIGS. 16A and 16B are partial cross-sectional views showing the configurations and the spin alignment directions in the respective magnetic films of a magnetoresistance effect device according to the present invention.
Figure 16B:
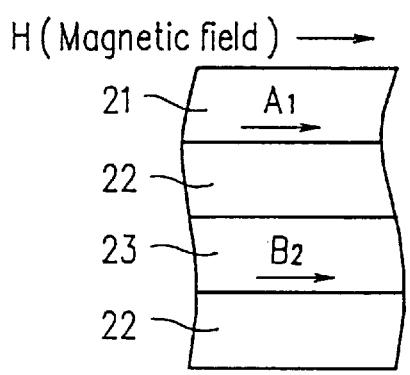

As shown in FIGS. 16A and 16B, in this magnetoresistance effect device, a soft magnetic film 21 with a thickness of 1 to 20 nm, a hard magnetic film 23 with a thickness of 1 to 20 nm, having respectively different coercive forces, are alternately stacked, and non-magnetic metal films 22 with a thickness of 1 to 10 nm are interposed between the soft magnetic films 21 and the hard magnetic film 23 to be alternately stacked. In this case, the main component of the soft magnetic film 21 is expressed by the following formula:

$$(Ni_XCo_{1-X})_{X'}Fe_{1-X'} \tag{3}$$

In the above formula, X and X' are expressed by atomic composition ratios as follows:

$$0.6 \leq X \leq 1.0 \quad 0.7 \leq X' \leq 1.0 \tag{4}$$

The hard magnetic film 23 is composed of a CoFe based material having a relatively large resistance variation ratio ΔR/R, and the main component thereof is expressed by the following formula:

$$Co_YFe_{1-Y} \tag{5}$$

where Y is expressed by an atomic composition ratio:

$$0.3 \leq Y \leq 0.7 \tag{6}$$

Also, the CoFe based material to which V is added has a very satisfactory square ratio of 0.9 or more, and the component thereof is expressed by the following formula:

$$(Co_ZFe_{1-Z})_{Z'}V_{1-Z'} \tag{7}$$

where Z and Z' are expressed by the atomic composition ratios as follows:

$$0.3 \leq Z \leq 0.7 \quad 0.9 \leq Z' \leq 0.98 \tag{8}$$

Figure 17:
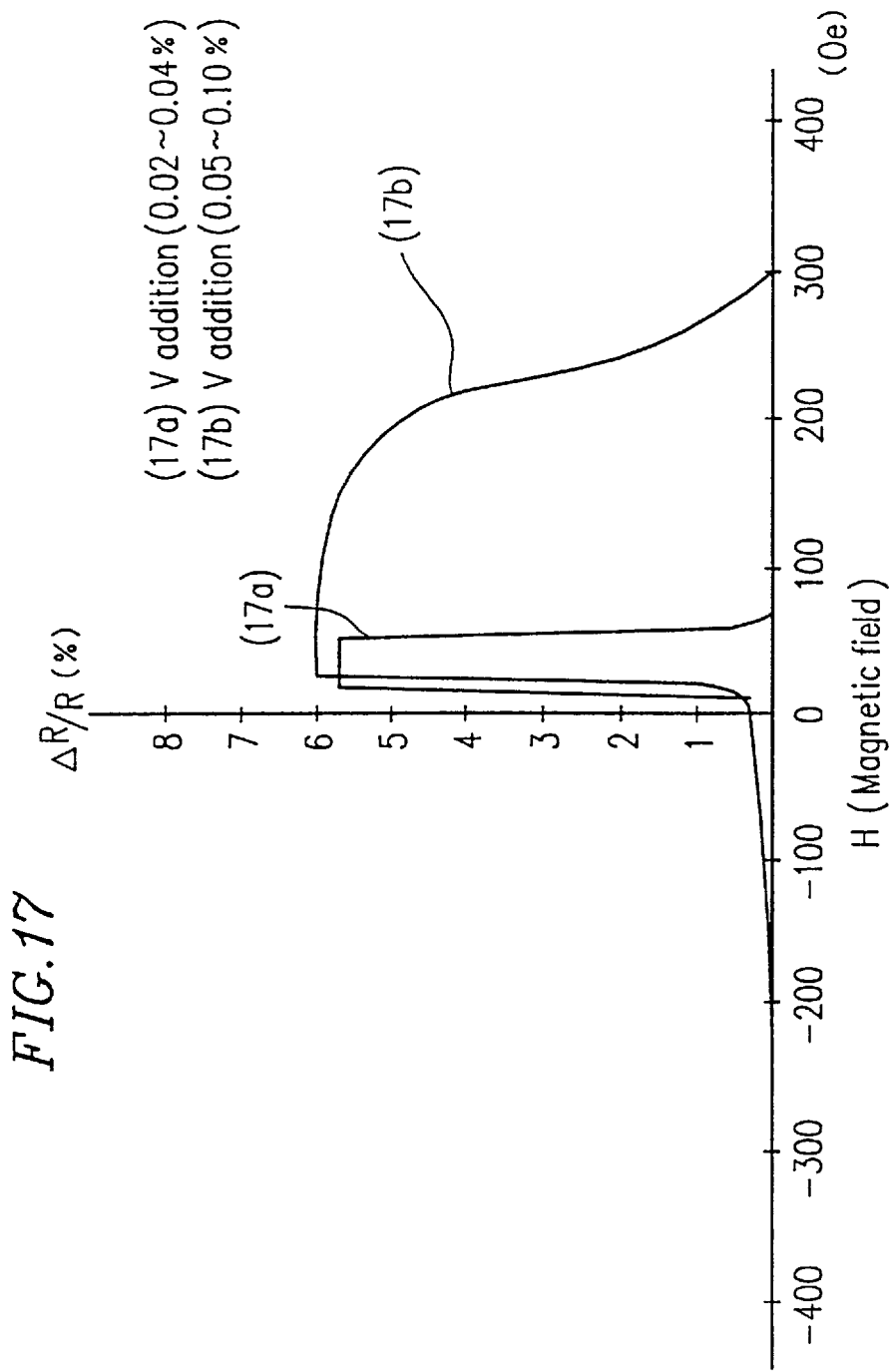
FIG. 17 is a graph showing an MR curve indicating the variation of the saturation magnetic field Hs in accordance with the addition of V in a magnetoresistance effect device according to the present invention.

In particular, if adding V when $0.9 \leq Z' \leq 0.98$, as shown in FIG. 17, the saturation magnetic field strength Hs of the MR curve is reduced in the case where the amount to be added is small, i.e., in the range of 0.02 to 0.04%, so that the characteristics, optimized for using this device as a memory device, may be obtained. On the other hand, in the case where the added amount is large, i.e., in the range of 0.05 to 0.1%, the saturation magnetic field strength Hs of the MR curve is increased, so that the characteristics optimal for a magnetoresistance effect device and a magnetoresistance effect type head are exhibited.

The non-magnetic metal film 22 is preferably composed of a material showing little reaction with a Ni—Co—Fe based magnetic material in the interface therebetween, and therefore any of Cu, Ag and Au is suitably used.

In the case where such a material is used for a magnetoresistance effect device and a magnetoresistance effect type head, the soft magnetic film 21 is composed of a hard magnetic material exhibiting a small magnetostriction, a small coercive force, and a satisfactory square feature, while the hard magnetic film is composed of a semi-hard or a hard magnetic material exhibiting a relatively large coercive force and a satisfactory square feature.

Also, the soft magnetic film 21 is not necessarily a ternary film such as that described above, but may be a binary magnetic film having soft magnetism and A relatively large resistance variation ratio ΔR/R, e.g., a Ni—Fe based or Ni—Co based binary magnetic film.

For example, the main component of the soft magnetic film 21 is expressed by the following formula.

$$Ni_XFe_{1-X} \tag{9}$$

where X is expressed by an atomic composition ratio as follows:

$$0.7 \leq X0.9 \tag{10}$$

Alternatively, the main component of the soft magnetic film 21 is expressed by the following formula.

$$Ni_XCo_{1-X} \tag{11}$$

where X is expressed by an atomic composition ratio as follows:

$$0.6 \leq X \leq 0.9 \tag{12}$$

Figure 18:
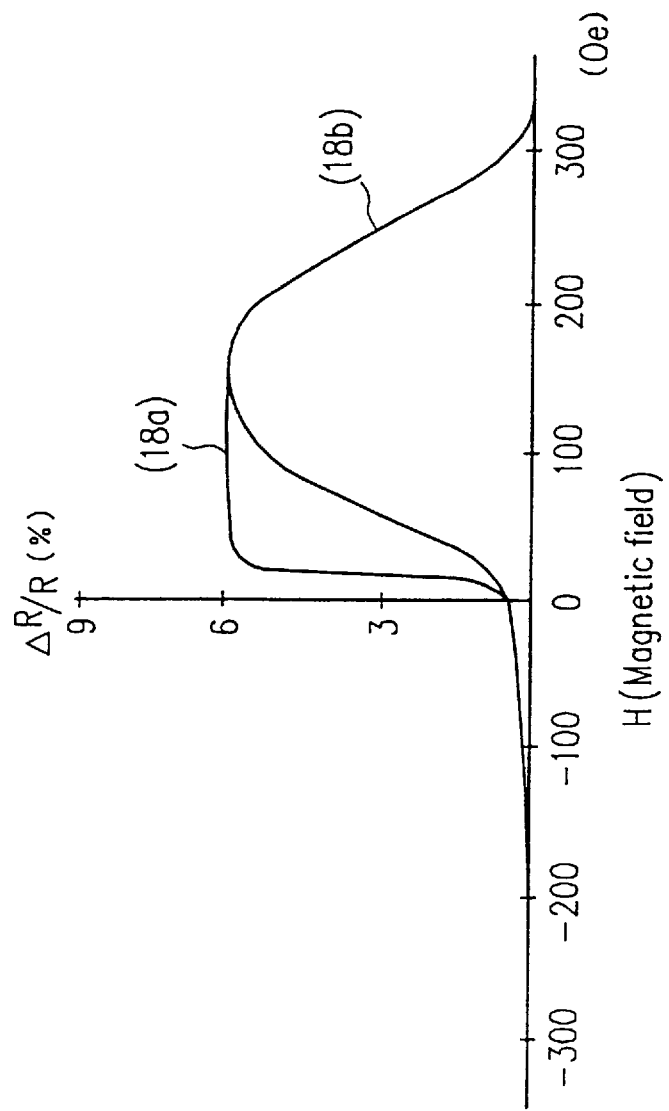
FIG. 18 is a graph showing the variation of an MR curve in accordance with the thickness of the magnetic films 21 and 23 in a magnetoresistance effect device according to the present invention.

In the case where the soft magnetic films 21 and the hard magnetic films 23 are alternately stacked with non-magnetic metal films 22 interposed therebetween, if the thickness of the soft magnetic film 21 is set to be larger than that of the hard magnetic film 23, then a large resistance variation ratio may be obtained in very small magnetic fields, as shown in FIG. 18.

Since the soft magnetic film 21 and the hard magnetic film 23 have different coercive forces and the two kinds of films 21 and 23 are separated from each other with the non-magnetic metal film 22 interposed therebetween, an application of a weak magnetic field H causes the rotation of spins in the soft magnetic film 21 with soft magnetism in a direction indicated by the arrow $A_1$ shown in FIGS. 16A and 16B. On the other hand, the spins in the hard magnetic film 23 with hard or semi-hard magnetism have not been reversed yet as indicated by the arrow $B_1$. Therefore, in such a case, the spin alignment direction in the soft magnetic film 21 becomes opposite to the spin alignment direction in the hard magnetic film 23 and the spin scattering of the conductive electrons in the two films becomes maximum, so that electrical resistance values become large.

If further applying stronger magnetic field, as shown in FIG. 16B, the spins in the hard magnetic film 23 are also reversed as indicated by the arrow $B_2$. As a result, the spin alignment direction in the soft magnetic film 21 becomes parallel to the spin alignment direction in the hard magnetic film 23; the spin scattering of the conductive electrons becomes small; and the electrical resistance values are reduced.

Figure 19:
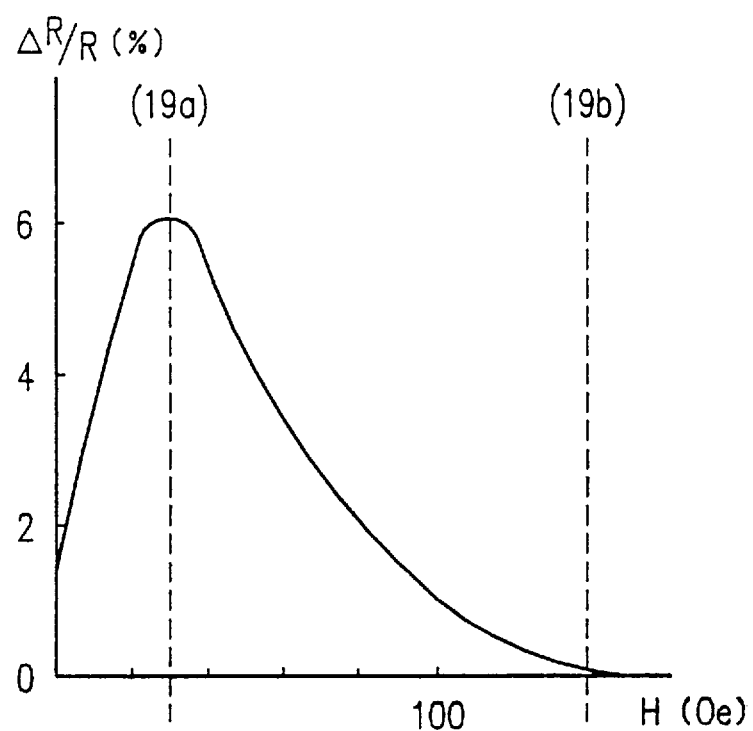
FIG. 19 is a graph showing the relationship between the magnetic field H and the resistance variation ratio αR/R in a magnetoresistance effect device according to the present invention.

FIG. 19 shows the values of the resistance variation ratio ΔR/R in the above-described magnetoresistance effect device in association with the variation of the applied magnetic field H. In FIG. 19, the position 19a corresponds to the state shown in FIG. 16A; while the position 19b corresponds to the state shown in FIG. 16B. The resistance variation ratio ΔR/R shown in FIG. 19 is calculated by the following equation:

$$\Delta R/R = \{(R_P - R_{min})/R_{min}\} \times 100[\%] \tag{13}$$

where $R_P$ is a value of the electrical resistance corresponding to the strength of each magnetic filed H; and $R_{min}$ is a minimal value of the electrical resistance. FIG. 19 is a graph showing the relationship between the strength of the magnetic field H and the resistance variation ratio ΔR/R thus obtained.

In this way, a large resistance variation ratio ΔR/R is obtained in a region where the strength of the magnetic field H is relatively small. However, if the non-magnetic metal film 22 is not provided, the soft magnetic film 21 is unintentionally coupled magnetically with the hard magnetic film 23, so that the state such as shown in FIG. 16A can not be realized. Therefore, in such a case, a large magnetoresistance effect can not be obtained.

It is preferable for the soft magnetic film 21 to have a small magnetostriction. This is because a noise is likely to occur if a magnetic film having a large magnetostriction is employed for an MR head.

If the composition ratio of a Ni-rich Ni—Co—Fe based alloy expressed by the above-described formula (3) satisfies the expression (4), then the magnetostriction of such an alloy becomes small, so that the alloy exhibits soft magnetism. A typical composition ratio of such an alloy is $Ni_{0.8}Co_{0.1}Fe_{0.1}$, $Ni_{0.8}Fe_{0.2}$ or the like. Also, in order to improve the soft magnetism, the wear resistance and the corrosion resistance, Nb, Mo, Cr, W, Ru and the like may be added to the composition represented by the expression (4).

The CoFe based alloy expressed by the formula (5) exhibits a satisfactory square feature and semi-hard or hard magnetism when the CoFe alloy satisfies the expression (6). The CoFe based alloy expressed by the formula (7) to which V is added so as to satisfy the expression (8) may arbitrarily vary the coercive force thereof depending on the added amount of V and may improve the square feature thereof.

By selecting the composition ratios in the above-mentioned manner, the magnetic films 21 and the hard magnetic film 23 having respectively different coercive forces may be obtained. When the thickness of the soft magnetic film 21 and the hard magnetic film 23 is smaller than 1 nm, the decrease in the strength of the magnetic field owing to the reduction of Curie temperature and the like are disadvantageously caused at room temperature.

Since a magnetoresistance effect device is used with an entire film thickness set at several tens of nm in practical use, the thickness of the respective magnetic films 21 and 23 is required to be set at smaller than 20 nm in order to utilize the effects of the stacking structure to be obtained according to the present invention. Moreover, in the case where the film thickness of the soft magnetic film 21 exhibiting soft magnetic characteristics is set to be larger than that of the hard magnetic film 23 exhibiting semi-hard magnetic characteristics or hard magnetic characteristics, the soft magnetic characteristics are improved and the rising of the characteristics in a very weak magnetic field becomes abrupt. However, such an effect is invariable when the film thickness is larger than 20 nm. Accordingly, the thickness of these magnetic films 21 and 23 is preferably set in the range of 1 to 20 nm.

The non-magnetic metal film 22 interposed between these magnetic films 21 and 23 is required to be less reactive with a Ni—Fe—Co based magnetic film in the interface therebetween, and is also required to be non-magnetic. Therefore, Cu, Ag, Au and the like are suitable as a material for the non-magnetic metal film 22. If the thickness of this non-magnetic metal film 22 is smaller than 1 nm, then it becomes difficult to realize the state as shown in FIG. 16A, where the soft magnetic film 21 and the hard magnetic film 23 are magnetically coupled, and the spin alignment directions in the soft magnetic film 21 and the hard magnetic film 23 having respectively different coercive forces become antiparallel to each other.

On the other hand, if the thickness of the non-magnetic metal film 22 exceeds 10 nm, then the electric resistance in the portion of the non-magnetic metal film 22 where no magnetoresistance effect is exhibited adversely reduces the variation of the resistance of the entire magnetoresistance effect device. Consequently, the thickness of the non-magnetic metal film 22 is preferably set in the range of 1 to 10 nm.

(Example 11)

Magnetoresistive devices having the following configurations (Samples Nos. A2, B2, and C2) are formed on a glass substrate by using a sputterer.

A2: (Co—Fe(3)/Cu(2)/Ni—Fe(14)/Cu(2)]
B2: [Co—Fe(3)/Au(2)/Ni—Co(14)/Au(2)]
C2: [Co—Fe(3)/Ag(2)/Ni—Co—Fe(14)/Ag(2)]

The composition ratios of Ni—Fe, Ni—Co, Ni—Co—Fe and Co—Fe are set to be $Ni_{0.8}Fe_{0.2}$, $Ni_{0.8}Co_{0.2}$, $Ni_{0.8}Co_{0.1}Fe_{0.1}$ and $Co_{0.5}Fe_{0.5}$, respectively. The film thickness is controlled by power and shutter speed.

In the same way, by using $Co_{0.5}Fe_{0.5}$ and $Ni_{0.7}Co_{0.2}Fe_{0.1}$ as targets, magnetoresistive devices having the following configurations (Samples Nos. D2, E2, and F2) are formed on a glass substrate.

D2: [Co—Fe(3)/Cu(2)/Ni—Co—Fe(14)/Cu(2)]
E2: [Co—Fe(3)/Ag(2)/Ni—Co—Fe(14)/Ag(2)]
F2: [Co—Fe(3)/Au(2)/Ni—Co—Fe(14)/Au(2)]

Various characteristics of the obtained samples Nos. A2 to F2 of the magnetoresistive devices, i.e., the resistance variation ratio $\Delta R/R$ at room temperature and the switching field Ht in the rising portion, are shown in Table 1. The magnetization is measured by a vibration type magnetometer. The varying value of the electrical resistance is measured by a four-terminal method using the samples shown in Table 1, while applying an external magnetic field in a direction vertical to the direction of the flowing current so as to vary the magnetic field.

TABLE 1

| Sample No. | Resistance Variation Ratio $\Delta R/R$ (%) | switching field Ht (Oe) |
|---|---|---|
| A2 | 6 | 14 |
| B2 | 4 | 9 |
| C2 | 5 | 15 |
| D2 | 7 | 8 |
| E2 | 3 | 15 |
| F2 | 4 | 7 |

The film is sputtered in the magnetic field so that the easy axis of the magnetic film exhibiting soft magnetism crosses the easy axis of the magnetic film exhibiting semi-hard magnetism at a right angle. The magnetoresistance effect of the film is measured by applying a magnetic field in a direction of the magnetization hard axis of the magnetic film exhibiting soft magnetism. The switching field Ht of the film shown in Table 1 are the values in the direction of the magnetization hard axis.

As is apparent from Table 1, the magnetoresistance effect device of this example exhibits practical characteristics, that is to say, the device shows a large resistance variation ratio $\Delta R/R$ at room temperature and a relatively small switching field Ht in the rising portion.

(Example 12)

In the same way as in Example 11, magnetoresistive devices having the following configurations (Samples Nos. A3, B3, and C3) are formed on a glass substrate by using a sputterer.

A3: [Co—Fe—V(3)/Cu(2)/Ni—Fe(14)/Cu(2)]
B3: [Co—Fe—V(3)/Cu(2)/Ni—Co(14)/Cu(2)]
C3: [Co—Fe—V(3)/Cu(2)/Ni—Co—Fe(14)/Cu(2)]

The composition ratios of Ni—Fe, Ni—Co, Ni—Co—Fe and Co—Fe—V are set to be $Ni_{0.8}Fe_{0.2}$, $Ni_{0.8}Co_{0.2}$, $Ni_{0.8}Co_{0.1}Fe_{0.1}$ and $Co_{0.5}Fe_{0.46}V_{0.04}$, respectively. The film thickness is controlled by power and shutter speed.

In the same way, by using $Co_{0.49}Fe_{0.46}V_{0.05}$ and $Ni_{0.7}Co_{0.2}Fe_{0.1}$ as targets, magnetoresistive devices having the following configurations (Samples Nos. D3, E3, and F3) are formed on a glass substrate.

D3: [Co—Fe—V(3)/Cu(2)/Ni—Co—Fe(14)/Cu(2)]
E3: [Co—Fe—V(3)/Ag(2)/Ni—Co—Fe(14)/Ag(2)]
F3: [Co—Fe—V(3)/Au(2)/Ni—Co—Fe(14)/Au(2)]

Various characteristics of the obtained samples Nos. A3 to F3 of the magnetoresistive devices, i.e., the resistance variation ratio ΔR/R at room temperature and the switching field Ht in the rising portion, are shown in Table 2. The magnetization is measured by a vibration type magnetometer. The varying value of the electrical resistance is measured by a four-terminal method using the samples shown in Table 2, while applying an external magnetic field in a direction vertical to the direction of the flowing current so as to vary the magnetic field.

TABLE 2

| Sample No. | Resistance Variation Ratio ΔR/R (%) | switching field Ht (Oe) |
|---|---|---|
| A3 | 7 | 10 |
| B3 | 5 | 8 |
| C3 | 4 | 11 |
| D3 | 8 | 6 |
| E3 | 5 | 12 |
| F3 | 4 | 7 |

The film is sputtered in the magnetic field so that the easy axis of the magnetic film exhibiting soft magnetism crosses the easy axis of the magnetic film exhibiting semi-hard magnetism at a right angle. The magnetoresistance effect of the film is measured by applying a magnetic field in a direction of the magnetization hard axis of the magnetic film exhibiting soft magnetism. The switching field Ht of the film shown in Table 2 are the values in the direction of the magnetization hard axis.

As is apparent from Table 2, the magnetoresistance effect device of this example exhibits practical characteristics, that is to say, the device shows a large resistance variation ratio ΔR/R at room temperature and a relatively small switching field Ht in the rising portion.

(Example 13)

In the same way as in Examples 11 to 12, magnetoresistive devices having the following configurations (Samples Nos. A4, B4, and C4) are formed on a glass substrate by using a sputterer.

A4: [Co—Fe—V(3)/Cu(2)/Ni—Fe(14)/Cu(2)]
B4: [Co—Fe—V(3)/Cu(2)/Ni—Co(14)/Cu(2)]
C4: [Co—Fe—V(3)/Cu(2)/Ni—Co—Fe(14)/Cu(2)]

The composition ratios of Ni—Fe, Ni—Co, Ni—Co—Fe and Co—Fe—V are set to be $Ni_{0.8}Fe_{0.2}$, $Ni_{0.8}Co_{0.2}$, $Ni_{0.8}Co_{0.1}Fe_{0.1}$ and $Co_{0.52}Fe_{0.39}V_{0.09}$, respectively. The film thickness is controlled by power and shutter speed.

In the same way, by using $Co_{0.52}Fe_{0.31}V_{0.07}$ and $Ni_{0.7}Co_{0.2}Fe_{0.1}$ as targets, magnetoresistive devices having the following configurations (Samples Nos. D4, E4, and F4) are formed on a glass substrate.

D4: [Co—Fe—V(3)/Au(2)/Ni—Co—Fe(14)/Au(2)]
E4: [Co—Fe—V(3)/Ag(2)/Ni—Co—Fe(14)/Ag(2)]
F4: [Co—Fe—V(3)/Cu(2)/Ni—Co—Fe(14)/Cu(2)]

Various characteristics of the obtained samples Nos. A4 to F4 of the magnetoresistive devices, i.e., the resistance variation ratio ΔR/R at room temperature, the switching field Ht in the rising portion and the saturation magnetic field Hs of the devices, are shown in Table 3. The magnetization is measured by a vibration type magnetometer. The varying value of the electrical resistance is measured by a four-terminal method using the samples shown in Table 3, while applying an external magnetic field in a direction vertical to the direction of the flowing current so as to vary the magnetic field.

TABLE 3

| Sample No. | Resistance Variation Ratio ΔR/R(%) | switching field Ht(Oe) | Saturation Magnetic Field Hs (Oe) |
|---|---|---|---|
| A4 | 5 | 11 | 450 |
| B4 | 6 | 7 | 300 |
| C4 | 4 | 12 | 330 |
| D4 | 4 | 5 | 400 |
| E4 | 6 | 15 | 420 |
| F4 | 7 | 7 | 360 |

The film is sputtered in the magnetic field so that the easy axis of the magnetic film exhibiting soft magnetism crosses the easy axis of the magnetic film exhibiting semi-hard magnetism at a right angle. The magnetoresistance effect of the film is measured by applying a magnetic field in a direction of the magnetization hard axis of the magnetic film exhibiting soft magnetism. The switching field Ht of the film shown in Table 3 are the values in the direction of the magnetization hard axis, while the saturation magnetic fields Hs are the values in the direction of the magnetization easy axis.

As is apparent from Table 3, the magnetoresistance effect device of this example exhibits practical characteristics usable for a magnetoresistance effect device and a magnetoresistance effect type head, that is to say, the device shows a large resistance variation ratio ΔR/R at room temperature, a relatively small switching field Ht in the rising portion, and a large saturation magnetic field Hs.

(Example 14)

In the same way as in Examples 11 to 13, magnetoresistive devices having the following configurations (Samples Nos. A5, B5, and C5) are formed on a glass substrate by using a sputterer.

A5: [Ni—Fe(3)/Cu(2)/Ni—Co—Fe(14)/Cu(2)]
B5: [Co—Fe(3)/Cu(2)/Ni—Co—Fe(14)/Cu(2)]
C5: [Co—Fe—V(3)/Cu(2)/Ni—Co—Fe(14)/Cu(2)]

The composition ratios of Ni—Fe, Co—Fe, Ni—Co—Fe and Co—Fe—V are set to be $Ni_{0.5}Fe_{0.5}$, $Co_{0.5}Fe_{0.5}$, $Ni_{0.8}Co_{0.1}Fe_{0.1}$, and $Co_{0.49}Fe_{0.49}V_{0.02}$, respectively. The film thickness is controlled by power and shutter speed.

In the same way, by using $Co_{0.5}Fe_{0.5}$ and $Ni_{0.7}Co_{0.2}Fe_{0.1}$ as targets, magnetoresistive devices having the following configurations (Samples Nos. D5, E5, and F5) are formed on a glass substrate.

D5: [Co—Fe(3)/Au(2)/Ni—Co—Fe(14)/Au(2)]
E5: [Co—Fe(3)/Ag(2)/Ni—Co—Fe(14)/Ag(2)]
F5: [Co—Fe(3)/Cu(2)/Ni—Co—Fe(14)/Cu(2)]

Various characteristics of the obtained samples Nos. A5 to F5 of the magnetoresistive devices, i.e., the resistance variation ratio ΔR/R at room temperature and the switching field Ht in the rising portion, are shown in Table 4. The magnetization is measured by a vibration type magnetometer. The varying value of the electrical resistance is measured by a four-terminal method using the samples shown in Table 4, while applying an external magnetic field in a direction vertical to the direction of the flowing current so as to vary the magnetic field.

TABLE 4

| Sample No. | Resistance Variation Ratio ΔR/R (%) | switching field Ht (Oe) |
|---|---|---|
| A5 | 3 | 3 |
| B5 | 6 | 4 |
| C5 | 5 | 3 |
| D5 | 5 | 3 |
| E5 | 6 | 5 |
| F5 | 6 | 5 |

The film is sputtered in the magnetic field so that the easy axis of the magnetic film exhibiting soft magnetism crosses the easy axis of the magnetic film exhibiting semi-hard magnetism at a right angle. The magnetoresistance effect of the film is measured by applying a magnetic field in a direction of the magnetization hard axis of the magnetic film exhibiting soft magnetism. The switching field Ht of the film shown in Table 4 are the values in the direction of the magnetization hard axis.

As is apparent from the results shown. Table 4, the magnetoresistance effect device of this example exhibits practical characteristics useful for a high-sensitivity magnetoresistance effect device, a magnetoresistance effect type head and memory device, that is to say, the device shows more abrupt characteristics and a smaller switching field Ht in the rising portion by setting the thickness of the soft magnetic film thicker than that of the semi-hard magnetic film.

(Example 15)

In the same way as in Examples 11 to 14, magnetoresistive devices having the following configurations (Samples Nos. A6, B6, and C6) are formed on a glass substrate by using a sputterer.

A6: [Co—Fe—V(3)/Cu(2)/Ni—Fe(14)/Cu(2)]

B6: [Co—Fe—V(3)/Cu(2)/Ni—Co(14)/Cu(2)]

C6: [Co—Fe—V(3)/Cu(2)/Ni—Co—Fe(14)/Cu(2)]

The composition ratios of Ni—Fe, Ni—Co, Ni—Co—Fe and Co—Fe—V are set to be $Ni_{0.8}Fe_{0.2}$, $Ni_{0.8}Co_{0.2}$, $Ni_{0.8}Co_{0.1}Fe_{0.1}$ and $Co_{0.49}Fe_{0.49}V_{0.02}$, respectively. The film thickness is controlled by power and shutter speed.

In the same way, by using $Co_{0.48}Fe_{0.49}V_{0.03}$ and $Ni_{0.7}Co_{0.2}Fe_{0.1}$ as targets, magnetoresistive devices having the following configurations (Samples Nos. D6, E6, and F6) are formed on a glass substrate.

D6: [Co—Fe—V(3)/Au(2)/Ni—Co—Fe(14)/Au(2)]

E6: [Co—Fe—V(3)/Ag(2)/Ni—Co—Fe(14)/Ag(2)]

F6: [Co—Fe—V(3)/Cu(2)/Ni—Co—Fe(14)/Cu(2)]

Various characteristics of the obtained samples Nos. A6 to F6 of the magnetoresistive devices, i.e., the resistance variation ratio ΔR/R at room temperature, the switching field Ht in the rising portion and the saturation magnetic field Hs of the devices, are shown in Table 5. The magnetization is measured by a vibration type magnetometer. The varying value of the electrical resistance is measured by a four-terminal method using the samples shown in Table 5, while applying an external magnetic field in a direction vertical to the direction of the flowing current so as to vary the magnetic field.

TABLE 5

| Sample No. | Resistance Variation Ratio ΔR/R(%) | switching field Ht (Oe) | Saturation Magnetic Field Hs (Oe) |
|---|---|---|---|
| A6 | 4 | 5 | 50 |
| B6 | 5 | 7 | 60 |
| C6 | 4 | 9 | 45 |
| D6 | 5 | 5 | 70 |
| E6 | 6 | 10 | 40 |
| F6 | 6 | 6 | 40 |

The film is sputtered in the magnetic field so that the easy axis of the magnetic film exhibiting soft magnetism crosses the easy axis of the magnetic film exhibiting semi-hard magnetism at a right angle. The magnetoresistance effect of the film is measured by applying a magnetic field in a direction of the magnetization hard axis of the magnetic film exhibiting soft magnetism. The switching field Ht of the film shown in Table 5 are the values in the direction of the magnetization hard axis, while the saturation magnetic fields Hs are the values in the direction of the magnetization easy axis.

As is apparent from Table 5, the magneto-resistance effect device of this example exhibits practical characteristics useful for a memory device, that is to say, the device shows a large resistance variation ratio ΔR/R at room temperature, a relatively small switching field Ht in the rising portion, and a small saturation magnetic field Hs.

(Example 16)

In this example, an MR head is produced using the magnetoresistive devices. The following magnetoresistance effect films are used for forming the head.

A7: [Ni—Fe(3)/Cu(2)/Ni—Co—Fe(14)/Cu(2)]

B7: [Co—Fe(3)/Cu(2)/Ni—Co—Fe(14)/Cu(2)]

C7: [Co—Fe—V(3)/Cu(2)/Ni—Co—Fe(14)/Cu(2)]

The composition ratios of Ni—Fe, Co—Fe, Co—Fe—V, and Ni—Co—Fe are set to be $Ni_{0.5}Fe_{0.5}$, $Co_{0.5}Fe_{0.5}$, $Co_{0.52}Fe_{0.39}V_{0.09}$ and $Ni_{0.7}Co_{0.2}Fe_{0.1}$, respectively.

Various characteristics of the obtained samples, i.e., the resistance variation ratios ΔR/R and the output ratios, are shown in Table 6.

TABLE 6

| Sample No. | Resistance Variation Ratio ΔR/R (%) | Output Ratio |
|---|---|---|
| A7 | 6 | 3.4 |
| B7 | 5 | 4.1 |
| C7 | 6 | 3.9 |

The film is sputtered in the magnetic field so that the easy axis of the magnetic film exhibiting soft magnetism crosses the easy axis of the magnetic film exhibiting semi-hard magnetism at a right angle. The stacking cycles are set to be 3. The resistance variation ratios ΔR/R shown in Table 6 are those measured before forming a head. The output ratios shown in Table 6 are obtained by comparing the output of the MR head of this example with that of a conventional MR head. As is apparent from the results shown in Table 6, according to the MR head of this example, a larger output may be obtained than from a conventional MR head.

(Example 17)

In this example, a memory device shown in FIG. 4 was produced by a photolithography technique using the magnetoresistive devices. The following magnetoresistance effect films were used for forming the memory device.

A8: [Ni—Fe(3)/Cu(2)/Ni—Co—Fe(14)/Cu(2)]
B8: [Co—Fe(3)/Cu(2)/Ni—Co—Fe(14)/Cu(2)]
C8: [Co—Fe—V(3)/Cu(2)/Ni—Co—Fe(14)/Cu(2)]

The composition ratios of Ni—Fe, Co—Fe, Co—Fe—V and Ni—Co—Fe are set to be $Ni_{0.5}Fe_{0.5}$, $Co_{0.5}Fe_{0.5}$, $Co_{0.49}Fe_{0.49}V_{0.02}$ and $Ni_{0.7}Co_{0.2}Fe_{0.1}$, respectively.

Figure 20A:
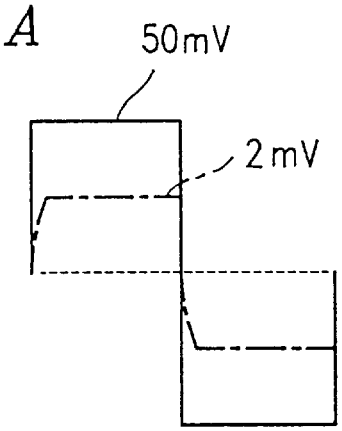
FIGS. 20A and 20B are views showing the input/output characteristics of a memory device according to the present invention.
Figure 20B:
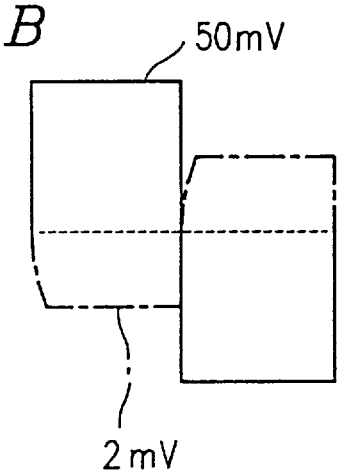
Figure 21:
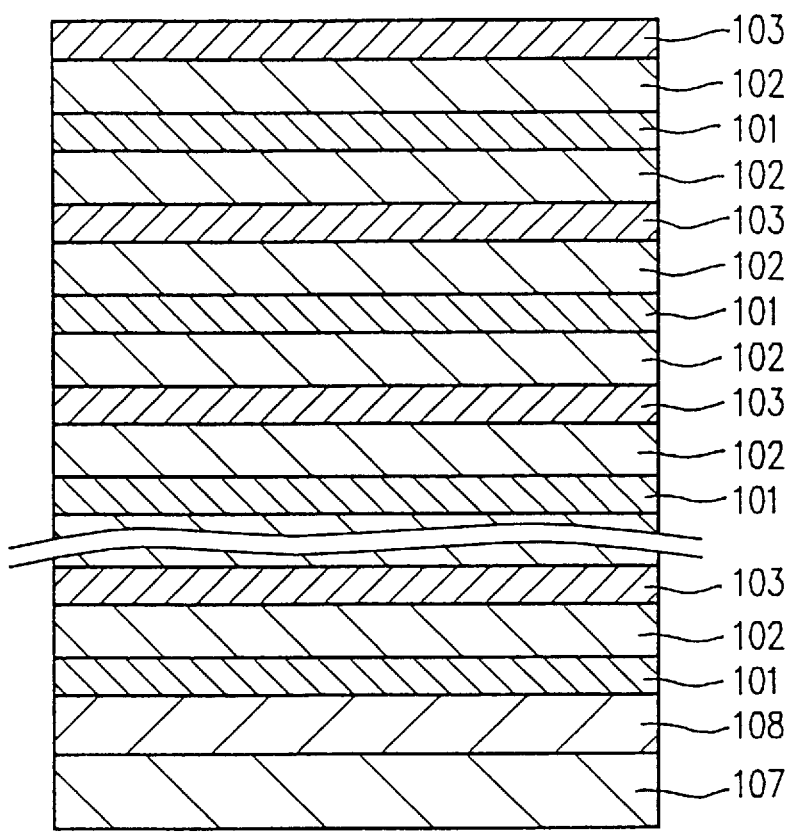
FIG. 21 is a sectional view of a magnetoresistance effect device according to the present invention.

The measurement is performed in the following manner. First, an electric current of +100 mA is supplied through conductor lines 5, thereby magnetizing the semi-hard magnetic film 1' in one direction so as to record information. The information is read out by supplying an electric current signal of ±50 mA to the conductor lines 5, by which the soft magnetic film 3 can be inverted. The variation of the resistance, i.e., the variation of the voltage, is measured by using an oscilloscope. The measured output waveforms are shown in FIG. 20A. Next, to the contrary to the case shown in FIG. 20A, an electric current of −100 mA is supplied through the conductor lines 5, thereby magnetizing the semi-hard magnetic film 1' in an opposite direction so as to record the information. The information is read out by supplying an electric current signal of ±50 mA through the conductor lines 5. In the same way, the variation of the resistance, i.e., the variation of the voltage, is measured by using an oscilloscope. The measured output waveforms are shown in FIG. 20B. As is apparent from the results of these experiments, the information may be recorded and reproduced easily.

In the following Examples 18 to 23, the embodiments of the invention which use a magnetoresistance effect device having a multilayer structure formed epitaxially on a substrate will be described.

The magnetoresistance effect device of the present invention includes a multilayer structure composed of sets of films, each set including a hard magnetic film mainly made of Co., CoPt, or CoFe and a soft magnetic film mainly made of NiFe or NiFeCo with a non-magnetic metal film mainly made of Cu having a thickness of 2 to 10 nm interposed therebetween, the multilayer structure being formed epitaxially on a substrate so that a [100] direction is in a direction vertical to a film surface and a magnetic field direction to be detected is substantially a [011] direction in plane of the Cu film.

As for the soft magnetic film, a film mainly made of NiFe or NiFeCo is preferably used. Specifically, an Ni-rich soft magnetic film of an atomic composition of $Ni_xCo_yFe_z$ where $0.6 \leq x \leq 0.9, 0 \leq y \leq 0.4, 0 \leq z \leq 0.3$ or a Co-rich soft magnetic film of an atomic composition of $Ni_{x'}Co_{y'}Fe_{z'}$ where $0 \leq x' \leq 0.4, 0.2 \leq y' \leq 0.95, 0 \leq z' \leq 0.5$ is desirably used. The films of the above compositions have a low magnetic distortion characteristic (in the order of $1 \times 10^{-5}$ or less) which is required for MR sensors and MR heads.

As for the hard magnetic film, a film mainly made of Co, more desirably mainly made of CoPt can be used. The CoPt film is more suitable as the hard magnetic film than the Co film because the CoPt film has a large coercive force and thus does not allow the magnetization to be easily inverted compared with the Co film. The CoPt film preferably has an atomic composition of $Co_{1-x}Pt_x$ where $0 \leq x \leq 0.4$. When x>0.4, the MR ratio decreases. In some instances, a CoFe film may be advantageously used as the hard magnetic film. The CoFe film provides a comparatively small coercive force, which results in easy write operation when the device is applied to a memory device, and thereby reduces the current to be applied to a conductor during the write operation. The atomic composition of the CoFe film is preferably $Co_{1-x}Fe_x$ where $0.3 \leq x \leq 0.7$, more preferably $0.4 \leq x \leq 0.6$, most preferably x is near 0.5.

In the above structure, the soft magnetic film may be first formed on a substrate or a suitable underlayer formed on the substrate, or the hard magnetic film may be first formed. In either case, the set of these films are stacked two to ten times, preferably. When only one set of films are stacked, the resultant MR ratio is small, while when more than ten sets of films are stacked, a large operational magnetic field is required.

In the above structure, a surface magnetic film is preferably covered with a suitable protective film made of Au, Cr, or the like so as to prevent the surface from being degraded due to oxidation and the like.

The multilayer structure is preferably formed on an Si (100) single crystalline substrate via a underlayer mainly made of Cu. The thickness of the Cu underlayer should be in the range of 1 nm to 50 nm, more preferably in the range of 5 nm to 50 nm. When the thickness of the Cu underlayer is less than 1 nm, magnetic material is not epitaxially grown on the Cu backing film. When the thickness of the Cu underlayer exceeds 50 nm, the resistance of the underlayer becomes so small that the resistance of the resultant device may be decreased.

The magnetoresistance effect device of the invention may include a multilayer structure formed on a substrate, the multilayer structure being composed of sets of films, each set including a hard magnetic film mainly made of Co, CoPt, or CoFe and a soft magnetic film mainly made of NiFe or NiFeCo with a first non-magnetic metal film mainly made of Cu having a thickness of 2 to 10 nm interposed therebetween. In this embodiment, a second non-magnetic metal film mainly made of Ag or Au having a thickness of 0.1 to 0.4 nm is inserted in the first non-magnetic metal film. Preferably, the second non-magnetic metal film is mainly made of Ag.

Preferably, the above multilayer structure is formed so that a (100) plane be epitaxially grown in a direction parallel to a film surface and a magnetic field direction to be detected be substantially a [011] direction in plane of the multilayer structure. That is, the [100] direction of the film is in a direction vertical to the film plane. The multilayer structure may be formed on an Si(100) single crystalline substrate via a underlayer mainly made of Cu.

The magnetoresistance effect device may include a multilayer structure formed on a substrate, the multilayer structure being composed of sets of films each having a hard magnetic film mainly made of Co, CoPt, or CoFe and a soft magnetic film mainly made of NiFe or NiFeCo with a non-magnetic metal film interposed therebetween. In this embodiment, at least two consecutive soft magnetic films each having a thickness in the range of 1 to 10 nm are stacked with a non-magnetic metal film interposed therebetween, and the hard magnetic film and the consecutive soft magnetic films are stacked with the non-magnetic metal film interposed therebetween.

Preferably, the thickness of the non-magnetic metal film between the consecutive soft magnetic films and the hard magnetic film is larger than the thickness of the non-magnetic metal film between the consecutive soft magnetic films.

The non-magnetic metal film formed between the consecutive soft magnetic films is preferably composed of a single film mainly made of Cu, while the non-magnetic metal film formed between the consecutive soft magnetic films and the hard magnetic film is composed of a film mainly made of Cu with an Ag or Au film inserted therein.

Preferably, the multilayer structure is epitaxially formed so that a (100) plane is in a direction parallel to a film surface and a magnetic field direction to be detected is substantially a [011] direction in the plane of the Cu film.

The magnetoresistance effect device may include a multilayer structure composed of sets of films each having a hard magnetic film mainly made of Co, CoPt, or CoFe and a soft magnetic film mainly made of NiFe or NiFeCo with a non-magnetic metal film interposed therebetween. In this embodiment, at least two consecutive hard magnetic films each having a thickness of 1 to 10 nm are stacked with a non-magnetic metal film interposed therebetween, and at least two consecutive soft magnetic films each having a thickness of 1 to 10 nm are stacked with a non-magnetic metal film interposed therebetween. The consecutive hard magnetic films and the consecutive soft magnetic films are stacked with a non-magnetic metal film interposed therebetween. The thickness of the non-magnetic metal film between the consecutive hard magnetic films and the consecutive soft magnetic films is larger than the thickness of the non-magnetic metal film between the consecutive soft magnetic films or between the consecutive hard magnetic films.

Preferably, the non-magnetic metal film formed between the consecutive soft magnetic films or between the consecutive hard magnetic films is composed of a single film mainly made of Cu, while the non-magnetic metal film formed between the consecutive soft magnetic films and the consecutive hard magnetic films is composed of a film mainly made of Cu with an Ag or Au film inserted therein.

Preferably, the multilayer structure is epitaxially formed so that a (100) plane is in a direction parallel to a film surface and a magnetic field direction to be detected is substantially a [011] direction in the plane of the Cu film.

A magnetic memory device may be provided by applying the magnetoresistance effect device of the present invention to a memory device. As a basic structure, the magnetic memory device includes a device portion having a hard magnetic film mainly made of Co, CoPt, or CoFe and a soft magnetic film mainly made of NiFe or NiFeCo with a non-magnetic metal film mainly made of Cu having a thickness of 2 to 10 nm, epitaxially formed on a substrate so that a (100) plane is parallel to a film surface, and a conductor disposed in the vicinity of the device portion via an electrically insulating film. The magnetic memory device is formed so that the magnetization direction to be recorded is substantially a [011] direction in the plane of the Cu film.

According to the invention, an amplifier may be provided by applying the magnetoresistance effect device of the present invention to an amplifier. As a basic structure, the amplifier includes a device portion having a hard magnetic film mainly made of Co, CoPt, or CoFe and a soft magnetic film mainly made of NiFe or NiFeCo with a non-magnetic metal film mainly made of Cu having a thickness of 2 to 10 nm, epitaxially formed on a substrate so that the (100) plane is parallel to the film surface, and a conductor disposed in the vicinity of the device portion via an electrically insulating film. The amplifier is formed so that the magnetization direction of an operating magnetic film is substantially a [011] direction in the plane of the Cu film.

Moreover, a magnetic head may be provided by applying the magnetoresistance effect device of the present invention to a magnetic head. As a basic structure, the magnetic head includes a device portion having a hard magnetic film mainly made of Co, CoPt, or CoFe and a soft magnetic film mainly made of NiFe or NiFeCo with a non-magnetic metal film mainly made of Cu having a thickness of 2 to 10 nm, epitaxially formed on a substrate so that the (100) plane is parallel to a film surface, and a yoke provided to form a magnetic path commonly used with the device portion. The magnetic head is formed so that the magnetization direction of an operating magnetic film is substantially the [011] direction of the Cu film.

According to the present invention, since the multilayer structure is formed by growing crystal epitaxially on the substrate, non-uniform thin film formations such as island-shaped formations can be prevented. It is known that the conditions of the interface between the magnetic film and the non-magnetic metal film is influential to the magnetoresistance effect of an artificial multilayer. According to the present invention, epitaxially grown films provide a flat interface, and thus a great magnetoresistance effect can be obtained. The [NiFe/Cu] and [Co/Cu] epitaxial films where the (100) crystal plane is parallel to the substrate surface have weak magnetic correlation, compared with a (111) film. Accordingly, the (100) film is suitable for creating magnetization inversion with a low magnetic field. When the (100) epitaxial film is used for the magnetoresistance effect device, it is required to apply a magnetic field substantially in a [011] direction in the plane of the Cu film. This is because, in the (100) epitaxial film, the magnetization easy axis of the NiFe or NiFeCo film is in the [011] direction in the plane of the Cu film. Therefore, by applying a magnetic field in this direction, the measurement with a reduced field and an increased MR value is realized.

Si (100) single crystal is suitable for a substrate on which an epitaxial film is grown. Si substrates are commercially available inexpensively since they are mass-produced for the fabrication of semiconductor devices. Such an Si (100) substrate is treated with hydrofluoric acid to remove any oxidized film on the surface. By this treatment, it is possible to grow Cu epitaxially at room temperature. This process is advantageous because no step of pre-heating the Si substrate in a vacuum is required. The thickness of the backing Cu film is suitably in the range of 1 to 50 nm, more preferably of 5 to 50 nm. When the thickness of the Cu underlayer is less than 1 nm, it is difficult to epitaxially form a multilayer on the backing film. When the thickness of the underlayer exceeds 50 nm, the resistance of the underlayer is so small that the MR ratio decreases.

The magnetoresistance effect device of the present invention is preferably fabricated by a thin film formation technique such as sputtering and vapor deposition. When a thin film is formed on a glass substrate by vapor deposition, however, crystal grains tend to be deposited into the shape of spotted islands, making it difficult to form a smooth surface. According to the fabrication method of the present invention, a thin film is epitaxially formed on a single crystalline substrate, forming a smooth interface between the magnetic film and the non-magnetic metal film, and thereby realizing a large MR ratio.

Cu is preferably used for the non-magnetic metal film of the magnetoresistance effect device of the present invention. As the Cu film is thinner, the interaction between the magnetic films becomes larger and thus the operating magnetic field of the resultant magnetoresistance effect device is larger. Therefore, the thickness of the Cu non-magnetic metal film should be at least 2 nm, preferably at least 5 nm. When the thickness of the Cu nonmagnetic film exceeds 10 nm, the MR ratio lowers because the thickness exceeds the mean free path of electrons. Therefore, the thickness should be less than 10 nm. An Ag or Au film having a thickness of 0.1 to 0.4 nm may be inserted in the Cu nonmagnetic film. In this case, the operating magnetic field of the Cu film lowers without substantially decreasing the MR value. The reason is considered as follows: The magnetic films interact with each other via conductive electrons in the nonmagnetic film interposed therebetween. The wave function of the Cu non-magnetic film is disturbed by inserting a film of other atoms than Cu in the Cu nonmagnetic film, lowering the magnetic interaction and thereby facilitating the magnetic moment directions of the magnetic films to be rotated individually. Ag or Au may be used for the magnetic insertion film, though Ag is more preferable. Such an insertion film is effective when the thickness thereof is 0.1 nm or more, though it is more effective when the thickness is 0.2 nm or more. When the thickness of the insertion film is 0.4 nm or less, the MR value does not substantially decrease. However, when the thickness exceeds 0.4 nm, the epitaxial orientation is greatly disturbed, lowering the MR value and the crystal of the magnetic films.

The thickness of the magnetic films of the present invention is preferably in the range of 1 to 10 nm. Especially, the soft magnetic film is preferably at least 1 nm, more preferably at least 3 nm because a too thin soft magnetic film is inferior in the soft magnetic characteristics. Also, in consideration of the mean free path of electrons, when two or more sets of [a hard magnetic film/a non-magnetic metal film/a soft magnetic film] are stacked with a non-magnetic metal film interposed between each set, the thickness of each magnetic film is preferably 10 nm or less.

Figure 23:
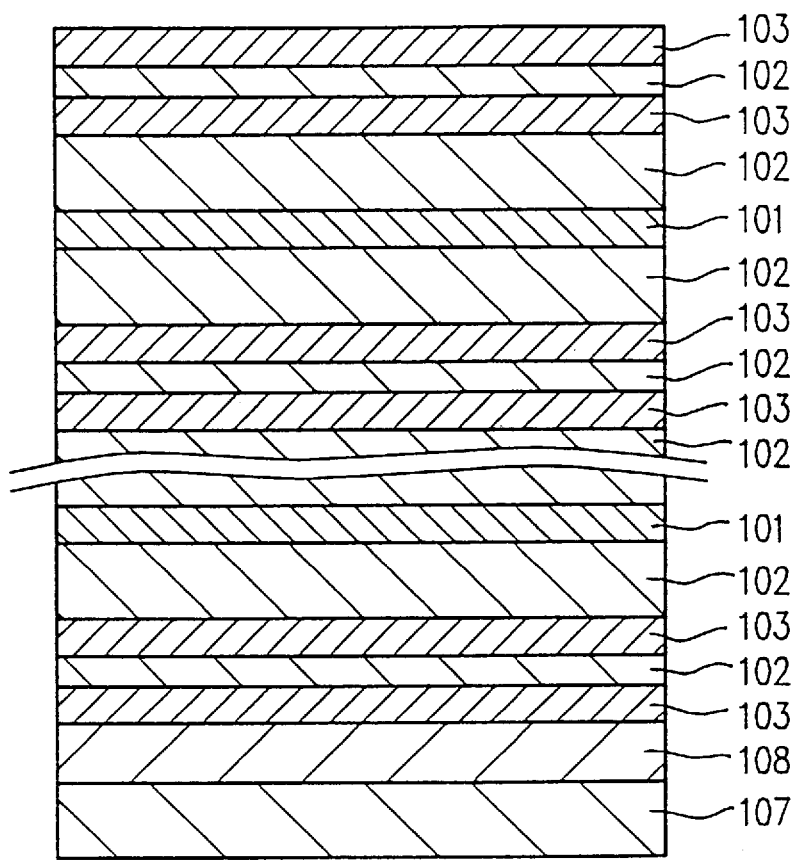
FIG. 23 is a sectional view of still another magnetoresistance effect device according to the present invention.

According to another magnetoresistance effect device of the present invention, two or more consecutive soft magnetic films are stacked with a non-magnetic metal film interposed between any adjacent soft magnetic films, as shown in FIG. 23. The thickness of the non-magnetic metal film between the adjacent soft magnetic films is suitably selected so that the coupling between the soft magnetic films can be ferromagnetic. With this structure, the coercive force of the soft magnetic films can be reduced compared with the case where only a single thick soft magnetic film is used. As a result, it is possible to fabricate a magnetoresistance effect device which can operate with a smaller magnetic field. Further, the structure of the consecutive soft magnetic films increases the MR ratio, compared with a single thick soft magnetic film, because the number of magnetic film/non-magnetic metal film interfaces increases. The thickness of the non-magnetic metal film between the consecutive soft magnetic films should be such that a ferromagnetic coupling can be created between the soft magnetic films, which is preferably in the range of about 0.2 to 0.7 nm or 1.1 to 1.7 nm, more preferably about 0.5 nm or 1.5 nm.

Figure 24:
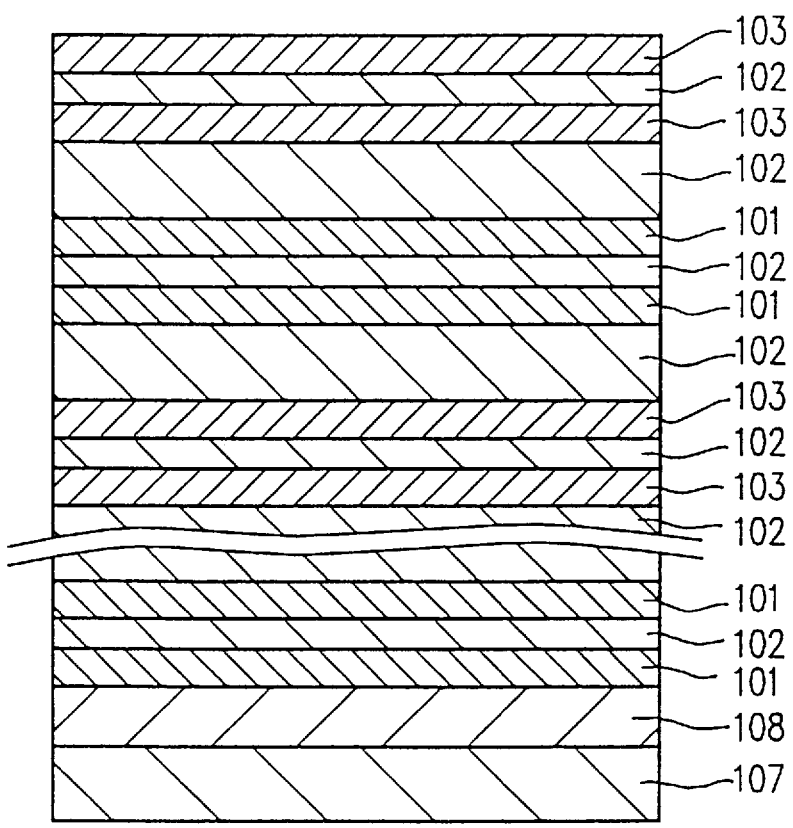
FIG. 24 is a sectional view of still another magnetoresistance effect device according to the present invention.

According to still another magnetoresistive effect device of the present invention, two or more consecutive soft magnetic films are stacked with a non-magnetic metal film interposed between any adjacent soft magnetic films, and two or more consecutive hard magnetic films are stacked with a non-magnetic metal film interposed between any adjacent hard magnetic films, as shown in FIG. 24. The same effect as that described above can be obtained by using the consecutive soft magnetic films. Also, the structure of the consecutive hard magnetic films increases the MR ratio, compared with a single thick hard magnetic film, because the number of magnetic film/non-magnetic metal film interfaces increases. As in the case of the consecutive soft magnetic films, the thickness of the non-magnetic metal film between the consecutive hard magnetic films should be such that a ferromagnetic coupling can be created between the hard magnetic films. The thickness is preferably in the range of about 0.2 to 0.7 nm or 1.1 to 1.7 nm, more preferably about 0.5 nm or 1.5 nm.

Figure 26:
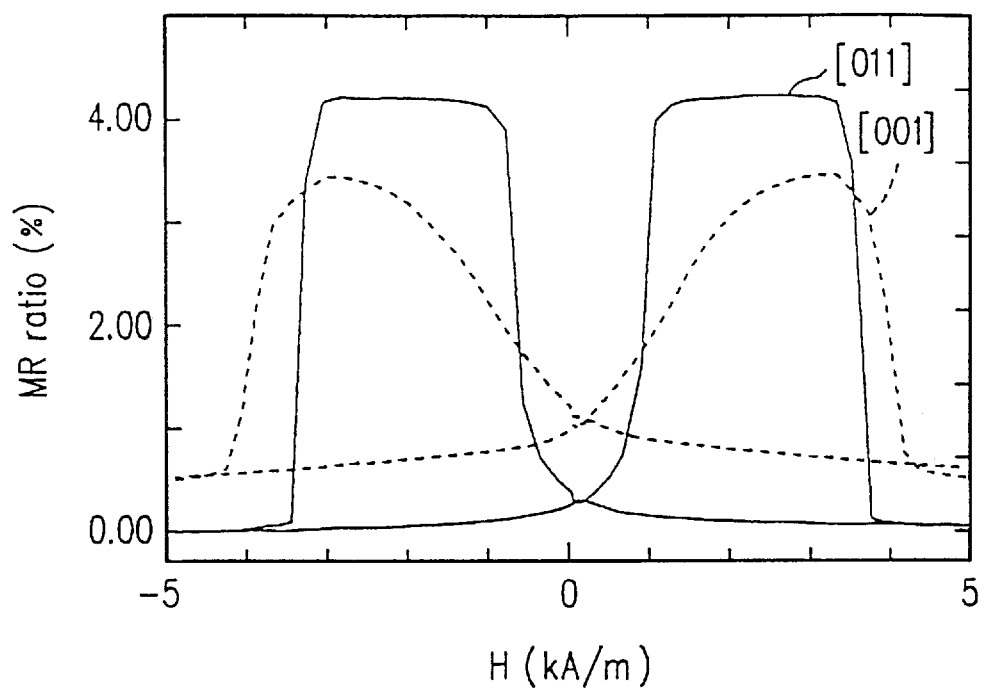
FIG. 26 is a graph showing the MR curves of an Si(100)/Cu(5)/NiFe(10)/Cu(2.4)/Ag(0.2)/Cu(2.4)/Co(10) device of the present invention.

The magnetoresistance effect device of the present invention is suitable for the application to a memory device and an amplifier as shown in FIG. 4. FIG. 26 illustrates one example of the MR curve of the magnetoresistance effect device according to the present invention. As is observed from FIG. 26, the high resistivity and the low resistivity are switched within a small magnetic field with a good square feature. Accordingly, when such a device is applied to a memory device, highly reliable recording and reading is possible. When the device is applied to an amplifier, a stable output can be obtained. In the thus-fabricated memory device, the coercive force of a hard magnetic film 101 can be varied to some extent by varying the thickness of the hard magnetic film and by varying the composition of CoPt used for the hard magnetic film. As a result, it is possible to produce a hard magnetic film having a coercive force suitable for the writing capability of a conductor 5.

An insulating film 6 is preferably as thin as possible so that a device portion composed of [the hard magnetic film 101/a non-magnetic metal film 102/a soft magnetic film 103] is as close as possible to the conductor 5 for magnetizing the device portion. As the device portion is closer to the conductor 5, a greater magnetic field can be generated by the application of the same current, and the device portion can be magnetized by the application of less current. However, the thickness of the insulating film 6 is required to be at least 5 nm to avoid troubles such as characteristic degradation due to heating and inferior insulating property. The thickness is also required preferably to be 1 $\mu$m or less in consideration of the magnetization range where a magnetic field can be generated for magnetizing the hard magnetic film 101 (for writing information on the hard magnetic film 101). $SiO_2$ is especially preferable as the insulating material in consideration of the processibility and the flatness. However, any other material may be used as far as it has the insulation property.

The conductor 5 may be formed in a strip shape as shown in FIG. 4 when it is used for a memory device. In the case of arranging memory devices in a matrix, the conductor 5 may be formed so that two conductors do not cross each other on the magnetoresistance effect device as shown in FIG. 15A or two conductors cross each other as shown in FIG. 15B.

Figure 29:
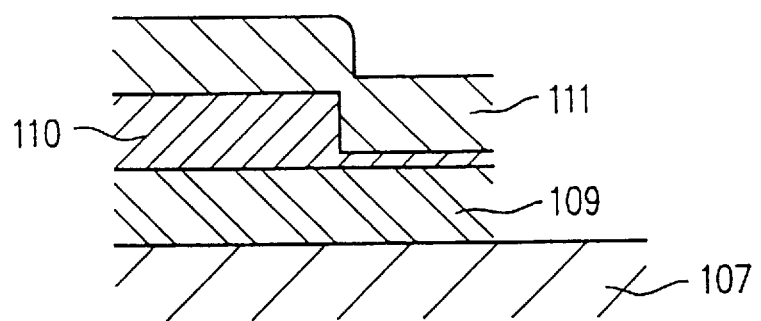
FIG. 29 shows a structure for a magnetic head according to the present invention.

The magnetoresistance effect device of the present invention, which creates a large magnetoresistive change within a low magnetic field as described above, is also suitable for application to a magnetic head. However, since an epitaxial film is used for the magnetoresistance effect device of the present invention, it is difficult to form such an epitaxial film on a conventional ferrite substrate. This necessitates a special consideration for the application of the present invention to a magnetic head. FIG. 29 shows an exemplified basic structure for a magnetic head according to the present invention. In FIG. 29, a device portion 109 is formed on an Si substrate 107 and is covered with an insulating film 110. The insulating film 110 may be made of various types of materials including $Al_2O_3$, but $SiO_2$ is most preferable. A yoke 111 is formed on the insulating film 110 and is magnetically coupled with the device portion 109 at a portion where the insulating film 110 is thinned, thereby forming a magnetic path. The yoke 111 is preferably made of a material which is soft magnetic and has a high magnetic permeability, such as an amorphous magnetic film of a Co group. A magnetic flux which leaks from a magnetic recording medium directly enters the device portion 109 from the left as is seen in FIG. 29 and is converted into an electric signal.

(Example 18)

A magnetoresistance effect device was fabricated by use of an ultra-high vacuum deposition apparatus, using Si (100) single crystal as a substrate. First, a Si (100) substrate was treated with a 7% hydrofluoric acid to remove any oxidized film on the surface of the substrate, and then sufficiently cleaned with pure water. The substrate was then placed in an ultra-high vacuum deposition apparatus to form a underlayer and a multilayer structure A under a vacuum of approximately $2 \times 10^{-9}$ Torr:
A9:Si(100)/Cu(50)/[Co(3)/Cu(6)/NiFe(3)/Cu(6)]$^{10}$
(parenthesized values indicate the thickness (nm) except for Si(100), superscript number 10 indicates that the set of films within [ ] are stacked 10 times.)

In the above film formation process, a Knudsen cell was used as an evaporation source for Cu, while an electron beam evaporation source was used for Co and NiFe. The Knudsen cell provides deposition with a stable evaporation rate and thus is suitable for obtaining a high-quality thin film, though it finds it difficult to evaporate a substance having a high melting point. The Knudsen cell is therefore suitably used for the deposition of Cu and Ag (the deposition of the latter will be described later). For NiFe, an evaporation source of a previously prepared alloy of $Ni_{0.8}Fe_{0.2}$ (the composition is expressed by the ratio of the numbers of atoms; hereinafter, referred to as the atomic composition) was used. Whether each film was growing epitaxially was monitored by RHEED (reflection high energy electron diffraction) during the film formation process. As a result of the monitoring, the films were found to have grown epitaxially with the relationship of Si(100)//Cu(100)//Co(100)//NiFe(100) in a stacking direction and Si[001]//Cu[011]//Co[011]//NiFe[011] in a film plane. (100) indicates a (100) crystal plane. After the film formation process, the resultant multilayer structure was examined by X-ray diffraction. As a result, a sharp peak corresponding to Cu(200) was observed, but no peak corresponding to (111) and (220) was observed. For comparison, a magnetoresistance effect device having the same multilayer structure formed on a glass substrate via a 5 nm-thick Cr underlayer was fabricated.

Figure 27A:
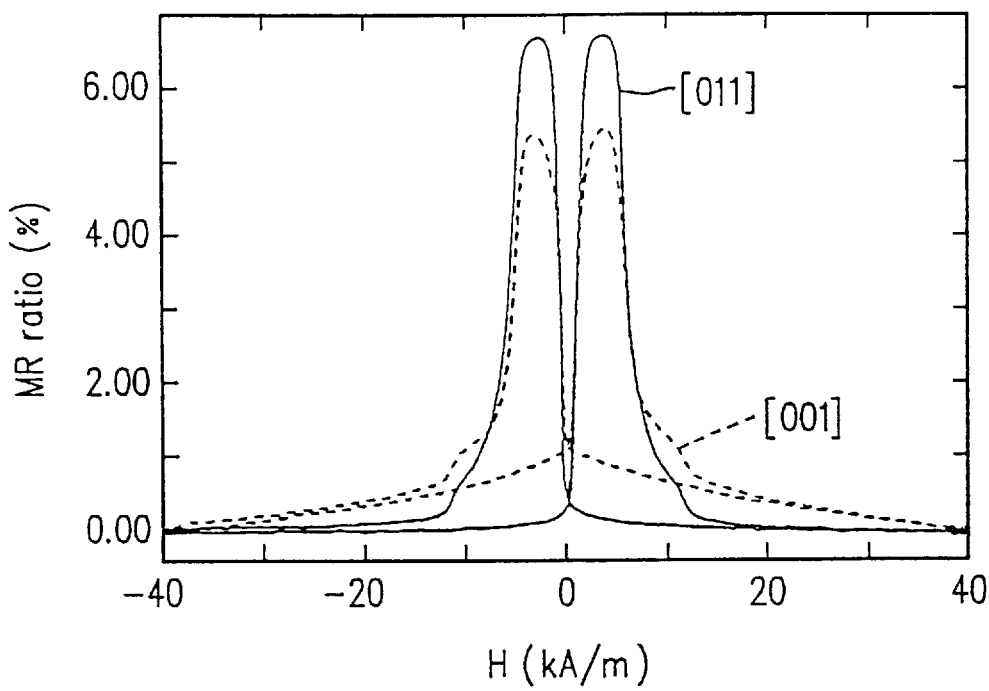
FIGS. 27A and 27B are graphs showing the MR curves of a device A9 of the present invention and a glass/Cr(5)/[Co(3)/Cu(6)/NiFe(3)/Cu(6)]$^{10}$ device as a comparative example.
Figure 27B:
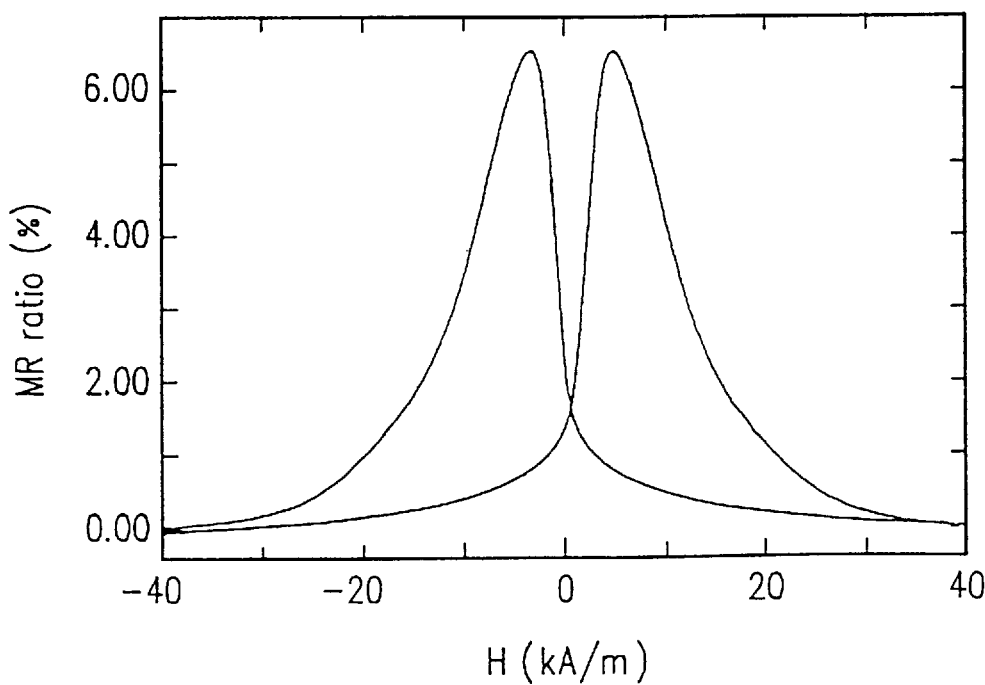
Figure 28C:
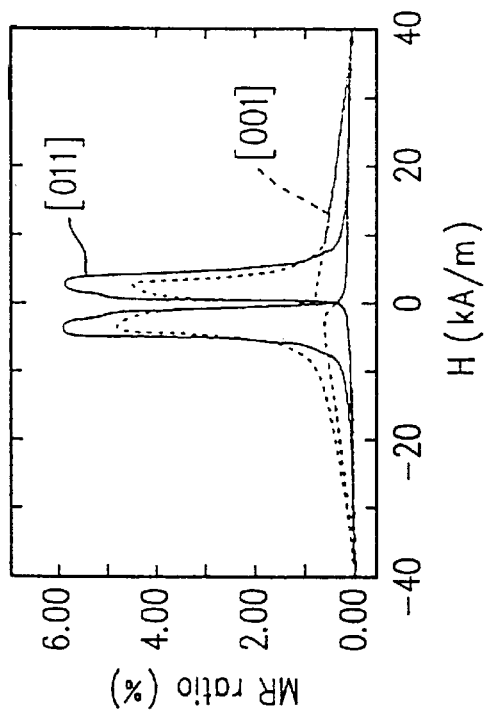
FIGS. 28A through 28D are graphs showing the MR curves of a device B9 of the present invention where x is 0, 0.1, 0.2, and 0.4, respectively.
Figure 28D:
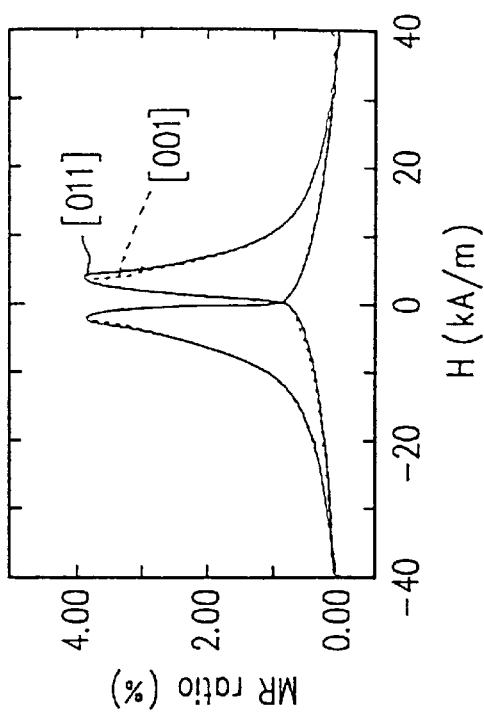
Figure 28A:
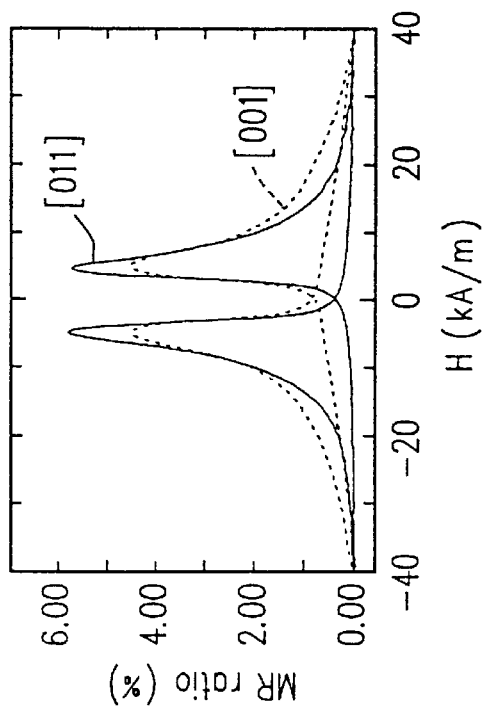
Figure 28B:
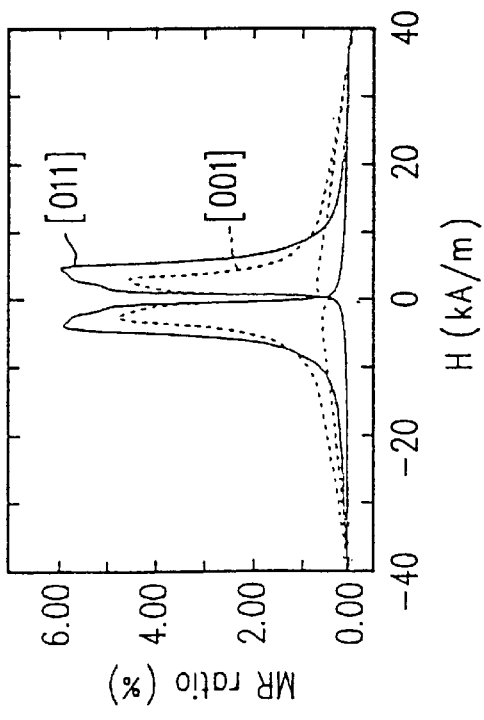

These magnetoresistance effect devices were measured by a four-terminal method under an applied magnetic field of maximum 500 Oe at room temperature. In this measurement, the magnetic field was applied in the two directions of [001] and [011] in plane of the Cu underlayer on the substrate. The results of the measurement are shown in FIGS. 27A and 27B for the device A9 and the device of the comparative example, respectively. In FIGS. 27A and 27B, the x-axis represents the magnetic field applied from outside, while the y-axis represents the MR ratio. The solid line in FIG. 27A is a curve obtained by applying the magnetic field in the [011] direction in plane of the Cu backing film, while the dot line in the [001] direction in plane of the Cu backing film. From FIG. 27A, it is found that the MR ratio is larger and more sharply changes when the magnetic field is applied in the [011] direction than in the [001] direction. In comparison of the above MR curve with the MR curve shown in FIG. 27B for the comparative example using a glass substrate, it is found that the MR curve of the magnetoresistance effect device A has a good linearity and sharply changes near the zero field. In the comparative example shown in FIG. 27B, the dependency of the MR ratio on the direction of the magnetic field was hardly observed. In FIG. 27A, the MR ratio can be larger by thinning the Cu backing film. When the thickness of the Cu underlayer of the device A is changed to 5 nm without changing other conditions, the resultant device can provide an MR ratio of approximately 10% with a substantially the same MR curve as that of FIG. 27A though the crystallinity thereof lowers more or less.

In Example 18, Co was used for the hard magnetic film. The MR ratio can be further increased by using CoPt as the hard magnetic film. The CoPt film was formed by evaporating Co and Pt simultaneously using separate evaporation sources so as to obtain an atomic composition of $Co_{0.8}Pt_{0.2}$. The thus-fabricated magnetoresistance effect device, A9': Si(100)/Cu(50)/[CoPt(3)/Cu(6)/NiFe(3)/Cu(6)]$^{10}$ had an MR ratio of approximately 8%, which is greater by approximately 1% than that of the device A9.

(Example 19)

Figure 22:
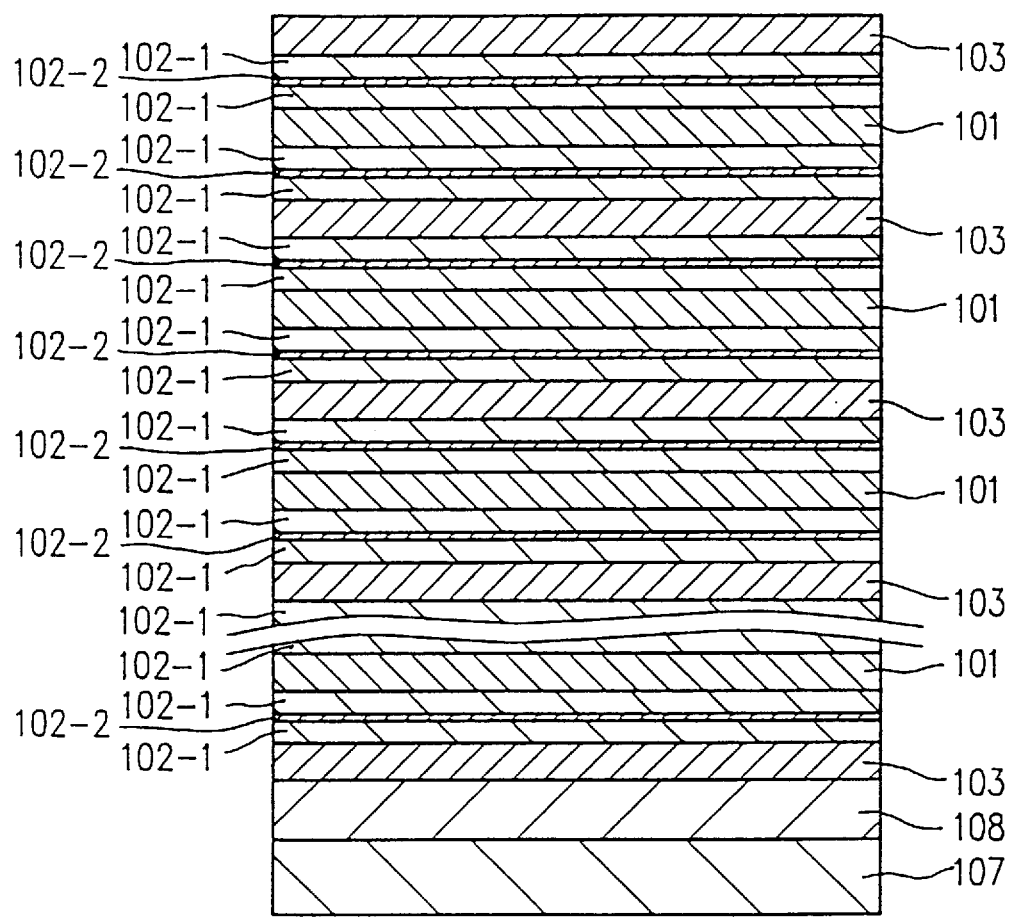
FIG. 22 is a sectional view of another magnetoresistance effect device according to the present invention.

A magnetoresistance effect device having a structure of: B9: Si(100)/Cu(50)/[Co(3)/Cu(2.5-x/2)/Ag(x)/Cu(2.5-x/2)/NiFe(3)/Cu(2.5-x/2)/Ag(x)/Cu(2.5-x/2)]$^{10}$ of the multilayer type shown in FIG. 22 was fabricated in the same manner as that described in Example 18. Ag was evaporated by use of the Knudsen cell as in the case of Cu. The Knudsen cell is suitable for forming thin films as in this case with high accuracy. The MR curves of the magnetoresistance effect device B9 when x is 0, 0.1, 0.2, and 0.4 nm are shown in FIGS. 28A to 28D, respectively. It is observed from FIGS. 28A to 28D that, when the thickness of the Ag film is 0.1 nm and 0.2 nm, the MR curve sharply rises near the zero field for the measurement in the [011] direction. When the thickness of the Ag film is 0.4 nm or more, the crystallinity is deteriorated, decreasing the MR ratio and losing direction with significant characteristics. The maximum MR curve, MR/$\Delta$H=1.3%/Oe was obtained by setting x at 0.2 and the thickness of the underlayer at 5 nm.

Magnetoresistance effect devices of a so-called sandwich type of:
C9: Si(100)/Cu(5)/NiFe(10)/Cu(5)/Co(10)
D9: Si(100)/Cu(5)/NiFe(10)/Cu(2.4)/Ag(0.2)/Cu(2.4)/Co(10)
had MR ratios of 3.5% and 4.3%, respectively, which was significantly greater than that of a comparative example using a glass substrate:
Comparative: glass/Cr(5)/NiFe(10)/Cu(5)/Co(10) example of which MR ratio was 1.5%.

The MR ratio can also be increased by forming a Co film between the soft magnetic film and the non-magnetic metal film. A magnetoresistance effect device with this structure:
C9': Si(100)/Cu(5)/NiFe(10-t)/Co(t)/Cu(5)/Co(10)
had a MR ratio of 4.0%, 5.0%, 4.5%, and 3.5% when t was 0.2, 0.5, 1.0, and 2.0 nm, respectively. The thickness of the interposed Co film is preferably in the range of 0.1 nm to 1.0 nm. This interposition of Co between the soft magnetic film and the non-magnetic metal film is also effective for a multilayer structure.

The MR ratio can be further increased by using NiFeCo for the soft magnetic film, instead of $Ni_{0.8}Fe_{0.2}$ used in the above example. For example, when the NiFe film of the device C9 was replaced with an $Ni_{0.7}Co_{0.1}Fe_{0.2}$ film, the MR ratio increased by approximately 1% to obtain 4.5%.

Memory devices were fabricated by forming an $SiO_2$ insulating film and an Au/Cr film as a conductor on the above sandwich type devices by sputtering. The operation of the resultant memory devices was tested in the following manner: As shown in FIG. 6A, a strong current was applied to the conductor 5 to magnetize the hard magnetic film 1'(101) in one direction. As shown in FIG. 6B, a weak current was applied to the conductor 5 to align the soft magnetic film 103 in one direction. Then, as shown in FIG. 6C, the weak current flowing in the conductor 5 was inverted, and, at this point, a change in the resistance at the magnetoresistive device portion was measured. As a result, it was confirmed that the change in the resistance was definitely + (increase) or –(decrease) depending on the magnetization direction recorded on the hard magnetic film 101 as shown in FIG. 6D. This change in the resistance was double the comparative example for the device C9 and triple for the device D9. In the case where a memory device was fabricated by using a $Co_{0.5}Fe_{0.5}$ film instead of Co film of D9 in the same manner for D9, the change in the resistance of this device was 4 times the comparative example.

Figure 25:
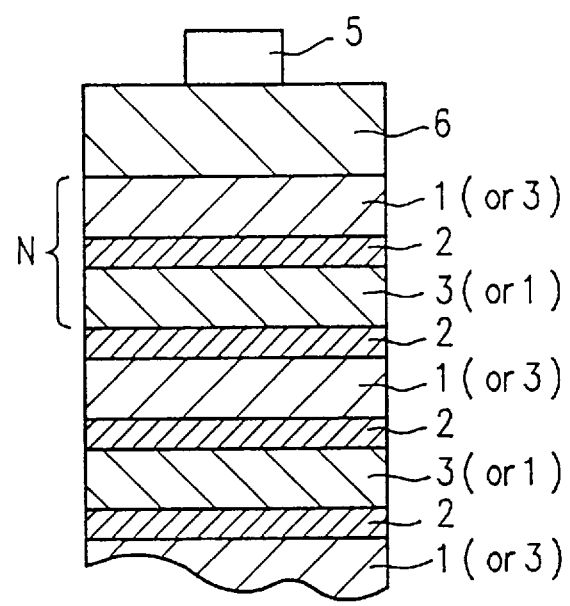
FIG. 25 is a structural view of a memory device/an amplifier including a multilayer device portion.

The memory devices having the sandwich type structure of [the hard magnetic film/the non-magnetic metal film/the soft magnetic film] as shown in FIG. 4 were described. The present invention is also effective for a multilayer type memory device as shown in FIG. 25 and memory devices having the multilayer structures shown in FIGS. 21 to 24. However, the square feature is very important when the magnetoresistance effect device is used for the memory device. Accordingly, a sandwich type device as shown in FIG. 4 which has a non-magnetic metal film composed of Cu/Ag/Cu is desirable.

In FIGS. 4 and 6A to 6D, the memory device includes only one conductor 5. The present invention is also effective as a memory device having two conductors. For example, such conductors may be arranged in a matrix, and the write operation is performed at each intersection of the conductors by use of a synthesized magnetic field generated by currents flowing the intersecting two conductors.

The same devices were applied to an amplifier, and the operation as the amplifier was tested. As shown in FIG. 8A, a strong current was applied to the conductor 5 to magnetize the hard magnetic film 1'(101) in one direction. As shown in FIG. 8B, an input AC voltage was applied to the conductor 5, and a change in the output voltage which may be caused by a change in the resistance at the conductor was measured. As a result, it was confirmed that the input voltage had been amplified as shown in FIG. 8C. The magnitude of the output voltage was double that of the comparative example for the device C9 and triple for the device D9. The devices C9 and D9 were also advantageous in that the noise was low compared with the comparative example.

A magnetic head was fabricated by forming an $SiO_2$ insulating film and a $Co_{0.82}Nb_{0.12}Zr_{0.06}$ yoke film on the device C9 by sputtering. The output of the resultant magnetic head of the present invention was double that of a conventional magnetic head using NiFe recorded in the same manner as the above.

(Example 20)

Magnetoresistance effect devices of the type shown in FIG. 23:
E9: Si(100)/Cu(5)/NiFe(3)/Cu(0.5)/NiFe(3)/Cu(0.5)/NiFe(3)/Cu(5)/Co(10)
F9: Si(100)/Cu(5)/NiFe(3)/Cu(0.5)/NiFe(3)/Cu(0.5)/NiFe(3)/Cu(2.4)/Ag(0.2)/Cu(2.4)/Co(10)
were fabricated in the manner described in Examples 18 and 19. The MR ratio of the devices E9 and F9 were 5.6%, which was greater than those of the devices C9 and D9.

(Example 21)

Magnetoresistance effect devices of the type shown in FIG. 24:
G9: Si(100)/Cu(5)/[Co(3)/Cu(1.5)/Co(3)/Cu(6)/NiFe(3)/Cu(1.5)/NiFe(3)/Cu(6)]³

H9: Si(100)/Cu(5)/[Co(3)/Cu(1.5)/Co(3)/Cu(2.4)/Ag(0.2)/Cu(2.4)/NiFe(3)/Cu(1.5)NiFe(3)Cu(6)]³
were fabricated in the manner described in Examples 18 to 20. The MR ratios of the devices G9 and H9 were 10% and 12% at 10 Oe, respectively.

(Example 22)

Magnetoresistance effect devices using a glass substrate:
I9: glass/Cr(5)/[CoPt(3)/Cu(5)/CoNiFe(3)/Cu(1.5)/CoNiFe(3)/Cu(5)]³
J9: glass/Cr(5)/[CoPt(1.5)/Cu(0.5)/CoPt(1.5)/Cu(5)/CoNiFe(3)/Cu(1.5)/CoNiFe(3)/Cu(5)]³
Comparative: glass/Cr(5)/[CoPt(3)/Cu(5) example /CoNiFe(6)/Cu(5)]³
were fabricated in the manner described in Examples 18 to 21. The CoPt film, of which atomic composition was $Co_{0.9}Pt_{0.1}$, was obtained by evaporating Co and Pt from separate evaporation sources. The CoNiFe film, whose atomic composition was $Co_{0.5}Ni_{0.3}Fe_{0.2}$ was evaporated by use of an alloy evaporation source. The MR ratios of the devices I9 and J9 were 6.7%, while that of the comparative example was 4%.

(Example 23)

Magnetoresistance effect devices using a glass substrate:
K9: glass/[CoPt(3)/Cu(2.4)/Ag(0.2)/Cu(2.4)/NiFeCo(3)/Cu(2.4)/Ag(0.2)/Cu(2.4)]²
L9: glass/[CoPt(3)/Cu(2.4)/Au(0.2)/Cu(2.4)/NiFeCo(3)/Cu(2.4)/Au(0.2)/Cu(2.4)]²
Comparative: glass/[CoPt(3)/Cu(5)/CoNiFe(3) example /Cu(5)]²
were fabricated in the manner described in Examples 18 to 22. A $Co_{0.8}Pt_{0.2}$ film and an $Co_{0.6}Ni_{0.3}Fe_{0.1}$ film were used for the hard magnetic film and the soft magnetic film, respectively. The MR ratios of these devices were measured in the manner described in Example 18. As a result, the maximum slopes of the MR curves of the devices K9 and L9 were 0.7%/Oe and 0.6%/Oe, respectively, while that of the comparative example was 0.4%/Oe, exhibiting a sharp rise near the zero field of the MR curves of the devices K9 and L9.

By using these magnetoresistance effect devices, it is possible to obtain a magnetic head, a magnetic memory, and an amplifier, as described in the previous examples.

The magnetoresistance effect device of the present invention provides a large magnetoresistive change under a low magnetic field. Moreover, the magnetoresistance effect device exhibits a large magnetoresistance effect and a small magnetostriction at room temperature.

Accordingly, by applying the magnetoresistance effect device of the present invention to a magnetic head, a magnetic memory, and an amplifier, a magnetic head with high sensitivity and high output, a magnetic memory with high reliability and easy write operation, and an amplifier with high output and high reliability may be realized. In addition, by reducing the saturation magnetic field Hs, it becomes possible to provide a memory device allowing for recording and reproducing.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A magnetoresistance effect device comprising:
a substrate: and
a multilayer structure formed on the substrate, the multilayer structure including a hard magnetic film comprising at least one of CoPt, CoTaCr and CoPtCr, a soft magnetic film, and a non-magnetic film for separating the hard magnetic film from the soft magnetic film,
wherein a direction of a magnetization easy axis of the hard magnetic film substantially agrees to a direction of a magnetic field to be detected.

2. A magnetoresistance effect device according to claim 1, wherein the magnetoresistance effect device comprises a plurality of the multilayer structures formed on the substrate.

3. A magnetoresistance effect device according to claim 1, wherein the magnetoresistance effect device further comprises a further magnetic film inserted on both faces or on one face of the hard magnetic film, a thickness of the further magnetic film is in the range of 0.1 to 2 nm, and the further magnetic film includes at least one element selected from Co, Ni, and Fe as a main component.

4. A magnetoresistance effect device according to claim 3, wherein the magnetoresistance effect device comprises a plurality of the multilayer structures formed on the substrate.

5. A magnetoresistance effect device according to claim 1, wherein a further magnetic film is inserted at, at least one of interfaces between the hard magnetic film and the non-magnetic metal film and between the soft magnetic film and the non-magnetic metal film, a thickness of the further magnetic film is in the range of 0.1 to 1 nm, and the further magnetic film includes Co as a main component.

6. A magnetoresistance effect device according to claim 5, wherein the multilayer structure has a structure in which the hard magnetic film, the soft magnetic film, the non-magnetic metal film, and the further magnetic film are stacked a plurality of times.

7. A magnetoresistance effect device according to claim 1, wherein the soft magnetic film includes $Ni_xCo_yFe_z$ as a main component, and in an atomic composition ratio, X is in the range of 0.6 to 0.9, Y is in the range of 0 to 0.4, and Z is in the range of 0 to 0.3.

8. A magnetoresistance effect device according to claim 1, wherein the soft magnetic film includes $Ni_{X'}Co_{Y'}Fe_{Z'}$ as a main component, and in an atomic composition ratio, X' is in the range of 0 to 0.4, Y' is in the range of 0.2 to 0.95, and Z' is in the range of 0 to 0.5.

9. A magnetoresistance effect device according to claim 1, wherein the soft magnetic film is an amorphous magnetic film comprising CoFeB.

10. A magnetoresistance effect device according to claim 1, wherein the non-magnetic metal film is made of a material selected from Cu, Ag, and Au.

11. A magnetoresistance effect device according to claim 1, wherein the non-magnetic metal film is made of Cu.

12. A magnetoresistance effect device according to claim 1, wherein the non-magnetic metal film has a thickness in the range of 1 nm to 10 nm.

13. A magnetoresistance effect device according to claim 1, wherein the hard magnetic film includes Co and M as main components, M representing Pt or two or more kinds of elements selected from a group consisting of Pt, Cr, and Ta.

14. A magnetoresistance effect device according to claim 1, wherein the hard magnetic film is made of a material of CoPt.

15. A magnetoresistance effect device according to claim 1, wherein the soft magnetic film includes $Ni_xFe_{1-x}$ or $(Ni_xCo_{1-x})_{x'}Fe_{1-x'}$ as a main component, and in an atomic composition ratio, X is in the range of 0.6 to 1.0, and X' is in the range of 0.7 to 1.0.

16. A magnetoresistance effect device according to claim 15, wherein the non-magnetic metal film is made of a material selected from Cu, Ag, and Au.

17. A magnetoresistance effect device according to claim 1, wherein, in the multilayer structure formed on the substrate, the hard magnetic film is mainly made of CoPt, the soft magnetic film mainly made of NiFe or NiFeCo, and the non-magnetic metal film is mainly made of Cu and has a thickness of 2 to 10 nm, the multilayer structure is formed epitaxially on the substrate such that a [100] direction of each film composing the multilayer structure is in a direction perpendicular to a plane defined by an interface of the hard magnetic film and the non-magnetic film.

18. A magnetoresistance effect device according to claim 17, wherein the substrate is an Si (100) single crystalline substrate, the multilayer structure is formed on the substrate via a underlayer mainly made of Cu.

19. A magnetoresistance effect device according to claim 1, wherein in the multilayer structure formed on the substrate, the hard magnetic film is mainly made of CoPt, the soft magnetic film mainly is made of NiFe or NiFeCo, and the non-magnetic metal film includes a first non-magnetic metal film mainly made of Cu having a thickness of 2 to 10 nm and a second non-magnetic metal film mainly made of Ag or Au having a thickness of 0.1 to 0.4 nm inserted in the first non-magnetic metal film.

20. A magnetoresistance effect device according to claim 19, wherein the multilayer structure is formed epitaxially on the substrate such that a [100] direction of each film composing the multilayer structure is in a direction vertical to a film plane of the each film, and a magnetic field direction to be detected is substantially a [011] direction of the non-magnetic metal film.

21. A magnetoresistance effect device according to claim 22, wherein the substrate is an Si (100) single crystalline substrate, the multilayer structure is formed on the substrate via a underlayer mainly made of Cu.

22. A magnetoresistance effect device according to claim 1, wherein the soft magnetic film is mainly made of NiFe or NiFeCo, the soft magnetic film made of at least two consecutive soft magnetic films each having a thickness in the range of 1 to 10 nm are stacked with a second non-magnetic metal film interposed therebetween,
wherein the hard magnetic film is mainly made of CoPt, the hard magnetic film and the consecutive soft magnetic films are stacked with the non-magnetic metal film interposed therebetween.

23. A magnetoresistance effect device according to claim 22, wherein the non-magnetic metal film is mainly made of Cu.

24. A magnetoresistance effect device according to claim 22, wherein the non-magnetic metal film between the consecutive soft magnetic films is composed of a single film mainly made of Cu, the non-magnetic metal film between the consecutive soft magnetic films and the hard magnetic film is composed of a film mainly made of Cu with an Ag or Au film inserted therein.

25. A magnetoresistance effect device according to claim 22, wherein the multilayer structure is formed epitaxially on the substrate such that a [100] direction of each film composing the multilayer structure is in a direction vertical to a film plane of the each film, and a magnetic field direction to be detected is substantially a [011] direction of the non-magnetic metal film.

26. A magnetoresistance effect device according to claim 27, wherein the non-magnetic metal film between the consecutive soft magnetic films and the non-magnetic metal film between the consecutive hard magnetic films is a single film mainly made of Cu, the non-magnetic metal film between the consecutive soft magnetic film and the hard magnetic film is composed of a film mainly made of Cu with an Ag or Au film inserted therein.

27. A magnetoresistance effect device according to claim 1, wherein the soft magnetic film is mainly made of NiFe or NiFeCo, the soft magnetic film made of at least two soft magnetic films each having a thickness in the range of 1 to 10 nm are consecutively stacked with a second non-magnetic metal film interposed therebetween, wherein the hard magnetic film is mainly made of CoPt, at least two hard magnetic films each having a thickness in the range of 1 to 10 nm are consecutively stacked with a third non-magnetic metal film interposed therebetween, wherein the consecutive soft magnetic films and the consecutive hard magnetic films are alternatively stacked with the non-magnetic metal film interposed therebetween, and a thickness of the non-magnetic metal film between the soft magnetic film and the hard magnetic film is larger than a thickness of the second non-magnetic metal film between the consecutive soft magnetic films or the third non-magnetic metal film between the consecutive hard magnetic films.

28. A magnetoresistance effect device according to claim 27, wherein the non-magnetic metal film is mainly made of Cu.

29. A magnetoresistance effect device according to claim 27, wherein the multilayer structure is formed epitaxially on the substrate such that a [100] direction of each film composing the multilayer structure is in a direction vertical to a film plane of the each film, and a magnetic field direction to be detected is substantially a [011] direction of the non-magnetic metal film.

30. A magnetoresistance effect device according to claim 1, wherein a square ratio of the hard magnetic film is 0.7 or more.

31. A magnetoresistance effect device according to claim 1, wherein a direction of a current flowing through the multilayer structure is substantially perpendicular to a film surface of the multilayer structure.

32. A magnetoresistance effect device according to claim 1, wherein a further magnetic film is inserted at, at least one of interfaces between the hard magnetic film and the non-magnetic metal film and between the soft magnetic film and the non-magnetic metal film, a thickness of the further magnetic film is in the range of 0.1 to 1 nm, and the further magnetic film includes Co as a main component.

33. A magnetoresistance effect device comprising:
a substrate: and
a multilayer structure formed on the substrate, the multilayer structure including a hard magnetic film comprising at least one of CoPt, CoTaCr and CoPtCr, a soft magnetic film, and a non-magnetic film for separating the hard magnetic film from the soft magnetic film; and
a yoke for guiding a signal magnetic field from a magnetic medium to the soft magnetic film,
wherein a direction of a magnetization easy axis of the hard magnetic film substantially agrees to a direction of the signal magnetic field guided by the yoke.

34. A magnetoresistance effect type head according to claim 33, wherein the magnetoresistance effect device comprises a plurality of the multilayer structures formed on the substrate.

35. A magnetoresistance effect device according to claim 33, wherein the magnetoresistance effect device further comprises a further magnetic film inserted between at least one of interfaces between the hard magnetic film and the non-magnetic metal film and between the soft magnetic film and the non-magnetic metal film, a thickness of the further magnetic film is in the range of 0.1 to 1 nm, and the further magnetic film includes at least one element selected from Co, Ni, and Fe as a main component.

36. A magnetoresistance effect type head according to claim 35, wherein the multilayer structure has a structure in which the hard magnetic film, the soft magnetic film, the non-magnetic metal film, and the inserted magnetic film are stacked a plurality of times.

37. A magnetoresistance effect type head according to claim 33, wherein the magnetoresistance effect device comprises a plurality of the multilayer structures formed on the substrate.

38. A magnetoresistance effect type head according to claim 33, wherein the soft magnetic film includes $Ni_XCo_Y Fe_Z$ as a main component, and in an atomic composition ratio, X is in the range of 0.6 to 0.9, Y is in the range of 0 to 0.4, and Z is in the range of 0 to 0.3.

39. A magnetoresistance effect type head according to claim 33, wherein the soft magnetic film includes $Ni_{X'}Co_{Y'}Fe_{Z'}$ as a main component, and in an atomic composition ratio, X' is in the range of 0 to 0.4, Y' is in the range of 0.2 to 0.95, and Z' is in the range of 0 to 0.5.

40. A magnetoresistance effect type head according to claim 33, wherein the soft magnetic film is an amorphous magnetic film comprising CoFeB.

41. A magnetoresistance effect type head according to claim 33, wherein the non-magnetic metal film is made of a material selected from Cu, Ag, and Au.

42. A magnetoresistance effect type head according to claim 41, wherein the soft magnetic film includes $Ni_xFe_{1-x}$ or $(Ni_xCo_{1-x})_{x'}Fe_{1-x'}$ as a main component, and in an atomic composition ratio, X is in the range of 0.6 to 1.0, and X' is in the range of 0.7 to 1.0.

43. A magnetoresistance effect type head according to claim 42, wherein the non-magnetic metal film is made of a material selected from Cu, Ag, and Au.

44. A magnetoresistance effect type head according to claim 33, wherein the non-magnetic metal film is made of Cu.

45. A magnetoresistance effect type head according to claim 33, wherein the non-magnetic metal film has a thickness in the range of 1 nm to 10 nm.

46. A magnetoresistance effect type head according to claim 33, wherein the hard magnetic film includes Co and M as main components, M representing Pt or two or more kinds of elements selected from a group consisting of Pt, Cr, and Ta.

47. A magnetoresistance effect type head according to claim 33, wherein the hard magnetic film is made of a material comprising CoPt.

48. A magnetoresistance effect type head according to claim 33, wherein the soft magnetic film includes $Ni_xFe_{1-x}$ or $(Ni_xCo_{1-x})_{x'}Fe_{1-x'}$ as a main component, and in an atomic composition ratio, X is in the range of 0.6 to 1.0 and X' is in the range of 0.7 to 1.0.

49. A magnetoresistance effect type head according to claim 48, wherein the non-magnetic metal film is made of a material selected from Cu, Ag, and Au.

50. A magnetoresistance effect type head according to claim 33, wherein a square ratio of the hard magnetic film is 0.7 or more.

51. A magnetoresistance effect type head according to claim 33, wherein a direction of a current flowing through the multilayer structure is substantially perpendicular to a film surface of the multilayer structure.

52. A magnetoresistance effect device according to claim 33, wherein, in the multilayer structure formed on the substrate, the hard magnetic film is mainly made of CoPt, the soft magnetic film mainly made of NiFe or NiFeCo, and the non-magnetic metal film is mainly made of Cu and has a thickness of 2 to 10 nm, the multilayer structure is formed epitaxially on the substrate such that a [100] direction of each film composing the multilayer structure is in a direction perpendicular to a plane defined by an interface of the hard magnetic film and the non-magnetic film.

53. A magnetoresistance effect device comprising:

a substrate: and a multilayer structure formed on the substrate, the multilayer structure including a hard magnetic film, a soft magnetic film comprising CoFeB, and a non-magnetic film for separating the hard magnetic film from the soft magnetic film, wherein a direction of a magnetization easy axis of the hard magnetic film substantially agrees to a direction of a magnetic field to be detected.

54. A magnetoresistance effect device comprising:

a substrate: and a multilayer structure formed on the substrate, the multilayer structure including a hard magnetic film, a soft magnetic film comprising CoFeB, and a non-magnetic film for separating the hard magnetic film from the soft magnetic film; and a yoke for guiding a signal magnetic field from a magnetic medium to the soft magnetic film, wherein a direction of a magnetization easy axis of the hard magnetic film substantially agrees to a direction of the signal magnetic field guided by the yoke.

55. A magnetoresistance effect device comprising:

a substrate: and a multilayer structure formed on the substrate, the multilayer structure including a hard magnetic film comprising $Co_Y Fe_{1-Y}$ (0.3<Y<0.7), a soft magnetic film, and a non-magnetic film for separating the hard magnetic film from the soft magnetic film, wherein a direction of a magnetization easy axis of the hard magnetic film substantially agrees to a direction of a magnetic field to be detected.

56. A magnetoresistance effect device according to claim 55, wherein the soft magnetic film includes $Ni_X Fe_{1-X}$ or $(Ni_X Co_{1-X})_{X'} Fe_{1-X'}$ as a main component, the hard magnetic film includes $Co_Y Fe_{1-Y}$ as a main component, and in an atomic composition ratio, X is in the range of 0.6 to 1.0, X' is in the range of 0.7 to 1.0, and Y is in the range of 0.3 to 0.7.

57. A magnetoresistance effect device according to claim 56, wherein the non-magnetic metal film is made of a material selected from Cu, Ag, and Au.

58. A magnetoresistance effect device comprising:

a substrate: and a multilayer structure formed on the substrate, the multilayer structure including a hard magnetic film comprising $Co_Y Fe_{1-Y}$ (0.3<Y<0.7), a soft magnetic film, and a non-magnetic film for separating the hard magnetic film from the soft magnetic film; and a yoke for guiding a signal magnetic field from a magnetic medium to the soft magnetic film, wherein a direction of a magnetization easy axis of the hard magnetic film substantially agrees to a direction of the signal magnetic field guided by the yoke.

59. A magnetoresistance effect device comprising:

a substrate: and a multilayer structure formed on the substrate, the multilayer structure including a hard magnetic film comprising at least one of CoPt, CoFe, CoTaCr and CoPtCr, a soft magnetic film, and a non-magnetic film for separating the hard magnetic film from the soft magnetic film, wherein a direction of a magnetization easy axis of the hard magnetic film substantially agrees to a direction of a magnetic field to be detected, with the proviso that the magnetoresistance effect device does not comprise an antiferromagnetic layer.

60. A magnetoresistance effect device comprising:

a substrate: and a multilayer structure formed on the substrate, the multilayer structure including a hard magnetic film comprising at least one of CoPt, CoFe, CoTaCr and CoPtCr, a soft magnetic film, and a non-magnetic film for separating the hard magnetic film from the soft magnetic film; and a yoke for guiding a signal magnetic field from a magnetic medium to the soft magnetic film, wherein a direction of a magnetization easy axis of the hard magnetic film substantially agrees to a direction of the signal magnetic field guided by the yoke, with the proviso that the magnetoresistance effect device does not comprise an antiferromagnetic layer.

* * * * *